US010193094B2

(12) United States Patent
Stoessel et al.

(10) Patent No.: US 10,193,094 B2
(45) Date of Patent: Jan. 29, 2019

(54) ORGANIC LIGHT-EMITTING DEVICE HAVING DELAYED FLUORESCENCE

(71) Applicant: Merck Patent GmbH, Darmstadt (DE)

(72) Inventors: Philipp Stoessel, Frankfurt am Main (DE); Amir Hossain Parham, Frankfurt am Main (DE); Christof Pflumm, Darmstadt (DE); Anja Jatsch, Frankfurt am Main (DE); Joachim Kaiser, Darmstadt (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 14/782,387

(22) PCT Filed: Mar. 12, 2014

(86) PCT No.: PCT/EP2014/000657
§ 371 (c)(1),
(2) Date: Oct. 5, 2015

(87) PCT Pub. No.: WO2014/166572
PCT Pub. Date: Oct. 16, 2014

(65) Prior Publication Data
US 2016/0035992 A1    Feb. 4, 2016

(30) Foreign Application Priority Data

Apr. 8, 2013    (EP) ..................... 13001799

(51) Int. Cl.
| H01L 51/50 | (2006.01) |
| H01L 51/52 | (2006.01) |
| H01L 51/56 | (2006.01) |
| H01L 51/00 | (2006.01) |

(52) U.S. Cl.
CPC ...... *H01L 51/5004* (2013.01); *H01L 51/5012* (2013.01); *H01L 51/5056* (2013.01); *H01L 51/5206* (2013.01); *H01L 51/56* (2013.01); *H01L 51/006* (2013.01); *H01L 51/0056* (2013.01); *H01L 51/0067* (2013.01); *H01L 51/0071* (2013.01); *H01L 51/0072* (2013.01); *H01L 2251/552* (2013.01); *H01L 2251/558* (2013.01)

(58) Field of Classification Search
CPC . H01L 51/5004; H01L 51/56; H01L 51/5206; H01L 51/5056; H01L 51/5012; H01L 51/006; H01L 51/0071; H01L 51/0072; H01L 51/0056; H01L 51/0067; H01L 2251/552; H01L 2251/558
See application file for complete search history.

(56) References Cited

U.S. PATENT DOCUMENTS

| 9,040,172 | B2 | 5/2015 | Parham et al. |
| 9,066,410 | B2 | 6/2015 | Breuning |
| 9,126,970 | B2 | 9/2015 | Pflumm et al. |
| 2006/0279203 | A1* | 12/2006 | Forrest ................ H01L 51/0072 313/504 |
| 2010/0090238 | A1 | 4/2010 | Mori et al. |
| 2010/0090593 | A1 | 4/2010 | Mori et al. |
| 2011/0304262 | A1 | 12/2011 | Kwong |
| 2012/0248968 | A1 | 10/2012 | Ogiwara et al. |
| 2013/0032766 | A1 | 2/2013 | Molt et al. |
| 2013/0187147 | A1 | 7/2013 | King et al. |
| 2014/0077172 | A1* | 3/2014 | So ...................... H01L 51/0091 257/40 |
| 2014/0084279 | A1* | 3/2014 | Tanaka ................ H01L 51/0035 257/40 |
| 2014/0158992 | A1* | 6/2014 | Xia ..................... H01L 51/0072 257/40 |

FOREIGN PATENT DOCUMENTS

| CN | 102933682 A | 2/2013 |
| CN | 102959757 A | 3/2013 |
| DE | 102009009277 A1 | 8/2010 |
| DE | 102009023155 A1 | 12/2010 |
| DE | 102009031021 A1 | 1/2011 |
| EP | 1956022 A1 | 8/2008 |
| EP | 2080762 A1 | 7/2009 |
| WO | WO-2011073149 A1 | 6/2011 |

OTHER PUBLICATIONS

International Search Report for PCT/EP2014/000657 dated May 13, 2014.
Masui, K., et al., "Analysis of exciton annihilation in high-efficiency sky-blue organic light-emitting diodes with thermally activated delayed fluorescence", Organic Electronics, vol. 14, No. 11, (2013), pp. 2721-2726.
Méhes, G., et al., "Enhanced Electroluminescence Efficiency in a Spiro-Acridine Derivative through Thermally Activated Delayed Fluorescence", Angewandte Chemie International Edition, vol. 51, No. 45, (2012), pp. 11311-11315 and, Méhes, G., et al., "Supporting Information: Enhanced Electroluminescence Efficiency in a Spiro-Acridine Derivative through Thermally Activated Delayed Fluorescence", Angewandte Chemie International Edition, vol. 51, No. 45, (2012), Internet Supplement: http://dx.doi.org/10.1002/anie.201206289.
Tanaka, H., et al., "Efficient green thermally activated delayed fluorescence (TADF) from a phenoxazine-triphenyltriazine (PXZ-TRZ) derivative", Chemical Communications, vol. 48, No. 93, (2012), pp. 11392-11394 and, Tanaka, H., et al., "Electronic Supplementary Information: Efficient green thermally activated delayed fluorescence (TADF) from a phenoxazine-triphenyltriazine (PXZ-TRZ) derivative", Chemical Communications, vol. 48, No. 93, (2012), Internet Supplement: http://www.rsc.org/suppdata/cc/c2/c2cc36237f/c2cc36237f.pdf.

(Continued)

Primary Examiner — Jay C Chang
Assistant Examiner — Mikka Liu
(74) Attorney, Agent, or Firm — Drinker Biddle & Reath LLP

(57) ABSTRACT

The present application relates to an organic electroluminescent device (OLED) which has an emitting layer comprising a compound having a small difference between the energies of the $S_1$ and $T_1$ states, and in which certain conditions apply to the HOMO and LUMO energy levels of the emitting layer and the layers between the anode and the emitting layer.

16 Claims, No Drawings

(56) References Cited

OTHER PUBLICATIONS

U.S. Appl. No. 14/782,621, filed Oct. 6, 2015, Stoessel et al.
U.S. Appl. No. 14/782,722, filed Oct. 6, 2015, Stoessel et al.
U.S. Appl. No. 14/782,974, filed Oct. 7, 2015, Stoessel et al.
Meng, H., et al., "Organic Small Module Materials for Organic Light-Emitting Diodes", Organic Light-Emitting Materials and Devices, CRC Press, Chapter 3, (2006), pp. 296-414.
Uoyama, H., et al., "Highly efficient organic light-emitting diodes from delayed fluorescence", Nature, vol. 492, No. 7428, (2012), pp. 234-238.
Uoyama, H., et al., "Full Methods Supplement: Highly efficient organic light-emitting diodes from delayed fluorescence", Nature, vol. 492, No. 7428, (2012), Online Supplement.
Méhes, G., et al., "Supporting Information: Enhanced Electroluminescence Efficiency in a Spiro-Acridine Derivative through Thermally Activated Delayed Fluorescence", Angewandte Chemie International Edition, vol. 51, No. 45, (2012), Internet Supplement: http://dx.doi.org/10.1002/anie.201206289.
Tanaka, H., et al., "Electronic Supplementary Information: Efficient green thermally activated delayed fluorescence (TADF) from a phenoxazin-triphenyltriazine (PXZ-TRZ) derivative", Chemical Communications, vol. 48, No. 93, (2012), Internet Supplement: http://www.rsc.org/suppdata/cc/c2/c2cc36237f/c2cc36237f.

\* cited by examiner

ORGANIC LIGHT-EMITTING DEVICE HAVING DELAYED FLUORESCENCE

CROSS-REFERENCE TO RELATED APPLICATIONS

This application is a national stage application (under 35 U.S.C. § 371) of PCT/EP2014/000657, filed Mar. 12, 2014, which claims benefit of European Application No. 13001799.9, filed Apr. 8, 2013, both of which are incorporated herein by reference in their entirety.

The present application relates to an organic electroluminescent device (OLED) which has an emitting layer comprising a compound having a small difference between the energies of the $S_1$ and $T_1$ states, and in which certain conditions apply to the HOMO and LUMO energy levels of the emitting layer and the layers between the anode and the emitting layer.

In general, the term OLED is taken to mean an electronic device which comprises at least one organic material and which emits light on application of an electrical voltage. The basic structure and production of OLEDs are generally known to the person skilled in the art and are described, inter alia, in U.S. Pat. No. 4,539,507, U.S. Pat. No. 5,151,629, EP 0676461 and WO 98/27136.

The energies of the $S_1$ and $T_1$ states of a compound and the HOMO and LUMO energy levels of a compound are defined as the energies which are obtained for the compound in question by quantum-chemical calculations. The $S_1$ state here is the energetically lowest excited singlet state, and the $T_1$ state is the energetically lowest triplet state. The precise way in which the quantum-chemical calculations are carried out is described in detail in the working examples.

The HOMO energy level of a layer is, if the layer consists of a single compound, taken to mean the HOMO energy level of this compound. The HOMO energy level of a layer is, if the layer consists of two or more different compounds, taken to mean the HOMO energy level of that of the two or more different compounds which has the highest HOMO energy level. Compounds which are present in very small proportion are not taken into account here. Preferably, only compounds which are present in a proportion of at least 1% by vol., particularly preferably at least 2% by vol., very particularly preferably at least 3% by vol., are taken into account.

The LUMO energy level of a layer is, if the layer consists of a single compound, taken to mean the LUMO energy level of this compound. The LUMO energy level of a layer is, if the layer consists of two or more different compounds, taken to mean the LUMO energy level of that of the two or more different compounds which has the lowest LUMO energy level. Compounds which are present in very small proportion are not taken into account here. Preferably, only compounds which are present in a proportion of at least 1% by vol., particularly preferably at least 2% by vol., very particularly preferably at least 3% by vol., are taken into account.

Values for HOMO and LUMO energy levels are by definition negative values. Correspondingly, a "high energy level" for the purposes of the present application is taken to mean a negative value which has a low modulus in relative terms, and a "low energy level" is taken to mean a negative value which has a large modulus in relative terms.

In the development of novel OLEDs, there is great interest in an improvement in the efficiency and operating voltage of the devices. Furthermore, there is interest in an improvement in the lifetime of the devices, and in the general improvement of the performance data on operation of the OLED at elevated temperature. There is again furthermore interest in the provision of OLEDs which can be produced simply and inexpensively and which can be constructed, in particular, from inexpensive materials which are simple to prepare.

It is known in the prior art that OLEDs having very good efficiencies can be obtained using certain purely organic compounds which do not phosphoresce, but instead fluoresce. For example, H. Uoyama et al., Nature 2012, 492, 234, disclose that the use of carbazolylcyanobenzene compounds as emitting compounds enables OLEDs to be obtained which have external quantum efficiencies which are similarly good or better than those obtained with phosphorescent emitters. The carbazolylcyanobenzene compounds used exhibit thermally activated delayed fluorescence (TADF), based on a small energy difference between the $S_1$ and $T_1$ states.

In the said publication, 4,4-bis-[N-(1-naphthyl)-N-phenylamino]biphenyl (NPD) is used in the layer adjacent to the emitting layer on the anode side, and 4,4'-(biscarbazol-9-yl)biphenyl (CBP) is used as matrix material of the emitting layer. In a structure of this type, there is a difference between the HOMO energy level of the emitting layer and of the adjacent layer on the anode side of 0.45 eV. Furthermore, OLEDs having two successive hole-transport layers consisting of NPD and 1,3-bis(9-carbazolyl)benzene (mCP) and TAPC and subsequently an emitting layer comprising 2,8-bis(diphenylphosphoryl)-dibenzo[b,d]thiophene (PPT) as matrix material are disclosed in the said publication. In this case, the difference in the HOMO energy levels between the first and second hole-transport layers is 0.58 eV and between the second hole-transport layer and the emission layer is 0.55 eV.

Mehes et al., Angew. Chem. Int. Ed. 2012, 51, 11311, use two successive hole-transport layers, consisting of 1,3-bis(9-carbazolyl)benzene (mCP) and TAPC respectively, and subsequently an emitting layer comprising triphenyl-[4-(9-phenyl-9H-fluoren-9-yl)phenyl]silane (TPSi—F) as matrix material. In this case, the difference in the HOMO energy levels between the first and second hole-transport layers is 0.73 eV and between the second hole-transport layer and the emission layer is 0.33 eV.

Further OLEDs comprising emitters which exhibit thermally activated delayed fluorescence are described, for example, in Endo et al., Appl. Phys. Lett. 2011, 98, 083302, Nakagawa et al., Chem. Commun. 2012, 48, 9580 and Lee et al., Appl. Phys. Lett. 2012, 101, 093306/1. All publications have in common that at least one of the HOMO differences selected from the HOMO differences between successive hole-transport layers and the HOMO difference between the hole-transport layer adjacent to the emission layer on the anode side and the emission layer is significantly greater than 0.4 eV.

The further development of OLEDs for commercialisation in displays and lighting applications requires constant improvement of the performance data of the devices, in particular the operating voltage and the efficiency.

In corresponding investigations, it has now been found, surprisingly, that improved values for the efficiency and the operating voltage are obtained with OLEDs which have an emitting layer comprising a compound having a small difference between the energies of the $S_1$ and $T_1$ states, and in which certain conditions apply to the relative position of the HOMO and LUMO energy levels of the emitting layer and the layers between the anode and the emitting layer. Furthermore, improvements in the lifetime are preferably achieved.

An advantage is preferably obtained here over devices in accordance with the prior art in at least one of the said points, particularly preferably in a plurality of the said points.

The invention thus relates to an organic electroluminescent device comprising
- anode,
- cathode,
- at least one emitting layer which comprises a luminescent organic compound E which has a difference between the energies of its $S_1$ and $T_1$ states of not greater than 0.15 eV, and
- at least one layer having a thickness of greater than 2 nm which is arranged between the emitting layer EML closest to the anode and the anode, where the following condition applies to each layer having a thickness of greater than 2 nm which is arranged between the anode and the layer EML: the difference D between the HOMO energy level of the layer and the HOMO energy level of the closest layer on the cathode side having a thickness of greater than 2 nm must be less than or equal to 0.4 eV,
with the proviso that, for layers whose HOMO energy level has a value of less than −6.7 eV, the LUMO energy level for the said condition occurs instead of the HOMO energy level.

An organic compound in the sense of the present invention is taken to mean a carbon-containing compound which contains no metals. An organic compound in accordance with the present invention is preferably built up from the elements C, H, D, B, Si, N, P, O, S, F, Cl, Br and I.

A luminescent compound in the sense of the present invention is taken to mean a compound which is capable of emitting light at room temperature on optical excitation in an environment as is present in the organic electroluminescent device.

Emitting layer closest to the anode is taken to mean the closest emitting layer as viewed from the anode.

The following applies to the difference D between the HOMO energy level of a layer and the HOMO energy level of the closest layer on the cathode side, if the layer is denoted by L(i) and the closest layer on the cathode side is denoted by L(i+1), and the HOMO energy level of layer L(i) is denoted by HOMO(L(i)), and the HOMO energy level of layer L(i+1) is denoted by HOMO(L(i+1)):

$$D = HOMO(L(i)) - HOMO(L(i+1)) \quad \text{Equation (1)}$$

The difference D may also become negative in accordance with the invention.

The calculation of D is carried out correspondingly if the LUMO energy level for layers whose HOMO energy level has a value of less than −6.7 eV occurs instead of the HOMO energy level. This may be the case for the two adjacent layers, or it may be the case for one of the two adjacent layers.

The following cases may then occur:

$$D = LUMO(L(i)) - HOMO(L(i+1)) \quad \text{Equation (2),}$$

if L(i) has an HOMO energy level having a value of less than −6.7 eV, but L(i+1) does not;

$$D = HOMO(L(i)) - LUMO(L(i+1)) \quad \text{Equation (3),}$$

if L(i+1) has an HOMO energy level having a value of less than −6.7 eV, but L(i) does not;

$$D = LUMO(L(i)) - LUMO(L(i+1)) \quad \text{Equation (4),}$$

if L(i) and L(i+1) have an HOMO energy level having a value of less than −6.7 eV.

The proviso that the LUMO energy level occurs instead of the HOMO energy level for certain layers preferably applies to layers having an HOMO energy level of less than −6.9 eV, particularly preferably to layers having an HOMO energy level of less than −7.2 eV.

According to a variant of the invention, the proviso explained above that the LUMO energy level occurs instead of the HOMO energy level for certain layers does not apply, and the HOMO energy level should basically be used.

Furthermore, for each layer having a thickness of greater than 2 nm which is arranged between the anode and the layer EML, the difference D between the HOMO energy level of the layer and the HOMO energy level of the closest layer on the cathode side having a thickness of greater than 2 nm is preferably less than or equal to 0.38 eV, particularly preferably less than or equal to 0.35 eV, and very particularly preferably less than or equal to 0.3 eV.

In accordance with the invention, the condition for the difference in the HOMO or LUMO energy levels of adjacent layers between the anode and the layer EML applies to layers having a thickness of at least 2 nm. It preferably applies to layers having a thickness of greater than 1.5 nm, particularly preferably to layers having a thickness of greater than 1 nm, very particularly preferably to layers having a thickness of greater than 0.5 nm, and most preferably to all layers.

In addition to the anode, the cathode, the emitting layer and at least one layer arranged between the anode and the emitting layer, the device according to the invention preferably also comprises additional layers. These layers are preferably selected from further layers arranged between the anode and the emitting layer and further layers arranged between the emitting layer and the cathode.

The device according to the invention preferably comprises precisely one emitting layer.

The layers of the device according to the invention are preferably arranged in the interspace formed by the anode and the cathode.

The anode and the cathode here are not regarded as layers of the organic electroluminescent device in the sense of the present application.

Further layers which may be present in the device according to the invention are preferably selected from hole-injection layers, hole-transport layers, hole-blocking layers, electron-transport layers, electron-injection layers, electron-blocking layers, exciton-blocking layers, interlayers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. The function and preferred arrangement of these layers are known to the person skilled in the art. Furthermore, possible compounds for use in the respective layers are known to the person skilled in the art.

For the purposes of the present application, hole-transport layer is taken to mean a layer which has, inter alia, hole-conducting properties and is arranged between the anode and the layer EML.

The hole-injection layer is a special embodiment of a hole-transport layer which, in the case of the presence of more than one layer present between the anode and the layer EML, is the closest of these layers to the anode.

The electron-blocking layer is a special embodiment of a hole-transport layer which, in the case of the presence of more than one layer present between the anode and the layer EML, is the layer which is directly adjacent to the layer EML on the anode side and which has electron-blocking properties.

Electron-transport layer is taken to mean a layer which has, inter alia, electron-conducting properties, and which is arranged between the emitting layer closest to the cathode and the cathode.

The electron-injection layer is a special embodiment of an electron-transport layer which, in the case of the presence of more than one layer present between the cathode and the emitting layer closest to the cathode, is the closest of these layers to the cathode.

The hole-blocking layer is a special embodiment of an electron-transport layer which, in the case of the presence of more than one layer present between the cathode and the emitting layer closest to the cathode, is the layer which is directly adjacent to the emitting layer closest to the cathode on the cathode side and which has hole-blocking properties.

The layers of the device according to the invention preferably comprise one or more organic compounds. They are particularly preferably built up essentially from organic compounds, i.e. are organic layers.

All materials as are usually employed in accordance with the prior art in the relevant layers can be used in the layers.

The layers of the device according to the invention preferably have a thickness of 1 to 200 nm, preferably 3 to 150 nm, particularly preferably 4 to 120 nm. As mentioned above, the anode and the cathode are not regarded as layers of the device here.

It is preferred for the device according to the invention to have no layers having a thickness of less than 3 nm, particularly preferably no layers having a thickness of less than 2 nm, and very particularly preferably no layers having a thickness of less than 1 nm. It is furthermore preferred, if one or more layers having a thickness of less than 3 nm, preferably less than 2 nm, particularly preferably less than 1 nm, are present in the device according to the invention, for these not to follow one another directly, but instead to be separated by at least one layer having a greater thickness.

The sequence of the layers of the device according to the invention is preferably as follows:
—anode—
—hole-transport layer—
—optionally further hole-transport layers—
—emitting layer—
—electron-transport layer—
—optionally further electron-transport layers—
—optionally electron-injection layer—
—cathode—.

Further layers may additionally be present in the device according to the invention.

The emitting layer which comprises the luminescent organic compound E is preferably the emitting layer EML closest to the anode.

Furthermore, the luminescent compound E preferably has a luminescence quantum efficiency of at least 40%, particularly preferably at least 50%, very particularly preferably at least 60% and especially preferably at least 70%. The luminescence quantum efficiency is determined here in a layer in a mixture with the matrix material, analogously to how the layer is to be employed in the organic electroluminescent device. The way in which the determination of the luminescence quantum yield is carried out for the purposes of the present invention is described in detail in the working examples.

It is furthermore preferred for compound E to have a luminescence decay time of less than 50 μs, particularly preferably to have a decay time of less than 20 μs, very particularly preferably to have a decay time of less than 10 μs and most preferably to have a decay time of less than 8 μs. The way in which the decay time is determined in accordance with the present application is described in the working examples.

In accordance with the invention, compound E has a difference between the energies of its $S_1$ and $T_1$ states of not greater than 0.15 eV. The difference is preferably not greater than 0.10 eV, particularly preferably not greater than 0.08 eV, and very particularly preferably not greater than 0.05 eV.

Compound E is preferably an aromatic compound which has both donor and also acceptor substituents. It is preferred here for the LUMO and the HOMO of the compound to only overlap spatially to a slight extent.

What is meant by donor or acceptor substituents is known in principle to the person skilled in the art. Suitable donor substituents are, in particular, diaryl- and diheteroarylamino groups and carbazole groups or carbazole derivatives, each of which are preferably bonded to the aromatic compound via N. These groups may also be substituted further. Suitable acceptor substituents are, in particular, cyano groups, but also, for example, electron-deficient heteroaryl groups, which may also be substituted further.

Examples of compounds E are shown in the following table.

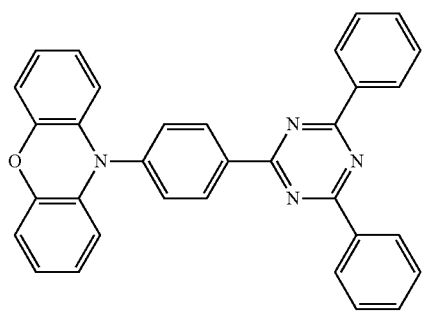 [SMILES: c1ccc(-c2nc(-c3ccccc3)nc(-c3ccc(N4c5ccccc5Oc5ccccc54)cc3)n2)cc1]

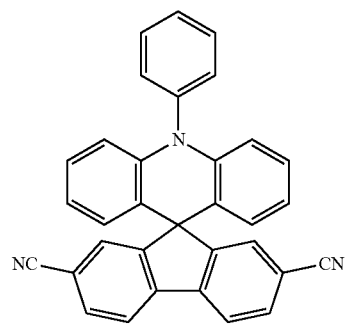 [SMILES: N#Cc1ccc2c(c1)C1(c3cc(C#N)ccc3-2)c2ccccc2N(c2ccccc2)c2ccccc21]

-continued
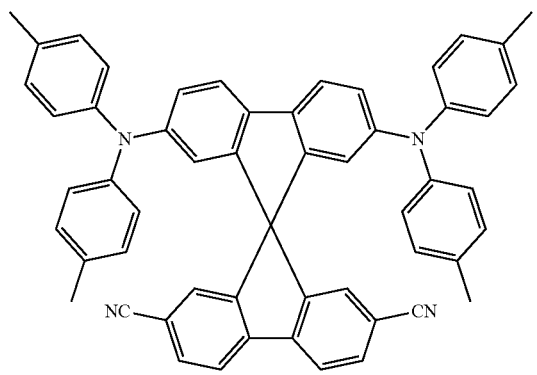
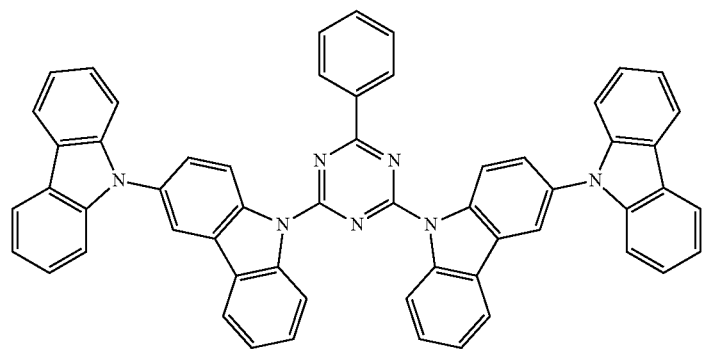 [SMILES: c1ccc(-c2nc(-n3c4ccccc4c4cc(-n5c6ccccc6c6ccccc65)ccc43)nc(-n3c4ccccc4c4cc(-n5c6ccccc6c6ccccc65)ccc43)n2)cc1]
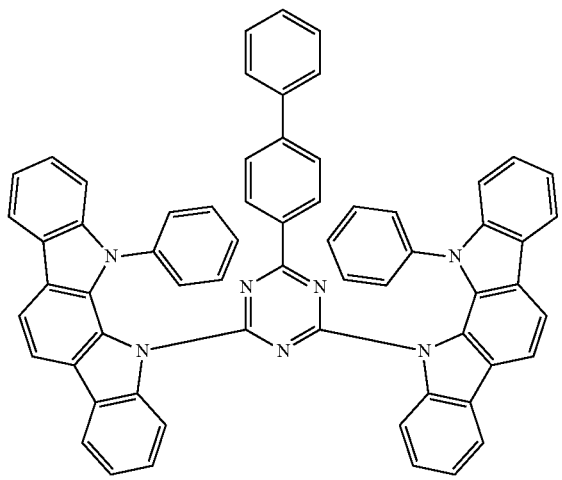 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]
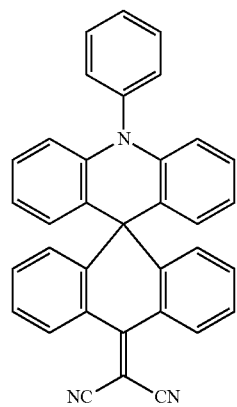 [SMILES: N#CC(C#N)=C1c2ccccc2C2(c3ccccc31)c1ccccc1N(c1ccccc1)c1ccccc12]

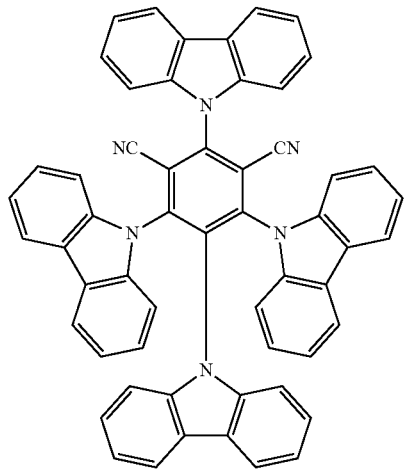 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]
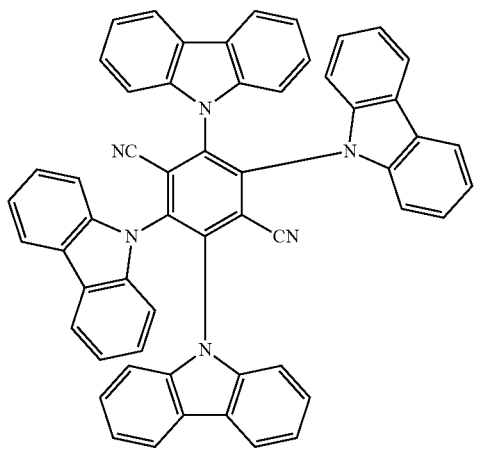 [SMILES: N#Cc1c(-n2c3ccccc3c3ccccc32)c(-n2c3ccccc3c3ccccc32)c(C#N)c(-n2c3ccccc3c3ccccc32)c1-n1c2ccccc2c2ccccc21]
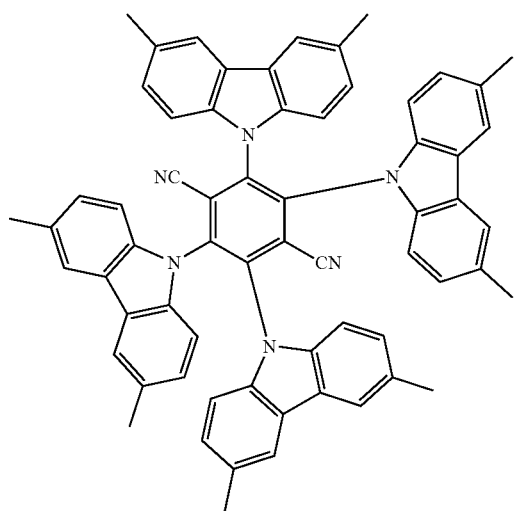

-continued
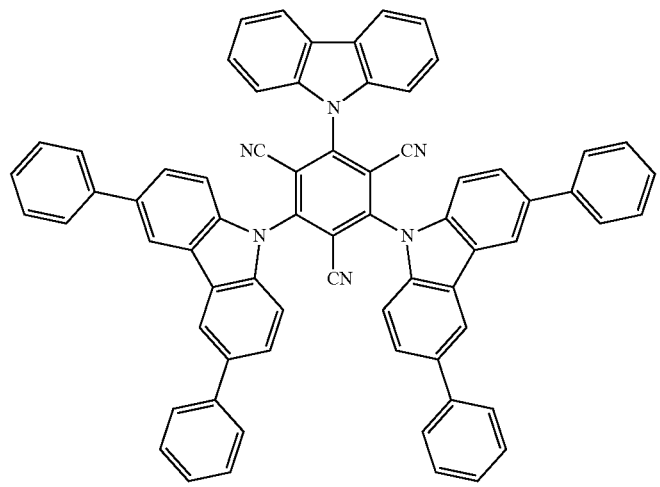 [SMILES: N#Cc1c(-n2c3ccccc3c3ccccc32)c(C#N)c(-n2c3ccc(-c4ccccc4)cc3c3cc(-c4ccccc4)ccc32)c(C#N)c1-n1c2ccc(-c3ccccc3)cc2c2cc(-c3ccccc3)ccc21]
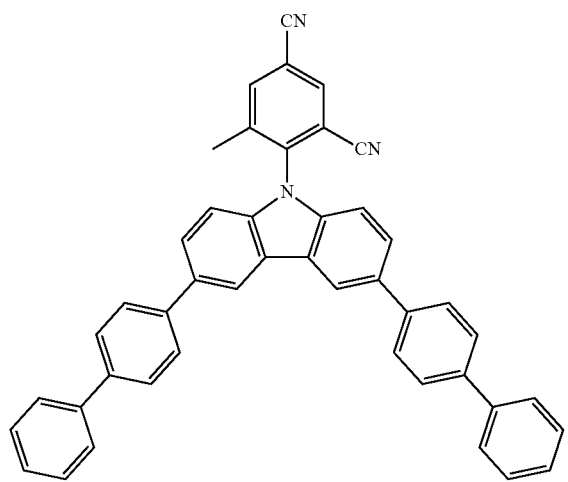 [SMILES: Cc1cc(C#N)cc(C#N)c1-n1c2ccc(-c3ccc(-c4ccccc4)cc3)cc2c2cc(-c3ccc(-c4ccccc4)cc3)ccc21]
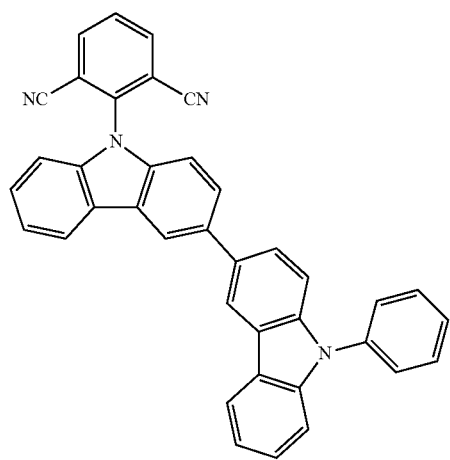 [SMILES: N#Cc1cccc(C#N)c1-n1c2ccccc2c2cc(-c3ccc4c(c3)c3ccccc3n4-c3ccccc3)ccc21]

-continued
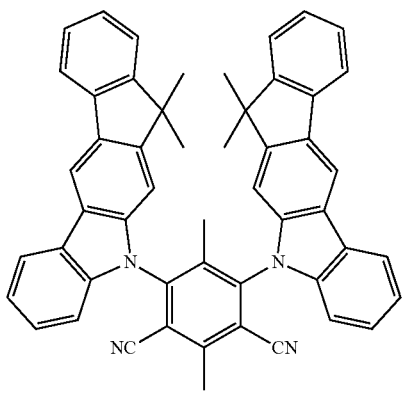 [SMILES: Cc1c(C#N)c(-n2c3ccccc3c3cc4c(cc32)C(C)(C)c2ccccc2-4)c(C)c(-n2c3ccccc3c3cc4c(cc32)C(C)(C)c2ccccc2-4)c1C#N]
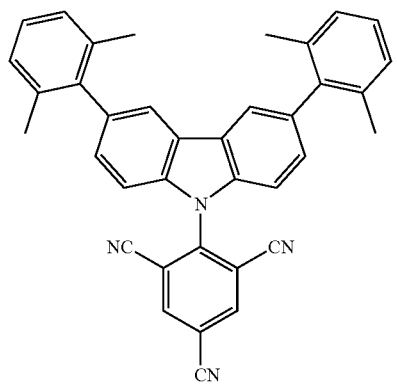 [SMILES: Cc1cccc(C)c1-c1ccc2c(c1)c1cc(-c3c(C)cccc3C)ccc1n2-c1c(C#N)cc(C#N)cc1C#N]
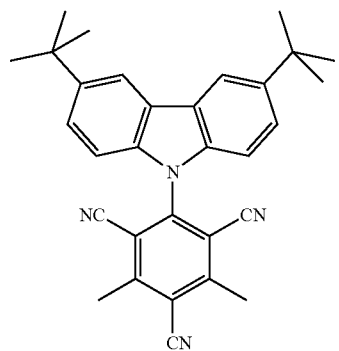 [SMILES: Cc1c(C#N)c(C)c(C#N)c(-n2c3ccc(C(C)(C)C)cc3c3cc(C(C)(C)C)ccc32)c1C#N]
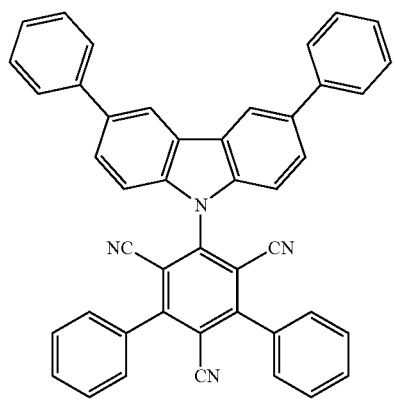 [SMILES: N#Cc1c(-c2ccccc2)c(C#N)c(-n2c3ccc(-c4ccccc4)cc3c3cc(-c4ccccc4)ccc32)c(C#N)c1-c1ccccc1]

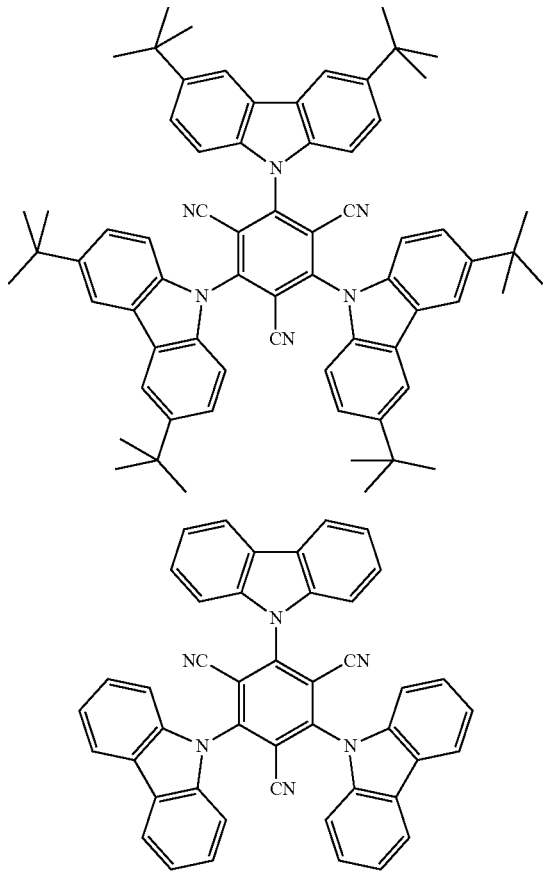

The emitting layer which comprises compound E preferably additionally comprises one or more matrix materials, and compound E is the emitting compound.

A matrix material in a system comprising two or more materials is taken to mean the component whose proportion in the mixture is the greater. Correspondingly, a dopant in a system comprising two or more materials is taken to mean the component whose proportion in the mixture is the smaller. The emitting compounds in emitting layers are typically in the form of dopants, and the non-emitting compounds are in the form of matrix materials.

Compound E is preferably present in the emitting layer in a proportion of 1 to 6% by vol., particularly preferably 3 to 6% by vol. In this case, it is preferred for only one or more matrix compounds to be present in the emitting layer as further compounds apart from compound E, so that these make up the remaining proportion.

It is preferred for the following to apply to LUMO(E), i.e. the LUMO energy level of compound E, and HOMO (matrix), i.e. the HOMO energy level of the matrix material:

LUMO($E$)−HOMO(matrix)>$S_1$($E$)−0.4 eV;

particularly preferably:

LUMO($E$)−HOMO(matrix)>$S_1$($E$)−0.3 eV;

and very particularly preferably:

LUMO($E$)−HOMO(matrix)>$S_1$($E$)−0.2 eV.

$S_1$(E) here is the energy of the first excited singlet state of compound E.

It is furthermore preferred for the energy of the $T_1$ state of the matrix material of the emitting layer, denoted by $T_1$(matrix) below, to be at most 0.1 eV lower than the energy of the $T_1$ state of compound E, denoted by $T_1$(E) below. $T_1$(matrix) is particularly preferably ≥$T_1$(E). The following very particularly preferably applies: $T_1$(matrix)−$T_1$(E)≥0.1 eV, most preferably $T_1$(matrix)−$T_1$(E)≥0.2 eV.

Examples of suitable matrix materials in the emitting layer are ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-bis-carbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diazasilole derivatives, for example in accordance with WO 2010/054729, diazaphosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, or bridged carbazole derivatives, for example in accordance with US 2009/0136779, WO 2010/050778, WO 2011/042107 or WO 2011/088877.

Preferred for use as matrix materials in the emitting layer are electron-transporting organic compounds. Particular preference is given to electron-transporting organic compounds which have an LUMO energy level of at most −2.50 eV, particularly preferably at most −2.60 eV, very particularly preferably at most −2.65 eV, and most preferably at most −2.70 eV.

Particularly preferred matrix materials in the emitting layer are selected from the substance classes of the triazines, the pyrimidines, the lactams, the metal complexes, in particular the Be, Zn and Al complexes, the aromatic ketones, the aromatic phosphine oxides, the azaphospholes, the azaboroles, which are substituted by at least one electron-conducting substituent, the quinoxalines, the quinolines and the isoquinolines.

The device according to the invention comprises at least one layer having a thickness of greater than 2 nm arranged between the emitting layer EML closest to the anode and the anode. It preferably comprises precisely 2, 3, 4 or 5 layers having a thickness of greater than 2 nm arranged between the emitting layer EML closest to the anode and the anode, particularly preferably precisely 2, 3 or 4 such layers.

It is preferred for the energy of the $T_1$ state of the layer directly adjacent to the emitting layer comprising compound E on the anode side, denoted by $T_1(EBL)$ below, to be at most 0.1 eV lower than the energy of the $T_1$ state of compound E, denoted by $T_1(E)$ below. Particularly preferably, $T_1(EBL) \geq T_1(E)$. The following very particularly preferably applies: $T_1(EBL)-T_1(E) \geq 0.1$ eV, most preferably $T_1(EBL)-T_1(E) \geq 0.2$ eV.

The LUMO energy level of the layer which is adjacent to the layer EML on the anode side is preferably at least 0.2 eV greater than the LUMO energy level of the layer EML, and preferably at least 0.3 eV greater.

It is preferred for at least one of the layers arranged between the layer EML and the anode to comprise at least one triarylamino compound. A plurality of the layers arranged between the layer EML and the anode preferably comprise at least one triarylamino compound. A triarylamino compound in accordance with the present application is taken to mean a compound in which three aryl or heteroaryl groups are bonded to a common nitrogen atom. The aryl or heteroaryl groups which are bonded to the common nitrogen atom may be connected to one another via divalent groups or single bonds. They are preferably not connected to one another. Besides the said structural unit, the triarylamino compound may have any desired further groups and substituents.

At least one of the layers arranged between the layer EML and the anode preferably comprises at least one triarylamino compound which has not more than one amino group. A plurality of the layers arranged between the layer EML and the anode preferably comprise at least one triarylamino compound which has not more than one amino group.

The triarylamino compound is preferably a small organic molecule and has a molecular weight of less than 2000 Da, preferably less than 1500 Da and particularly preferably less than 1000 Da.

An aryl group in the sense of this invention contains 6 to 60 aromatic ring atoms; a heteroaryl group in the sense of this invention contains 5 to 60 aromatic ring atoms, at least one of which is a heteroatom. The heteroatoms are preferably selected from N, O and S. This represents the basic definition.

An aryl group or heteroaryl group here is taken to mean either a simple aromatic ring, i.e. benzene, or a simple heteroaromatic ring, for example pyridine, pyrimidine or thiophene, or a condensed (annellated) aromatic or heteroaromatic polycycle, for example naphthalene, phenanthrene, quinoline or carbazole. A condensed (annellated) aromatic or heteroaromatic polycycle in the sense of the present application consists of two or more simple aromatic or heteroaromatic rings condensed with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

At least one of the layers arranged between the layer EML and the anode preferably comprises at least one compound of the formula (I)

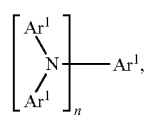

formula (I)

where:
Ar$^1$ is on each occurrence, identically or differently, an aromatic or heteroaromatic ring system having 5 to 30 aromatic ring atoms, which may be substituted by one or more radicals R$^1$; and
R$^1$ is on each occurrence, identically or differently, H, D, F, C(=O)R$^2$, CN, Si(R$^2$)$_3$, P(=O)(R$^2$)$_2$, S(=O)R$^2$, S(=O)$_2$R$^2$, a straight-chain alkyl or alkoxy group having 1 to 20 C atoms or a branched or cyclic alkyl or alkoxy group having 3 to 20 C atoms or an alkenyl or alkynyl group having 2 to 20 C atoms, where the above-mentioned groups may each be substituted by one or more radicals R$^2$ and where one or more CH$_2$ groups in the above-mentioned groups may be replaced by —R$^2$C=CR$^2$—, —C≡C—, Si(R$^2$)$_2$, C=O, C=S, C=NR$^2$, —C(=O)O—, —C(=O)NR$^2$—, P(=O)(R$^2$), —O—, —S—, SO or SO$_2$ and where one or more H atoms in the above-mentioned groups may be replaced by D, F or CN, or an aromatic or heteroaromatic ring system having 5 to 30 aromatic ring atoms, which may in each case be substituted by one or more radicals $R^2$, or an aryloxy or heteroaryloxy group having 5 to 30 aromatic ring atoms, which may be substituted by one or more radicals $R^2$, where two or more radicals $R^1$ may be linked to one another and may form a ring;

$R^2$ is on each occurrence, identically or differently, H, D, F or an aliphatic, aromatic or heteroaromatic organic radical having 1 to 20 C atoms, in which, in addition, one or more H atoms may be replaced by D or F; two or more substituents $R^2$ here may be linked to one another and form a ring;

n is 1, 2, 3 or 4.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an $sp^3$-hybridised C, Si, N or O atom, an $sp^2$-hybridised C or N atom or an sp-hybridised C atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may in each case also be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzo-pyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cyclo-heptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The formation of a ring between two substituents here is preferably taken to mean the formation of an aromatic, heteroaromatic, aliphatic or heteroaliphatic ring. The ring preferably has five to ten members, particularly preferably five to six members.

$Ar^1$ is preferably an aromatic ring system having 6 to 30 aromatic ring atoms, which may be substituted by one or more radicals $R^1$. $Ar^1$ particularly preferably contains a group selected from fluorene, indenofluorene, spirobifluorene, phenyl, biphenyl, terphenyl or naphthyl which is substituted by $R^1$ or unsubstituted.

$Ar^1$ furthermore preferably contains no condensed aryl groups having more than 14 aromatic ring atoms, particularly preferably no condensed aryl group having more than 10 aromatic ring atoms.

$Ar^1$ furthermore preferably contains no condensed heteroaryl group having more than 14 aromatic ring atoms, particularly preferably no condensed heteroaryl group having more than 10 aromatic ring atoms.

Furthermore, the preferences given below relating to $Ar^1$ apply.

The index n is preferably equal to 1 or 2, particularly preferably equal to 1.

It is preferred for at least one of the layers arranged between the layer EML and the anode to comprise at least one compound of the formulae (I-1) to (I-6)

formula (I-1)

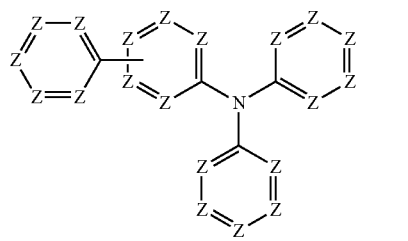

formula (I-2)

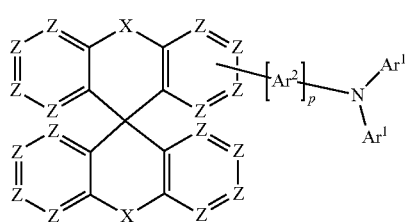

formula (I-3)

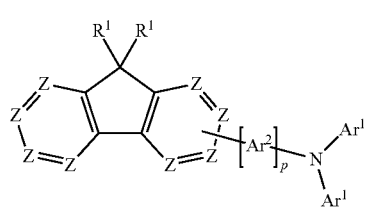

formula (I-4)

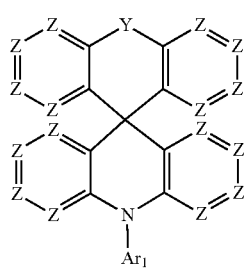

formula (I-5)

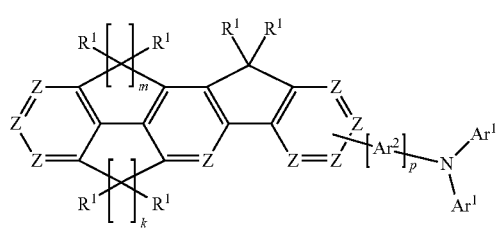

formula (I-6)

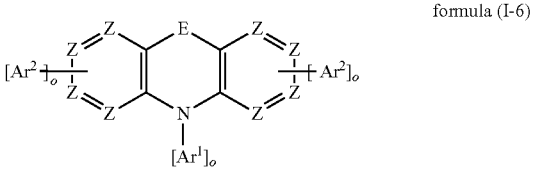

where:

Z is on each occurrence, identically or differently, N or $CR^1$, where Z is equal to C if a substituent is bonded;

X is on each occurrence, identically or differently, a single bond, O, S, $BR^1$, $C(R^1)_2$, $Si(R^1)_2$, NR, $PR^1$, $C(R^1)_2$—$C(R^1)_2$ or $CR^1$=$CR^1$;

Y is a single bond, O, S, $BR^1$, $C(R^1)_2$, $Si(R^1)_2$, $NR^1$, $PR^1$, $C(R^1)_2$—$C(R^1)_2$ or $CR^1$=$CR^1$;

E is O, S, $BR^1$, $C(R^1)_2$, $Si(R^1)_2$, $NR^1$, $PR^1$, $C(R^1)_2$—$C(R^1)_2$ or $CR^1$=$CR^1$;

$Ar^1$ is defined as above;

$Ar^2$ is an aromatic or heteroaromatic ring system having 6 to 18 aromatic ring atoms, which may be substituted by one or more radicals $R^1$;

$R^1$ is defined as above;

o is on each occurrence, identically or differently, 0 or 1, where the sum of all indices o is at least equal to 1;

p is equal to 0 or 1;

k, m are, identically or differently, 0 or 1, where the sum of all indices k and m is equal to 1 or 2.

For the above-mentioned formulae (I-1) to (I-6), it is preferred for not more than three groups Z in a ring to be equal to N. It is generally preferred for Z to be equal to $CR^1$.

The group X is on each occurrence preferably selected, identically or differently, from a single bond, $C(R^1)_2$, O and S, it is particularly preferably a single bond.

The group Y is preferably selected from O and $C(R^1)_2$, it is particularly preferably O.

The group E is preferably selected from $C(R^1)_2$, O and S, it is particularly preferably $C(R^1)_2$.

The group $Ar^1$ in the above-mentioned formulae is preferably selected on each occurrence, identically or differently, from aromatic or heteroaromatic ring systems having 6 to 30 aromatic ring atoms, which may be substituted by one or more radicals $R^1$. $Ar^1$ in the above-mentioned formulae is particularly preferably selected on each occurrence, identically or differently, from aryl or heteroaryl groups having 6 to 18 aromatic ring atoms, which may be substituted by one or more radicals $R^1$.

Examples of compounds which can be employed in the layers present between the anode and the layer EML are shown below.

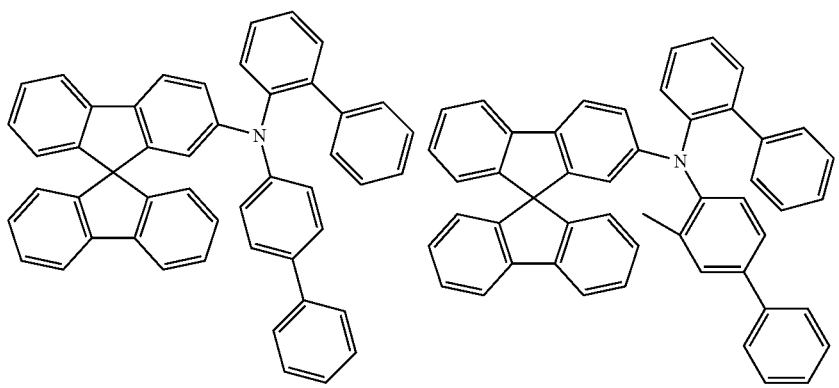

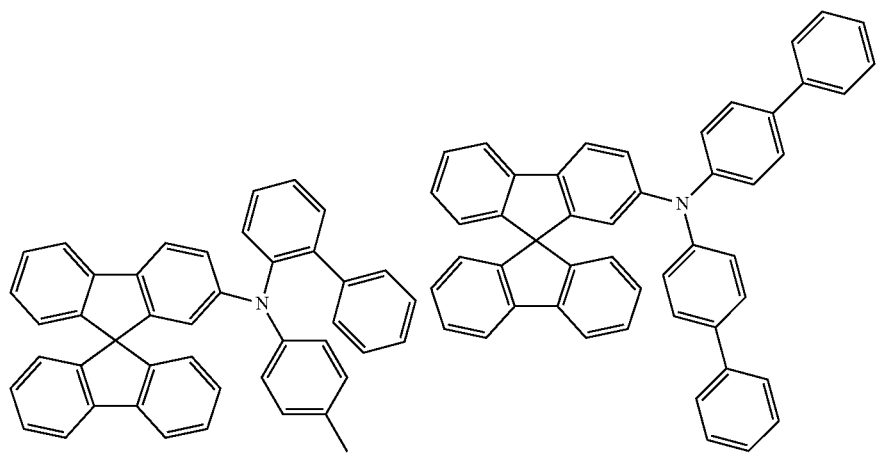
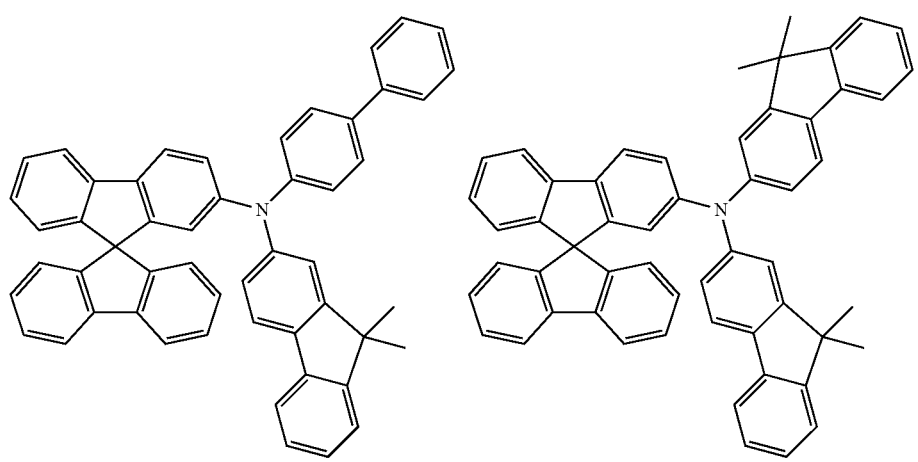
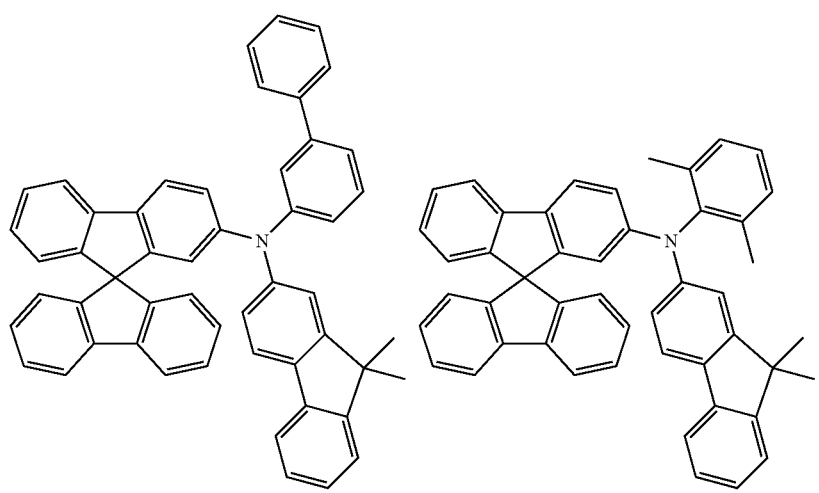

-continued
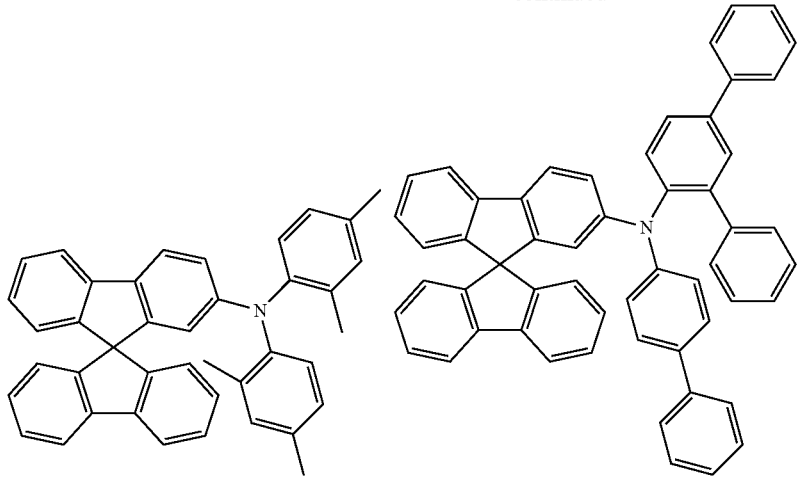
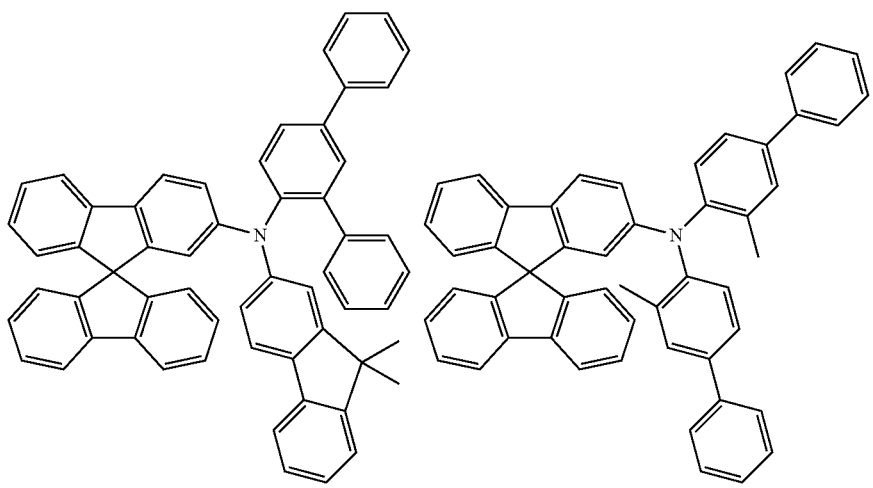
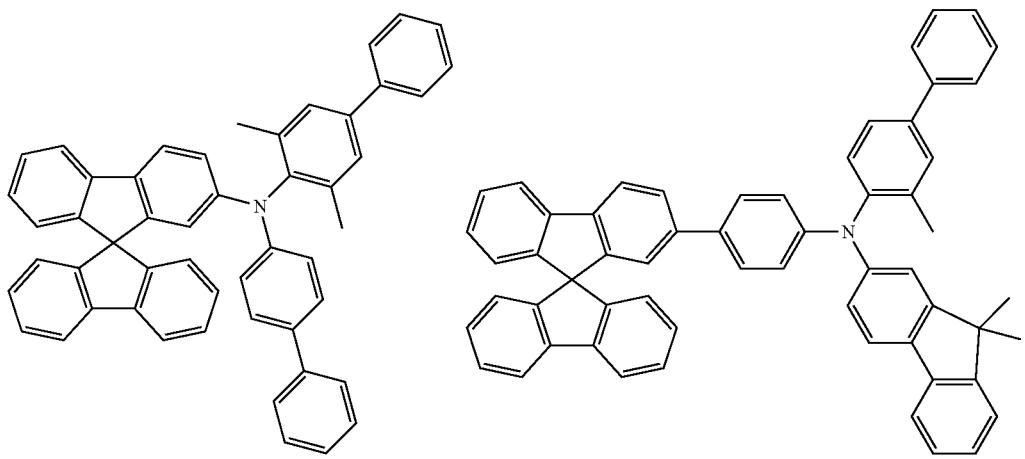

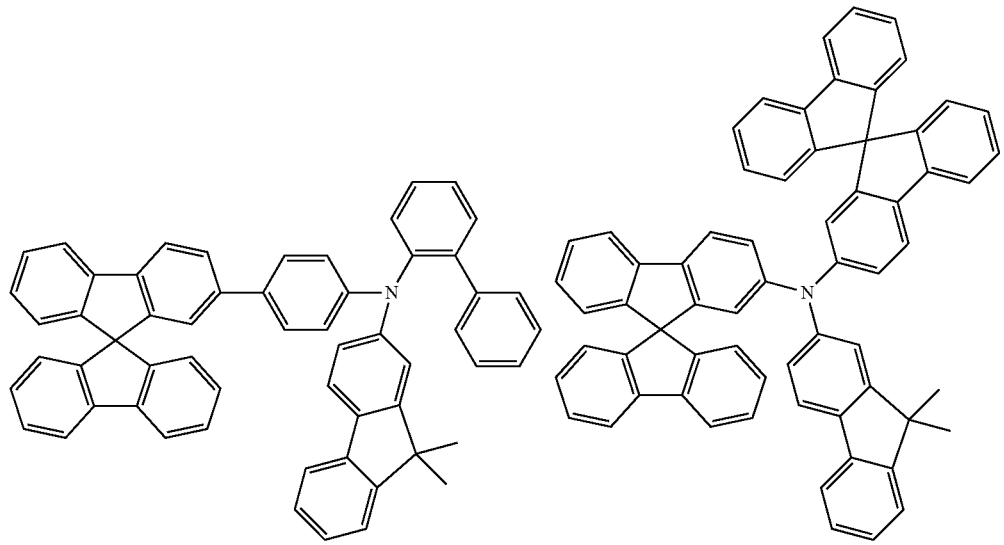
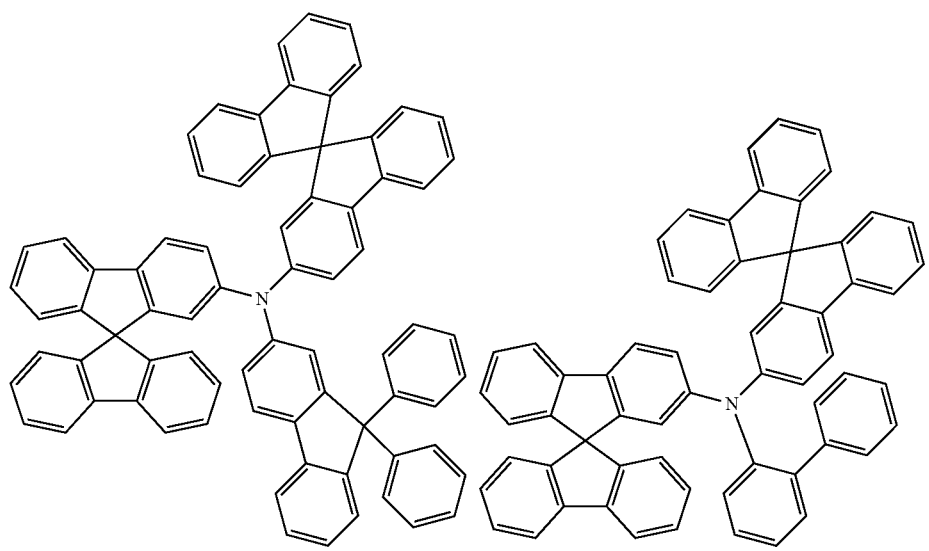
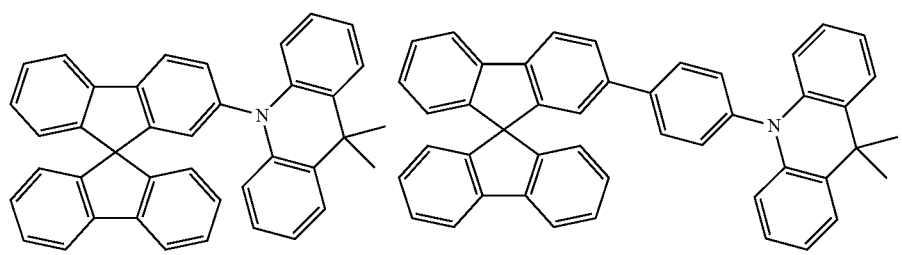

-continued
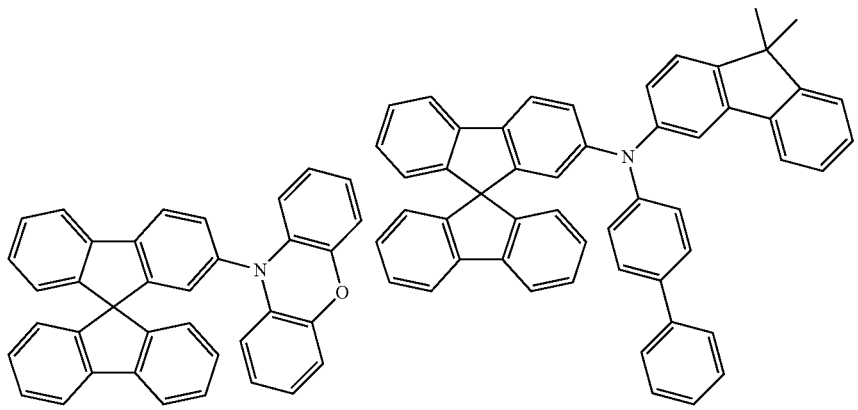
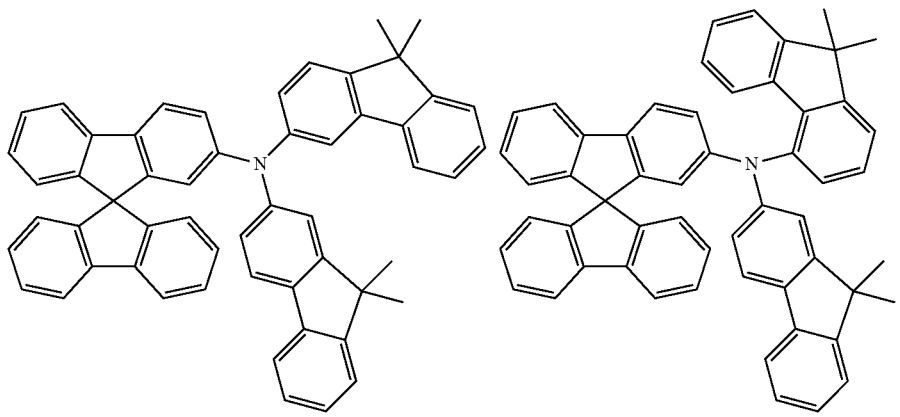
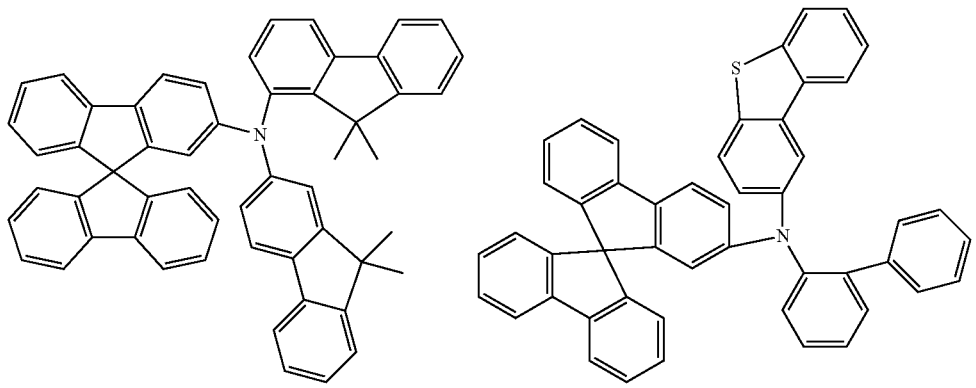
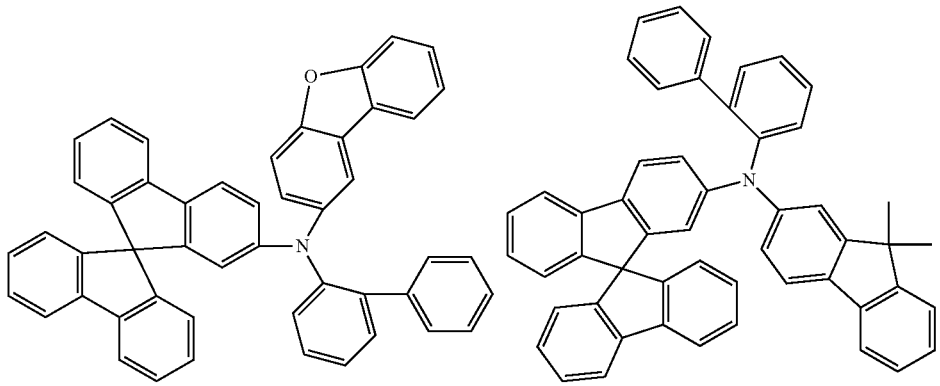

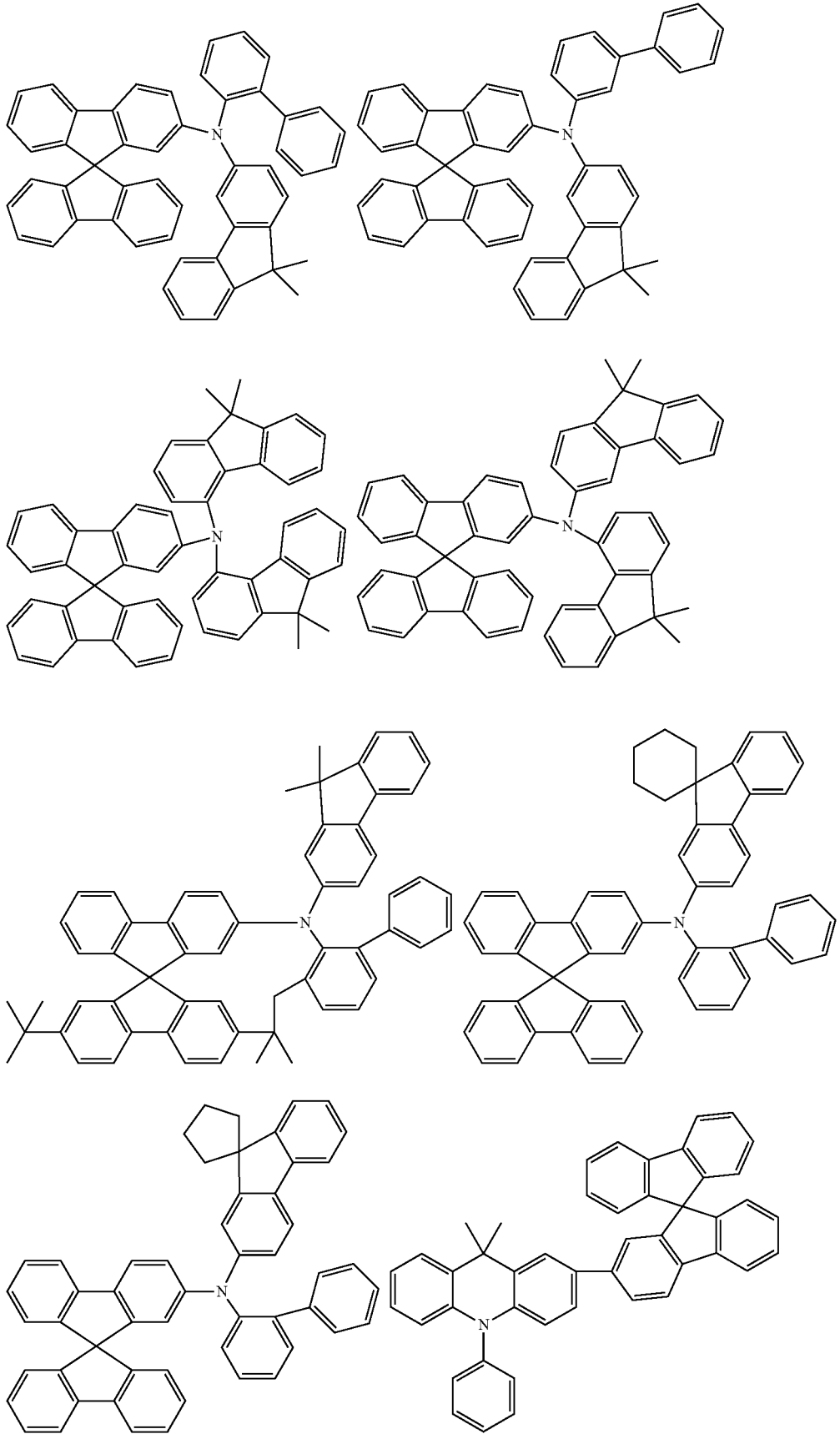

-continued
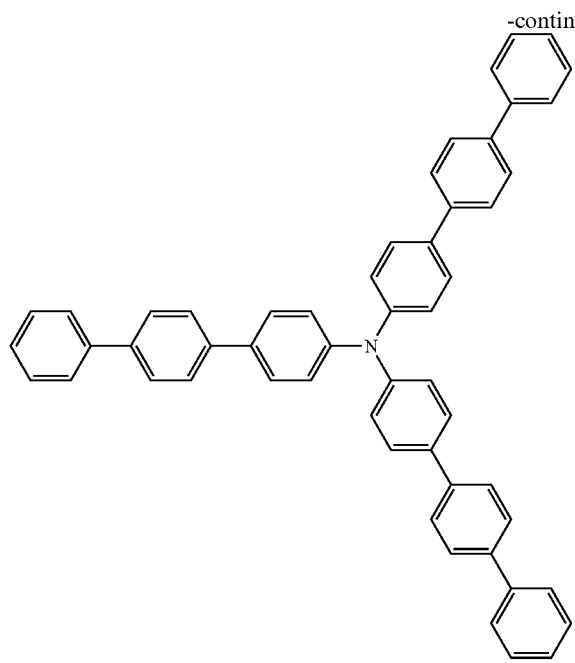
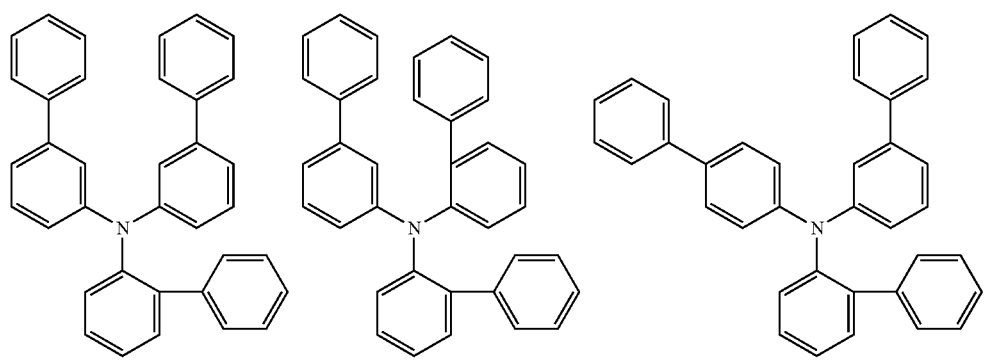
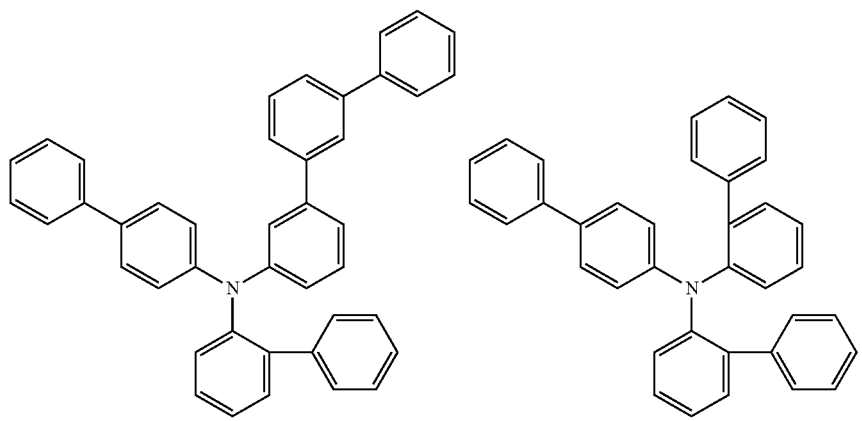

-continued
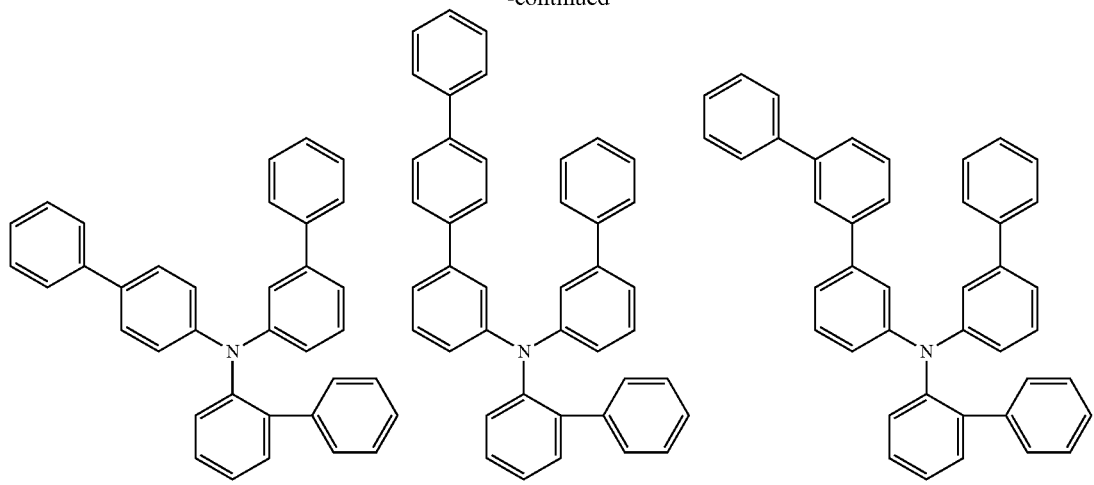
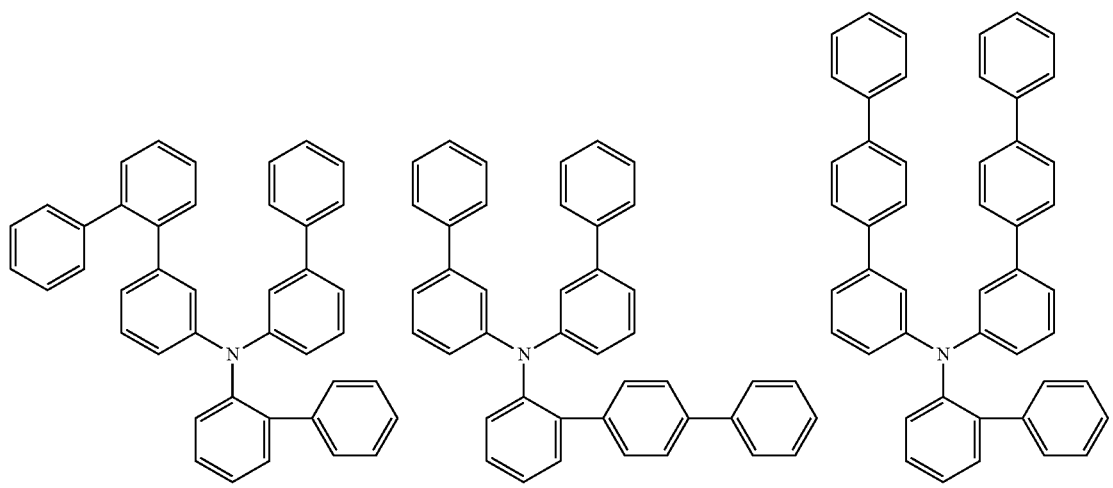
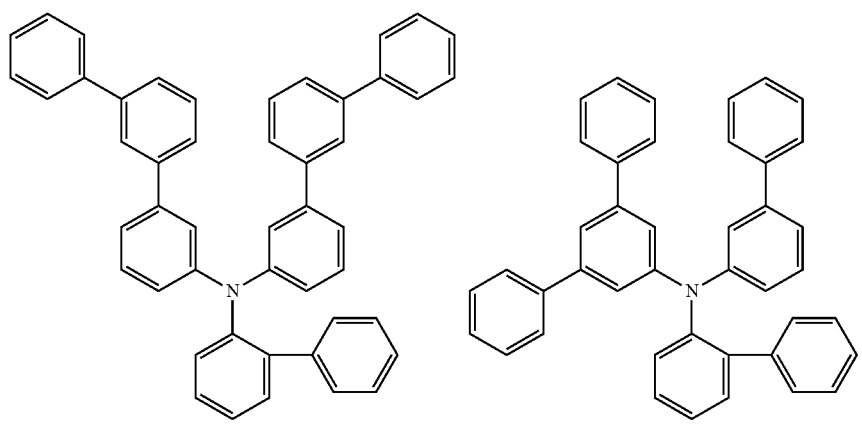

-continued
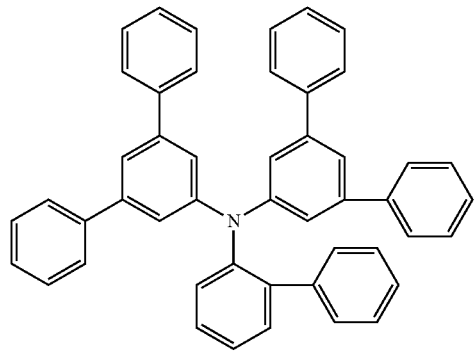
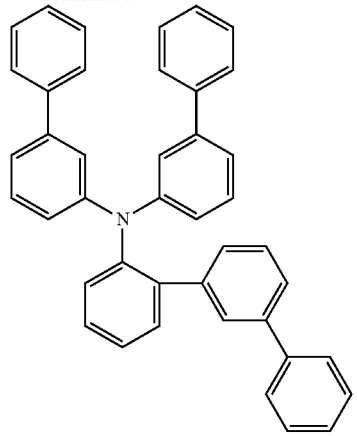
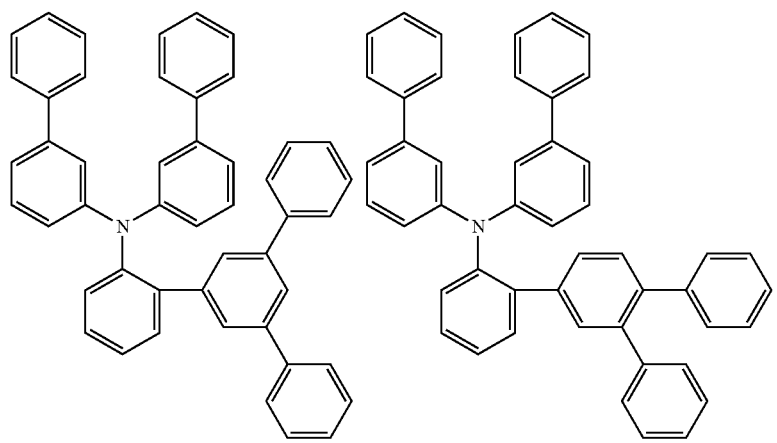
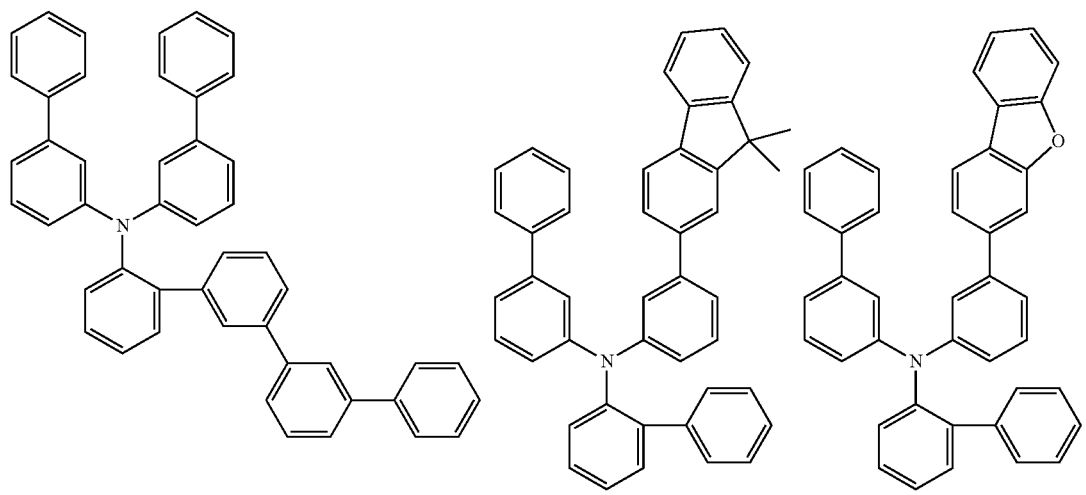

-continued
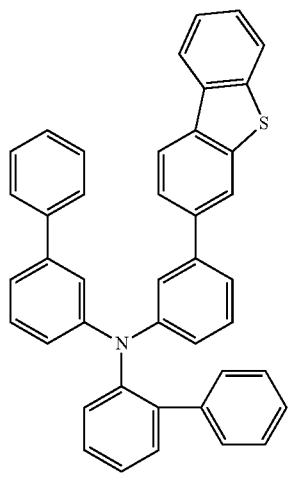
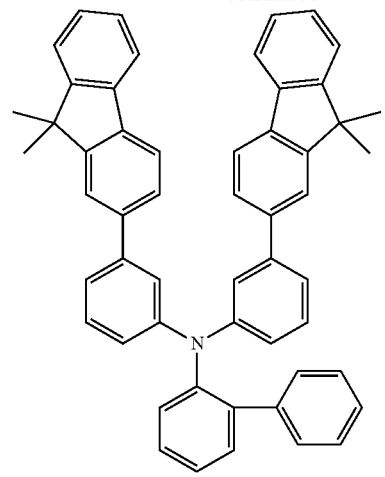
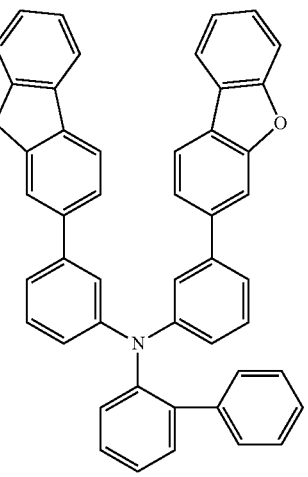
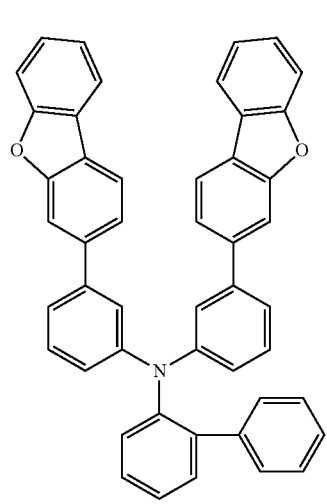
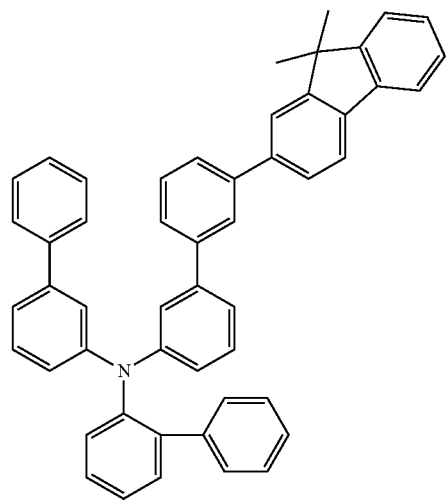
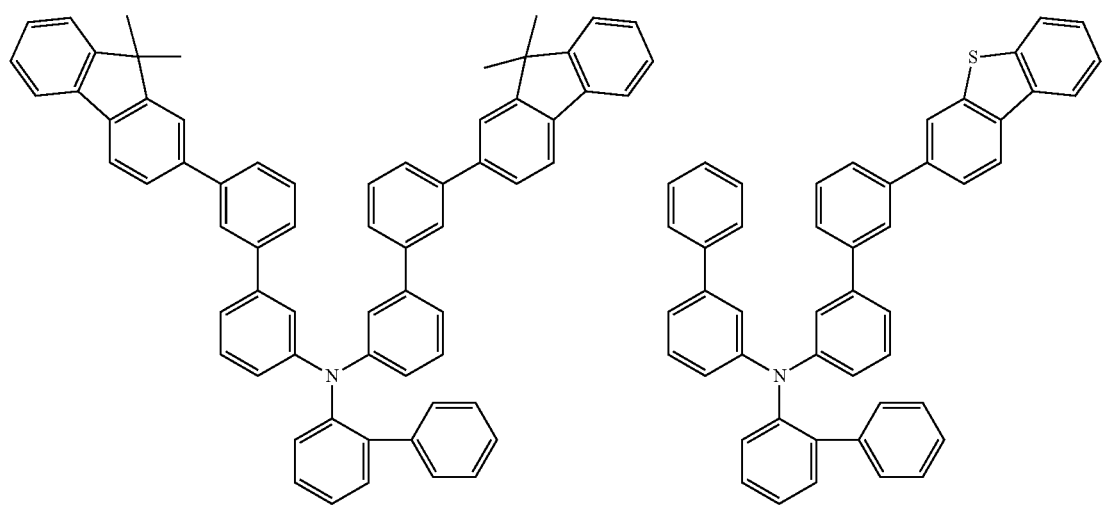

-continued
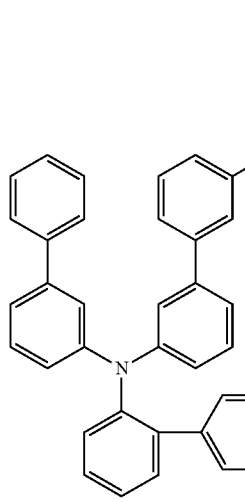
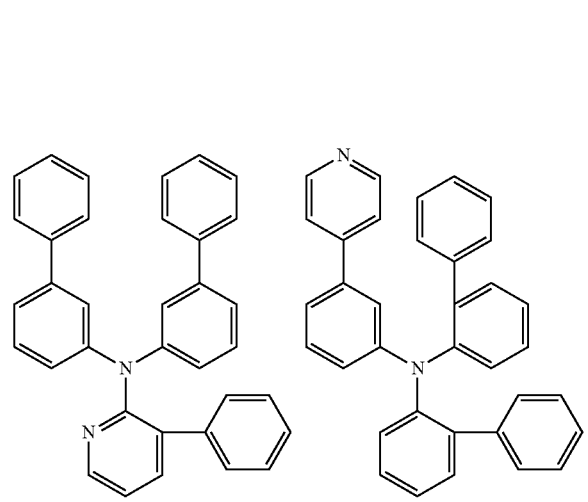
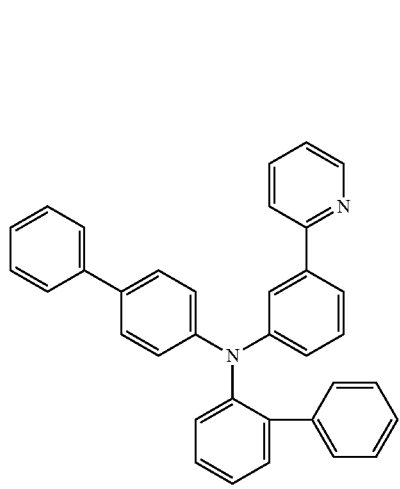
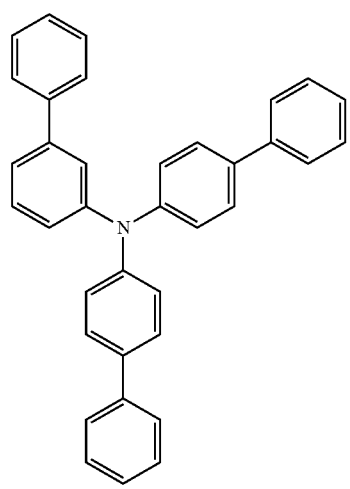
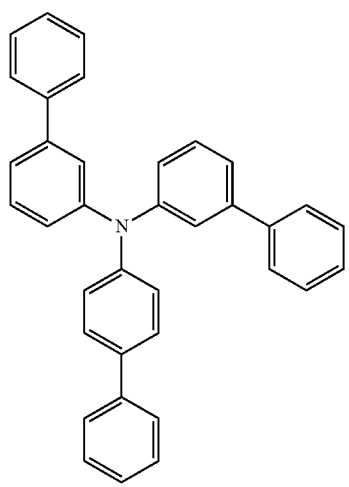
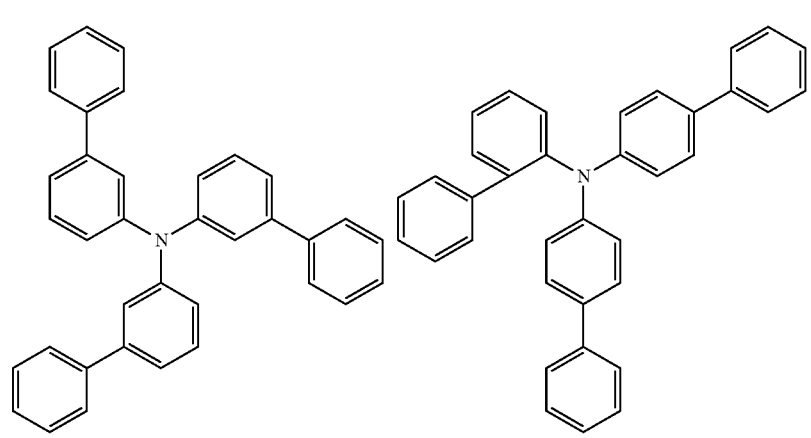

-continued
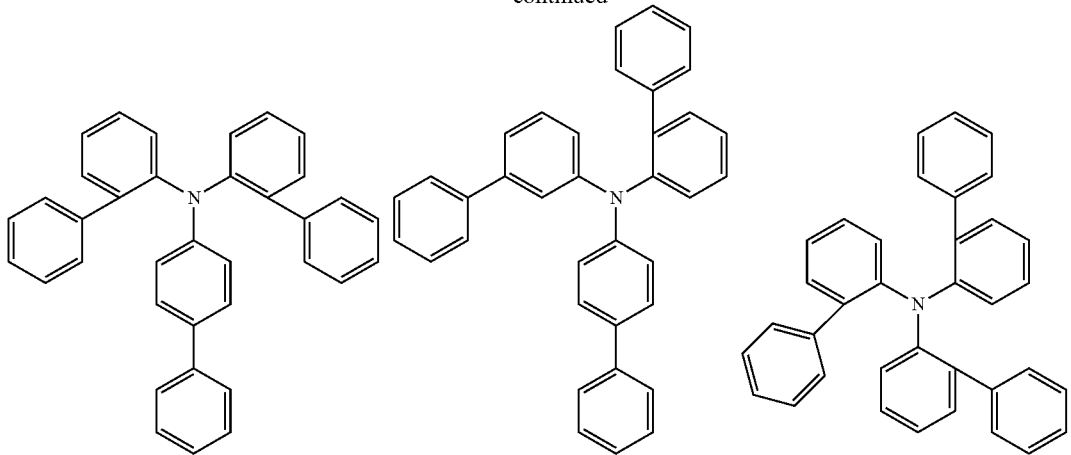
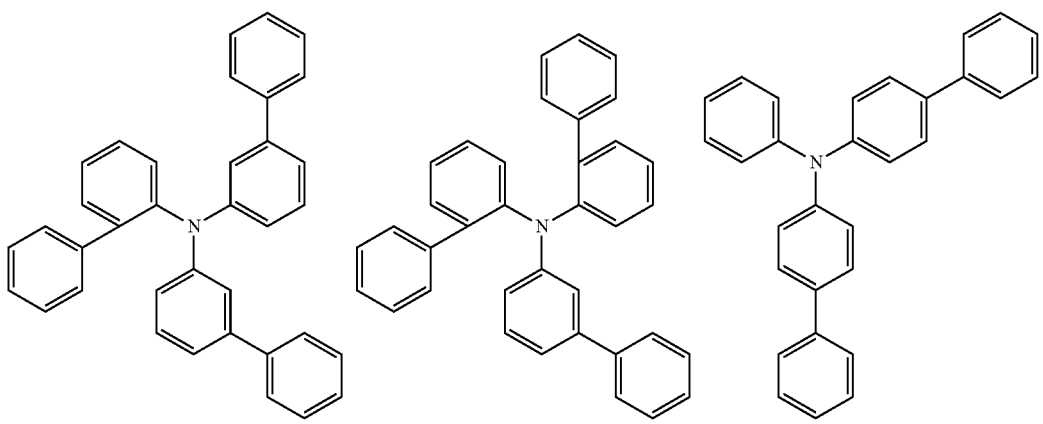
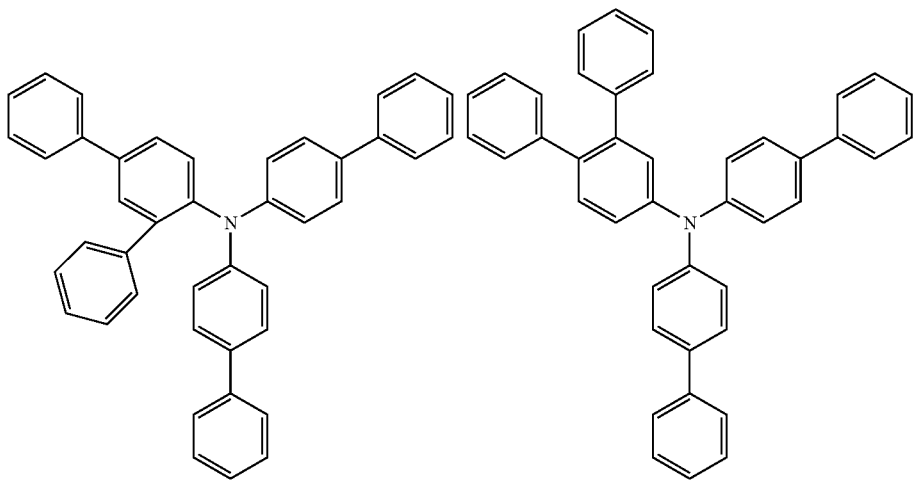

-continued
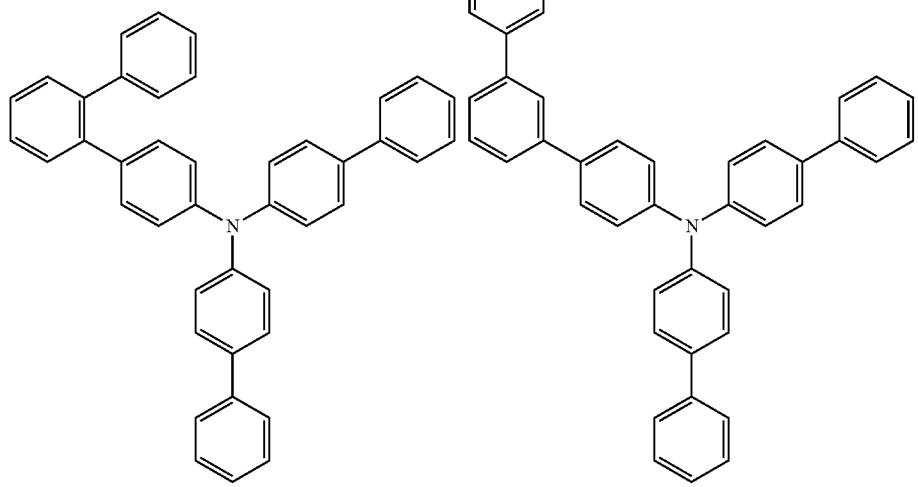
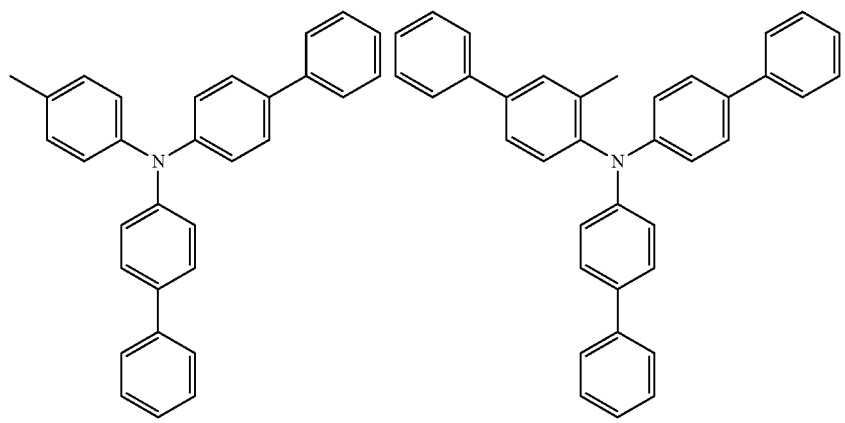
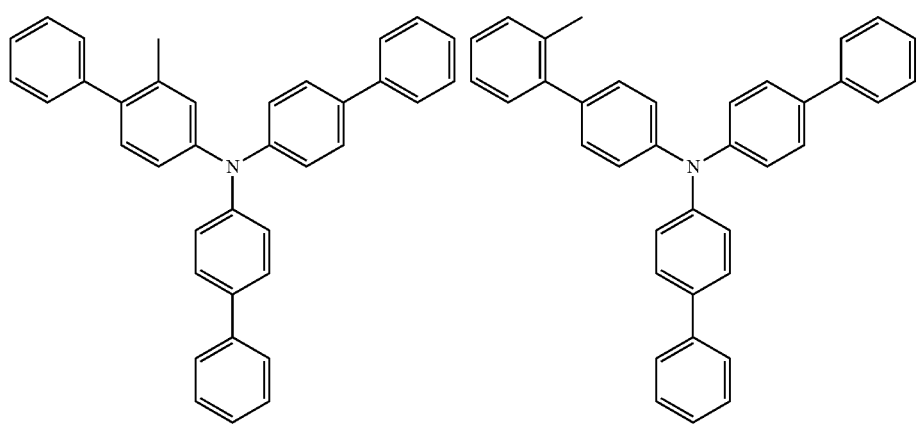

-continued
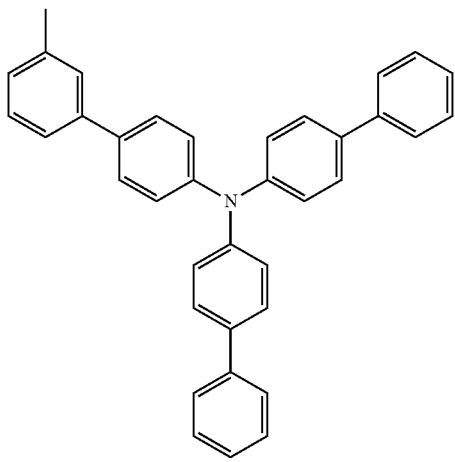
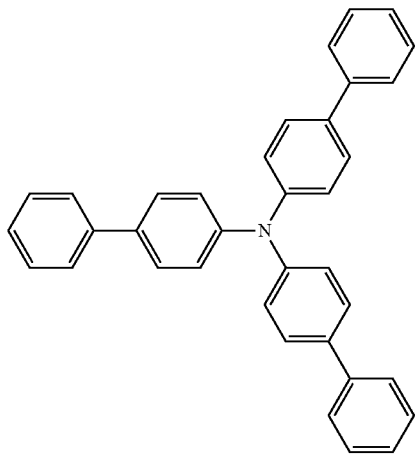
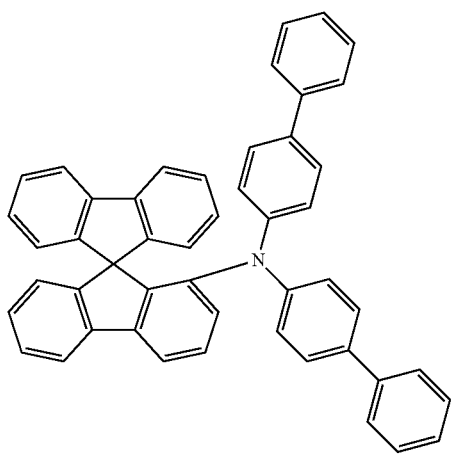
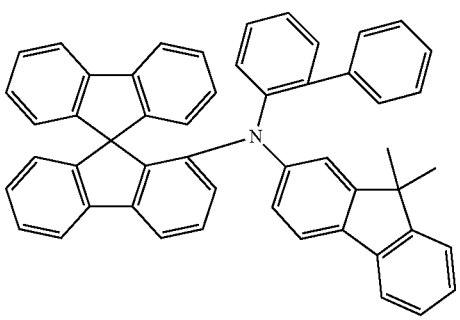
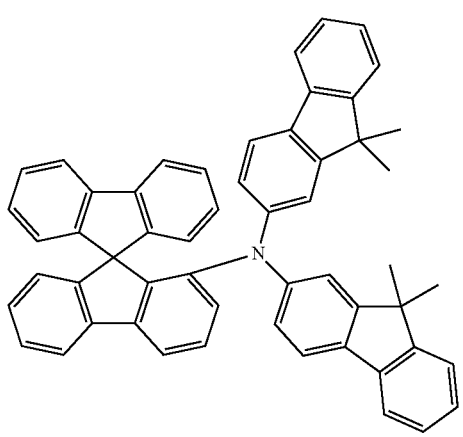
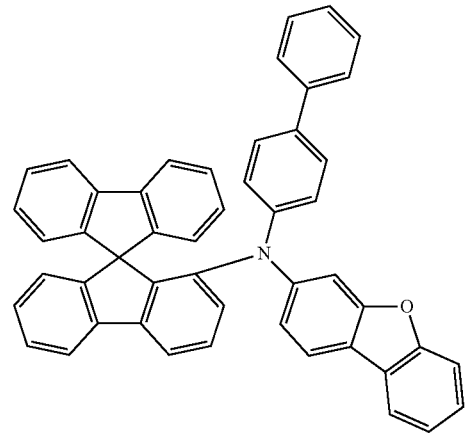

-continued
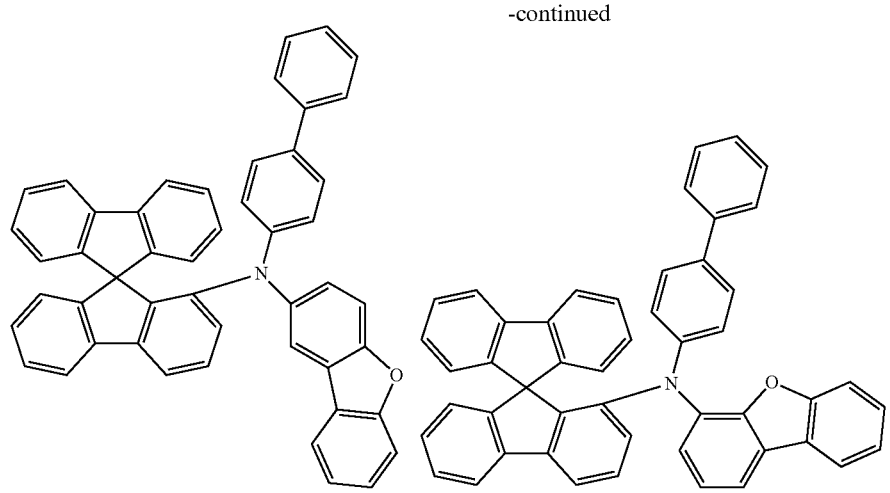
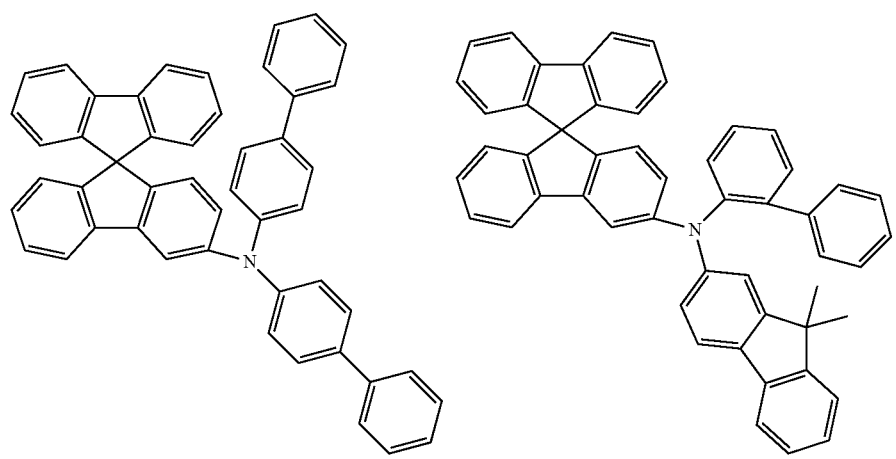
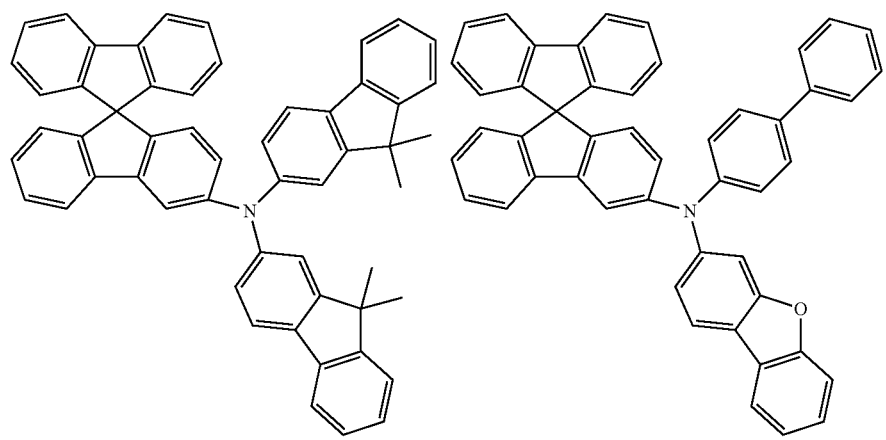

-continued
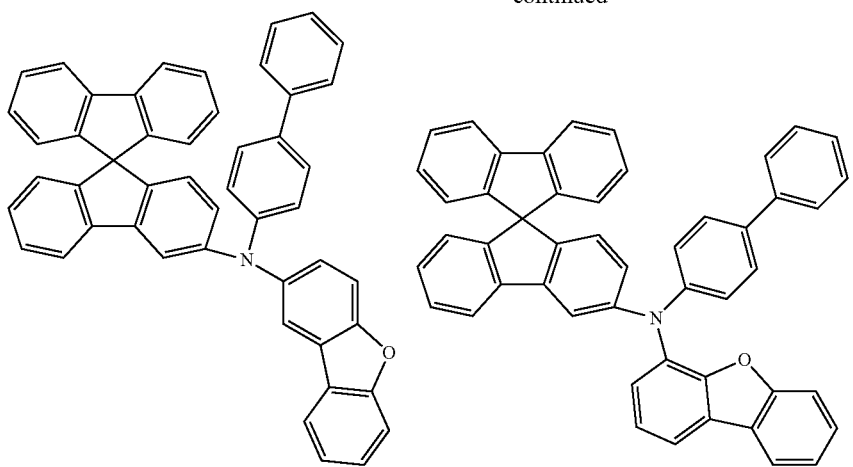
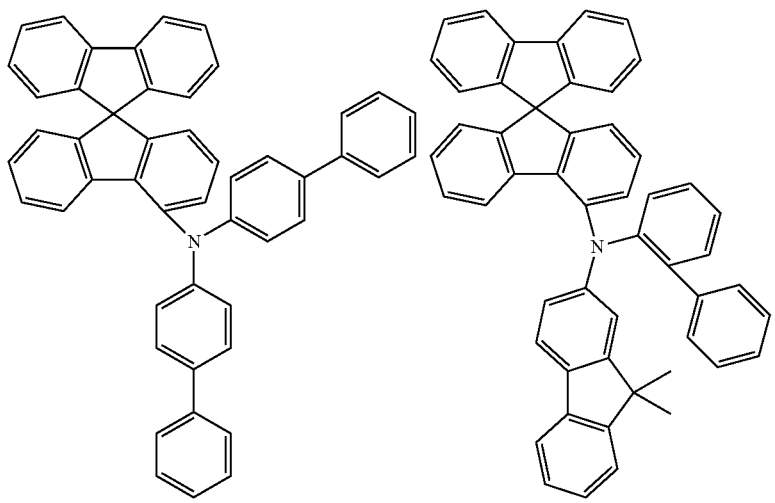
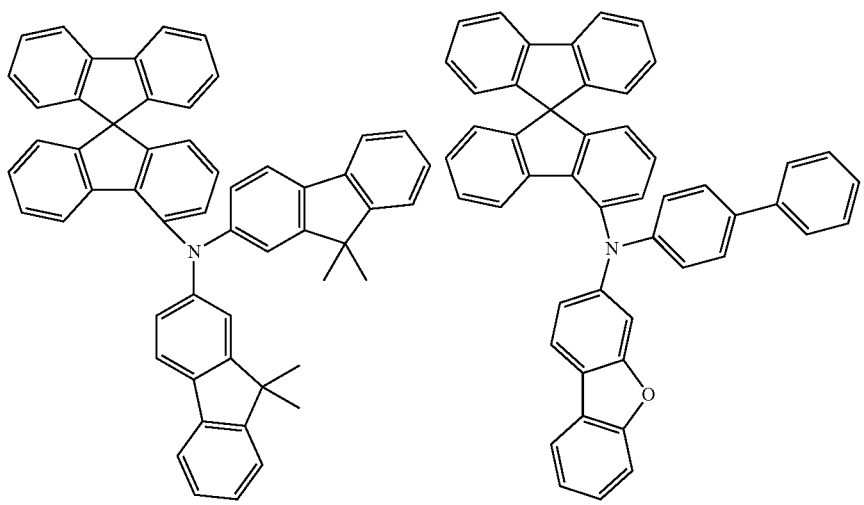

-continued
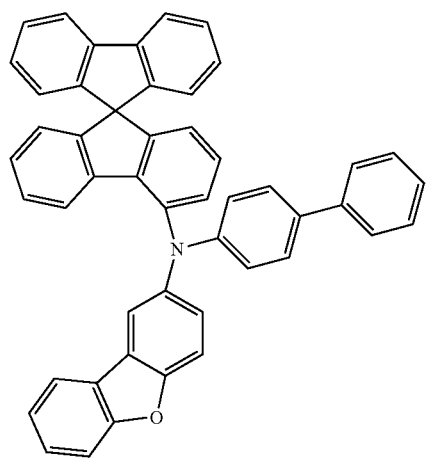
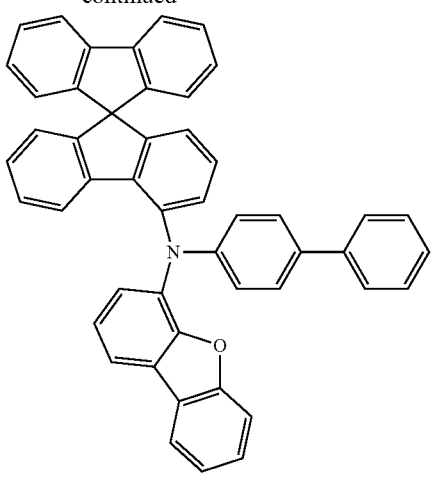
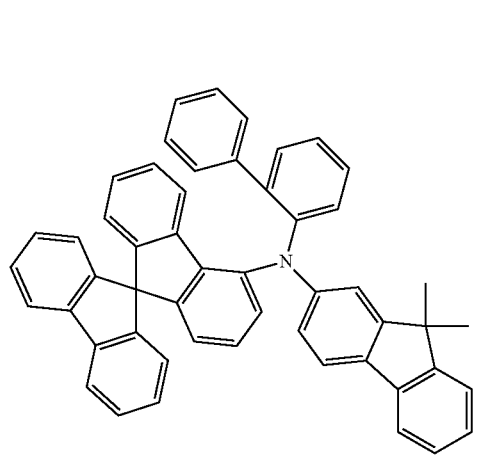
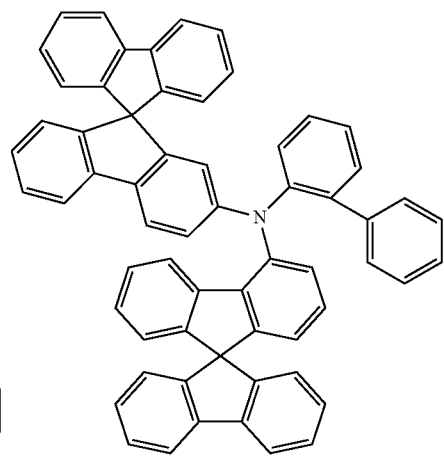
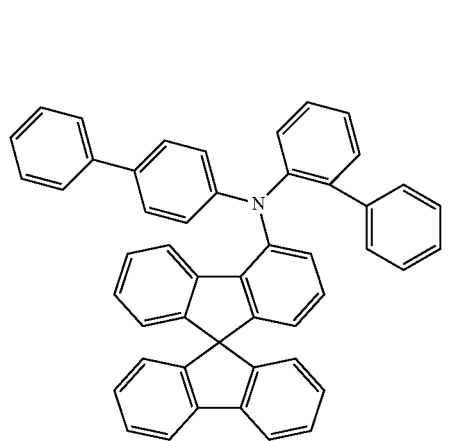
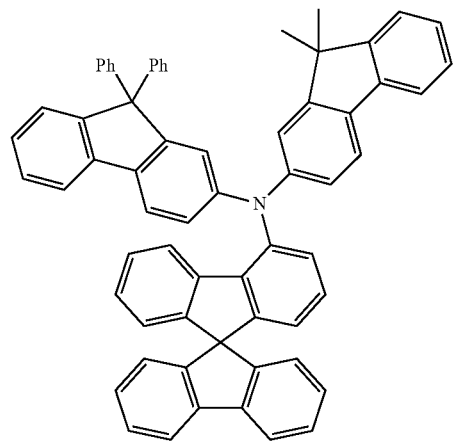

-continued
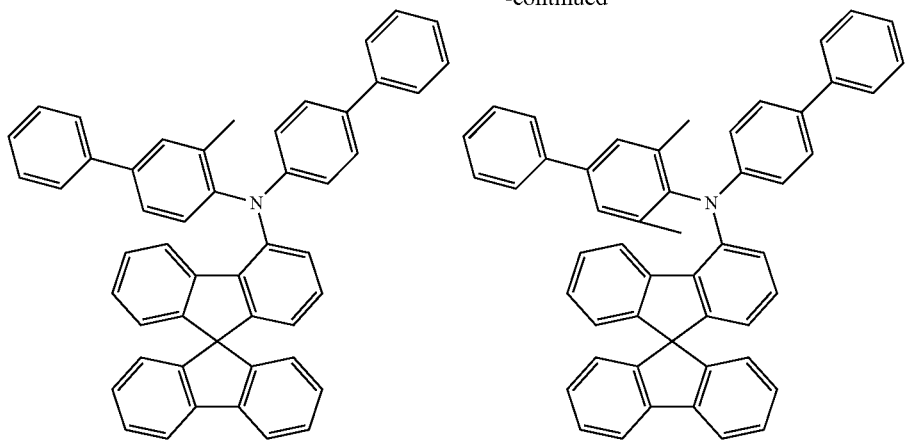
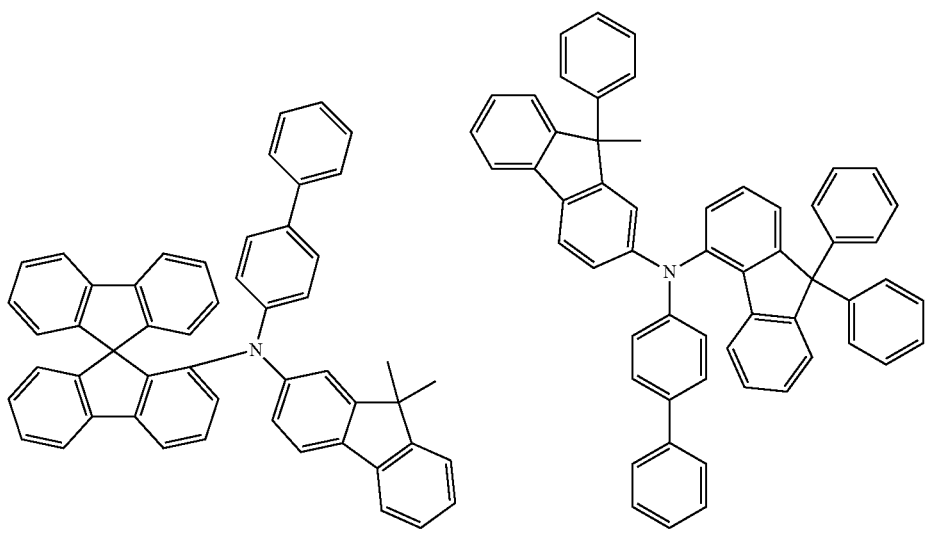
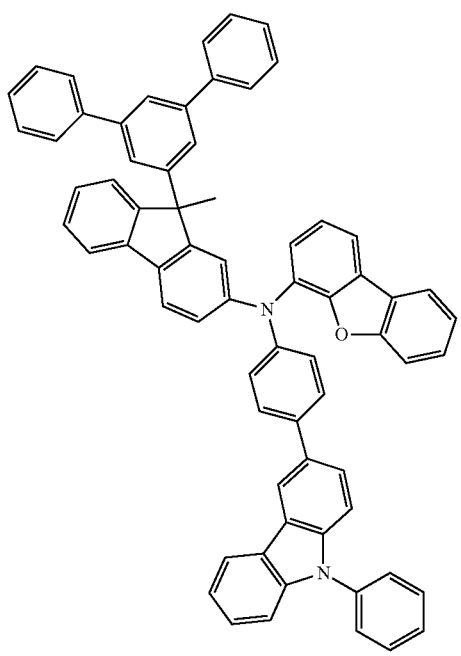

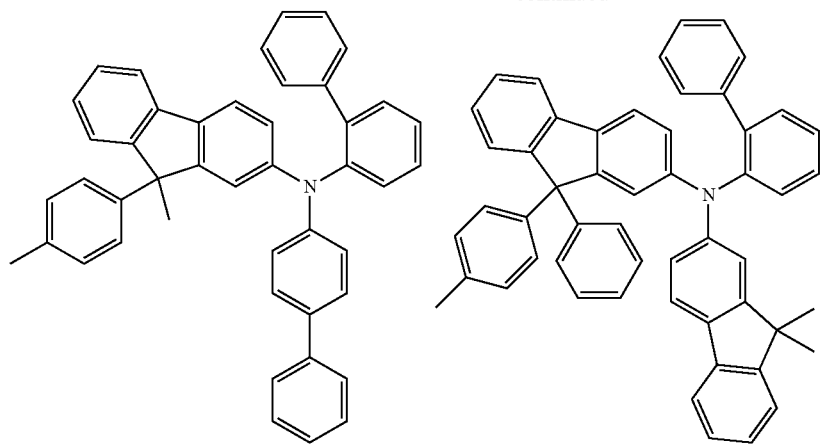
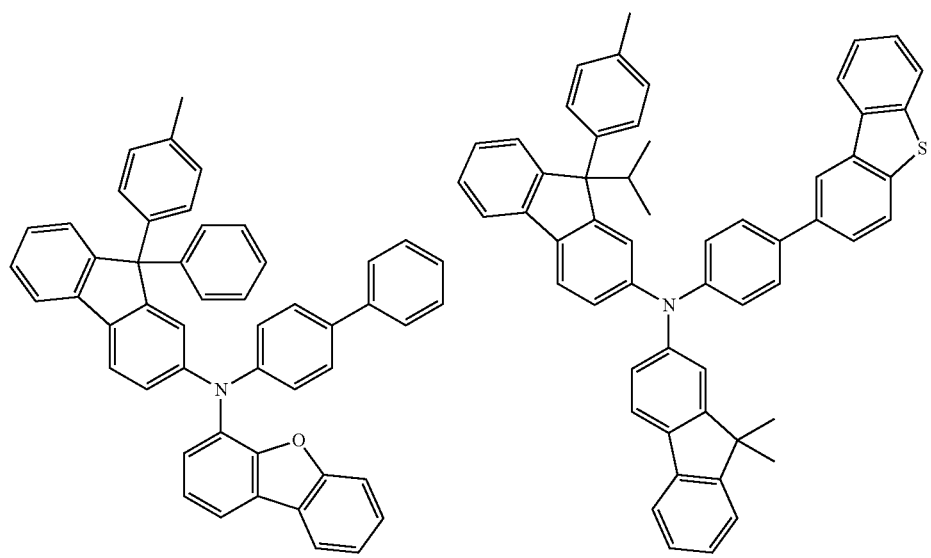
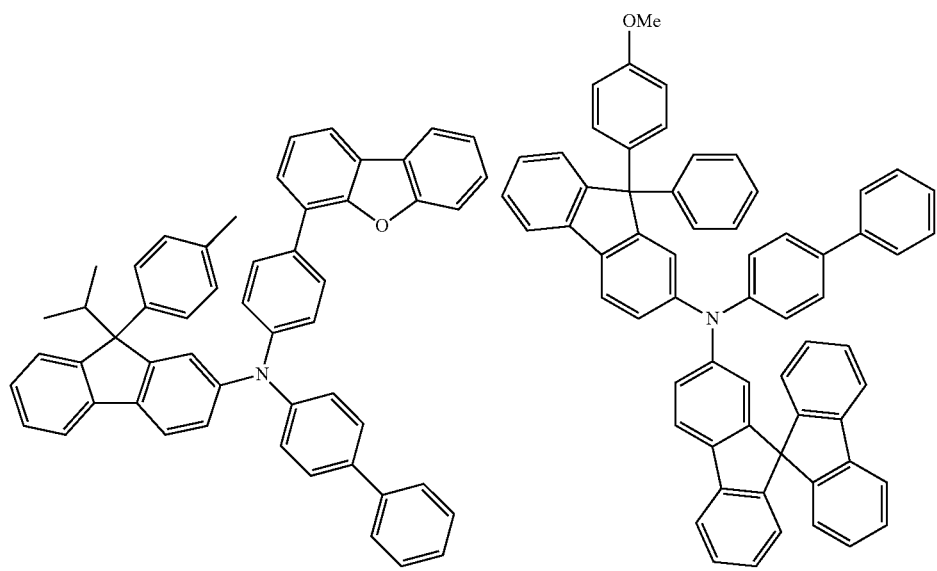

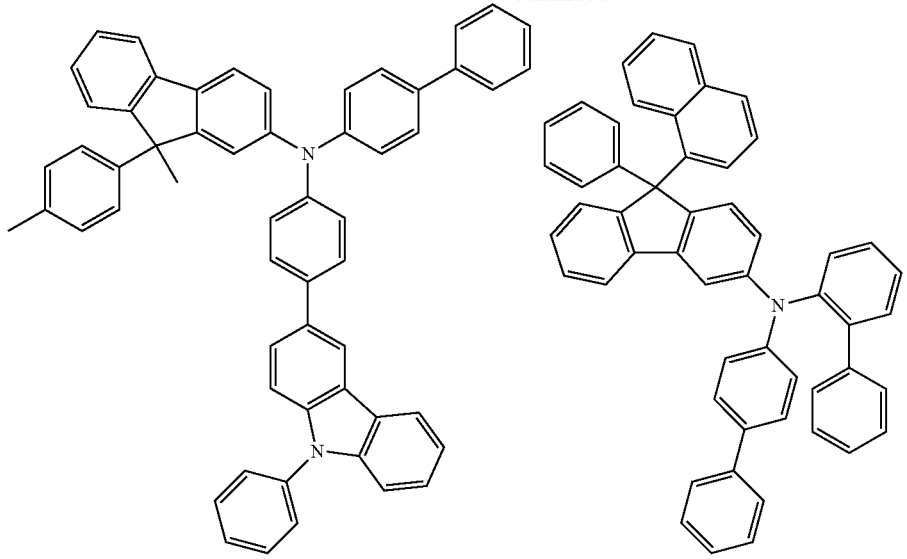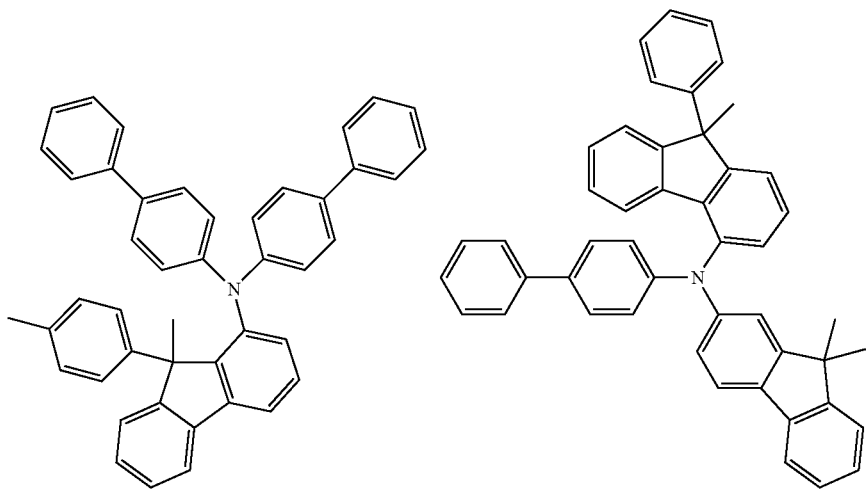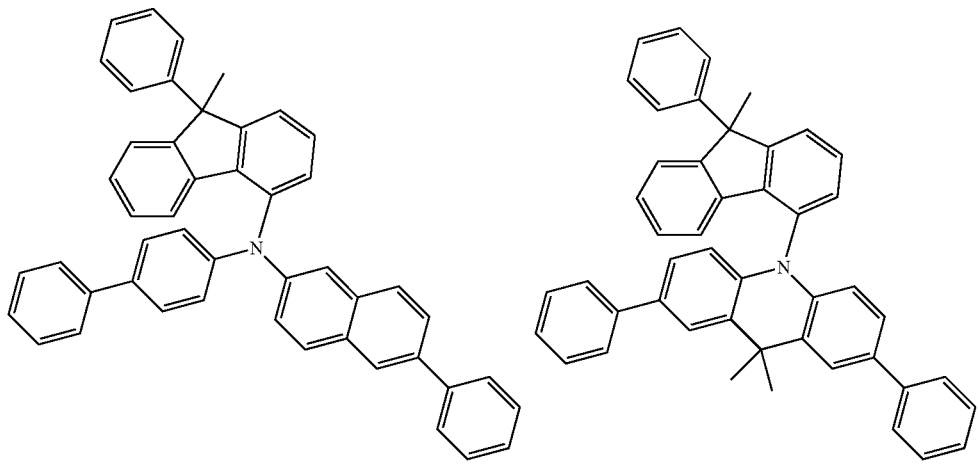

-continued
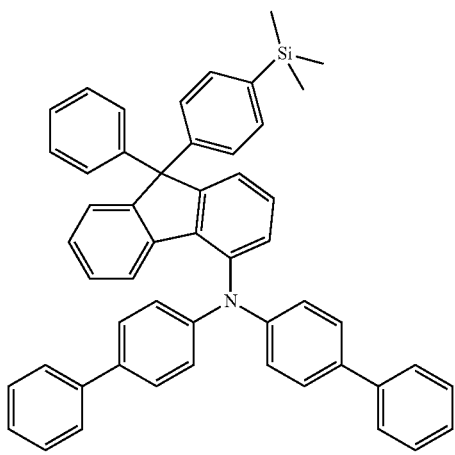
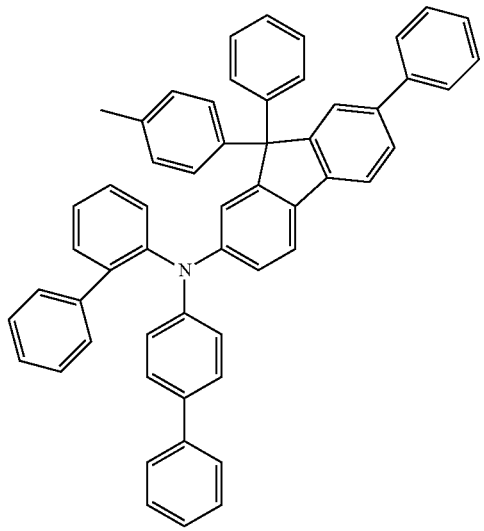
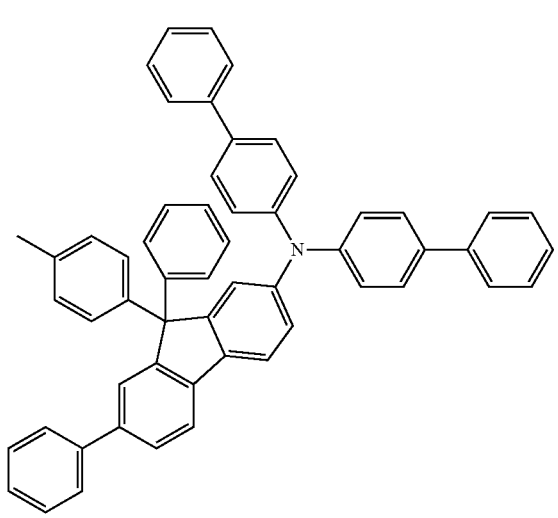
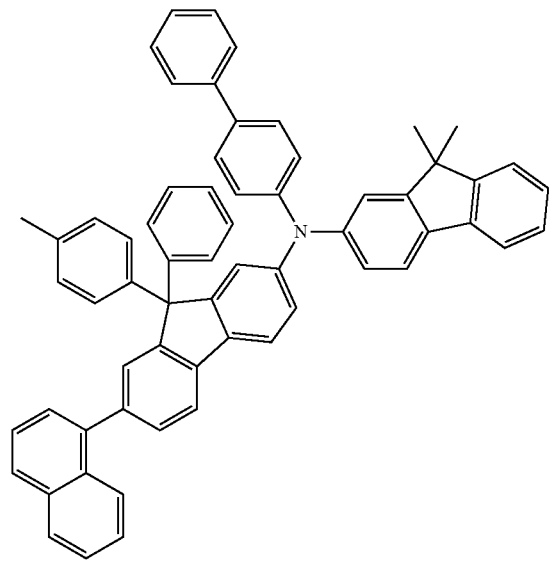
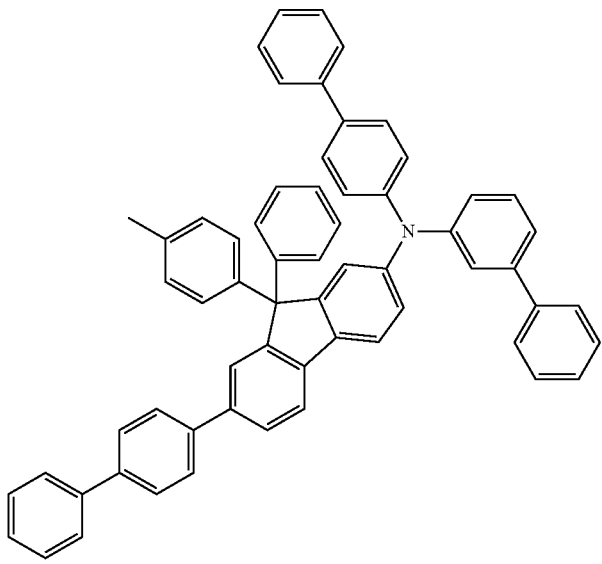
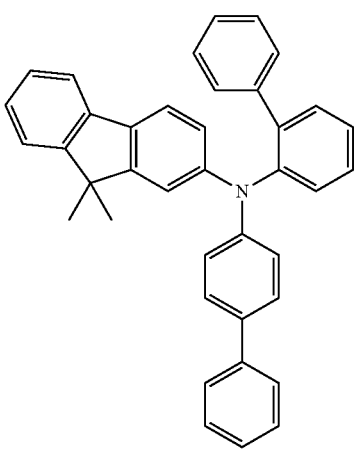

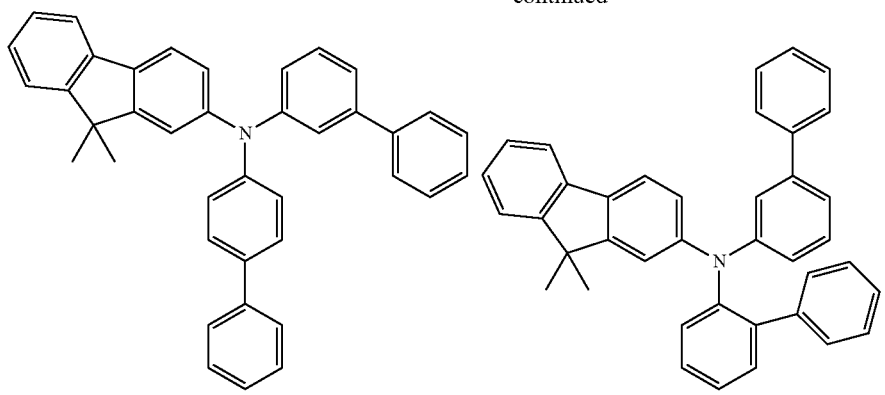
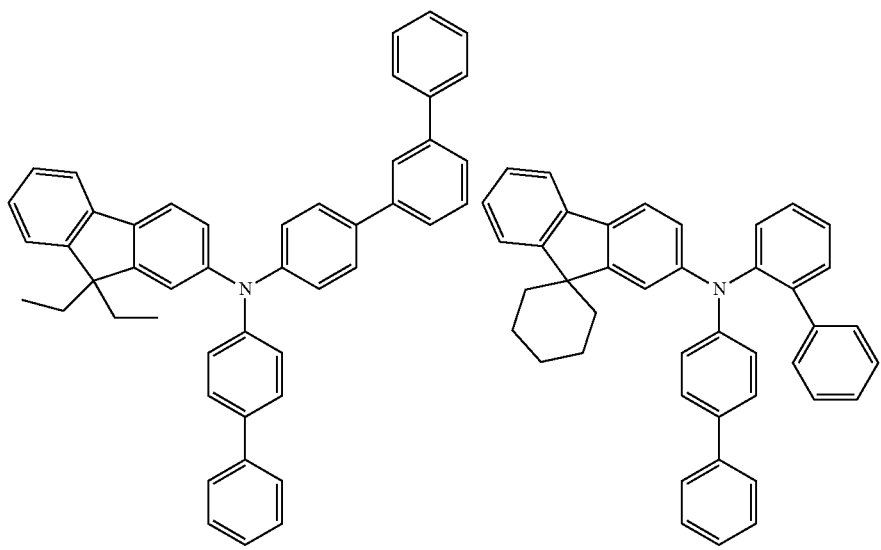
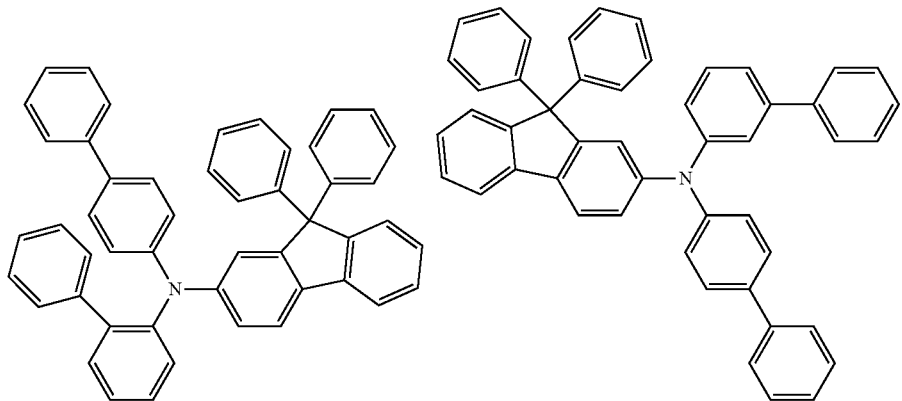

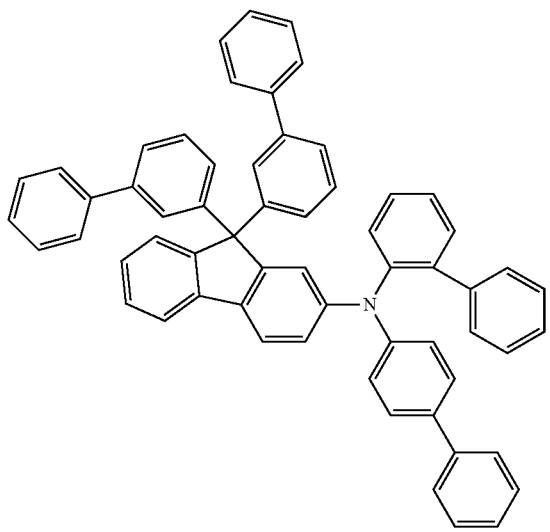
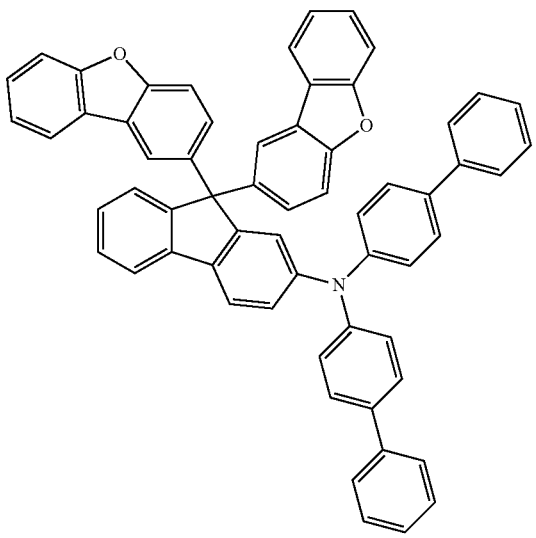
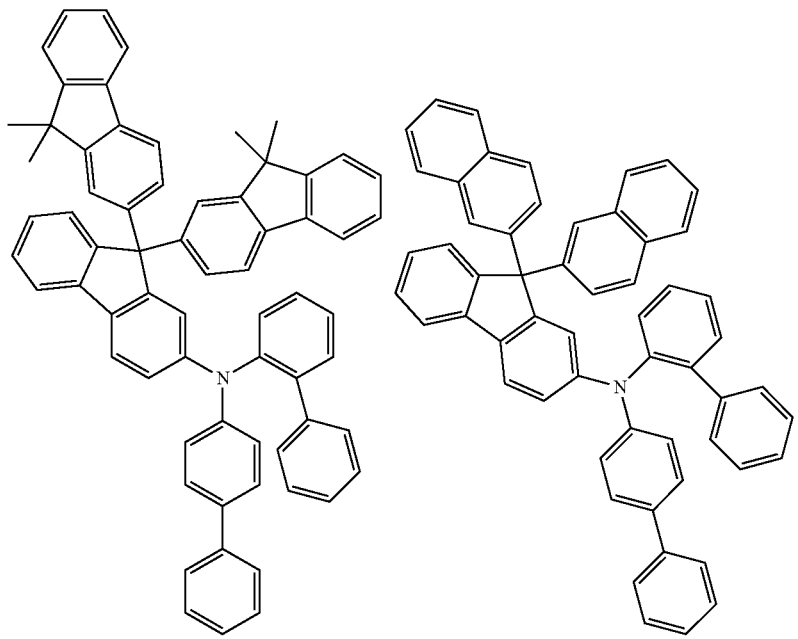
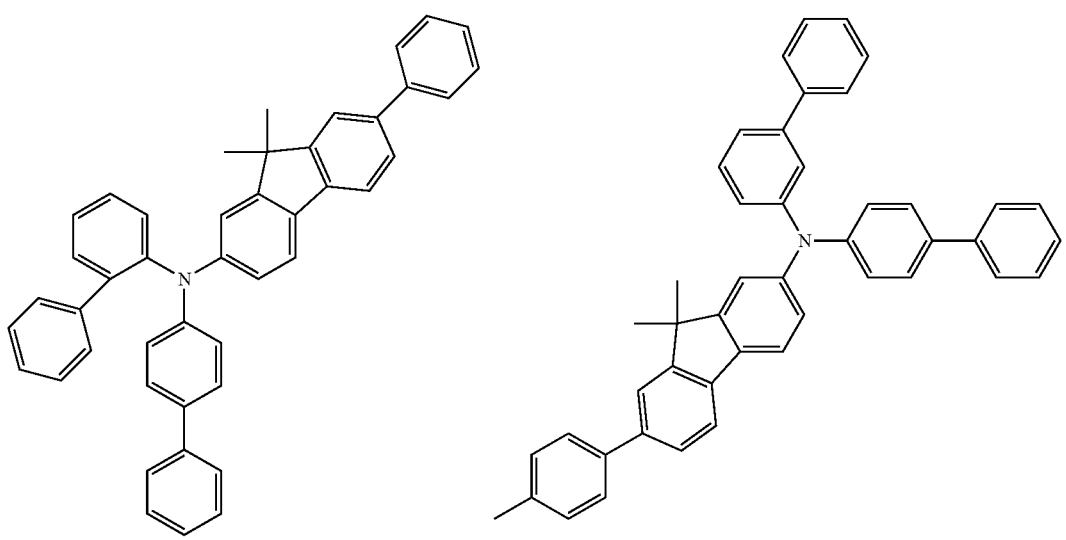

-continued
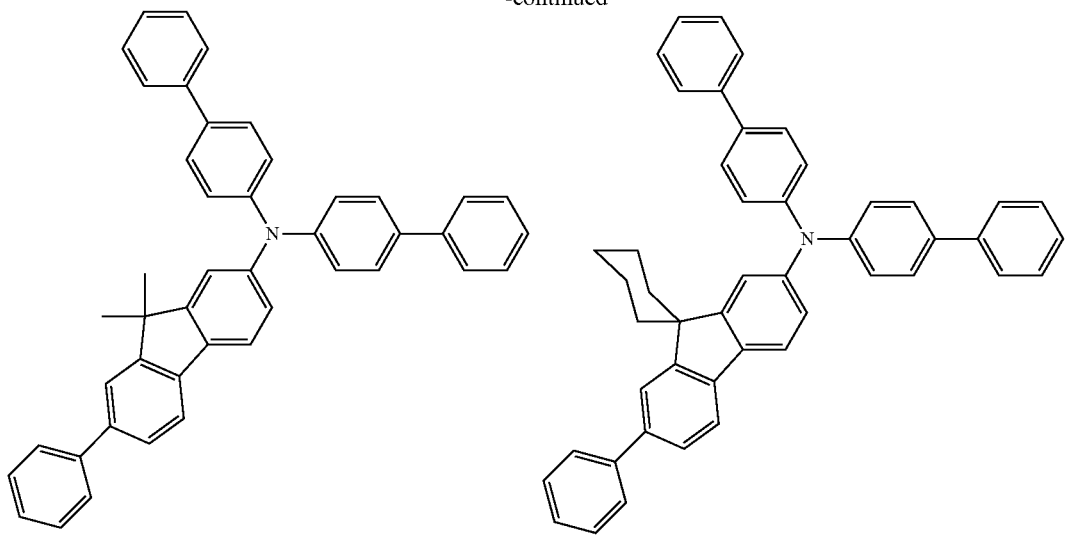
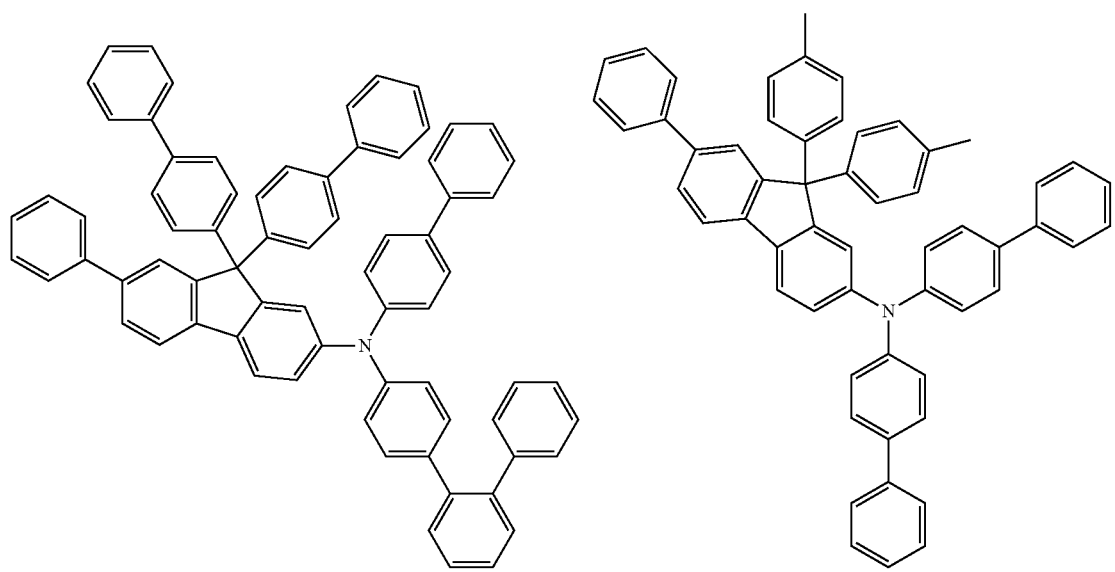
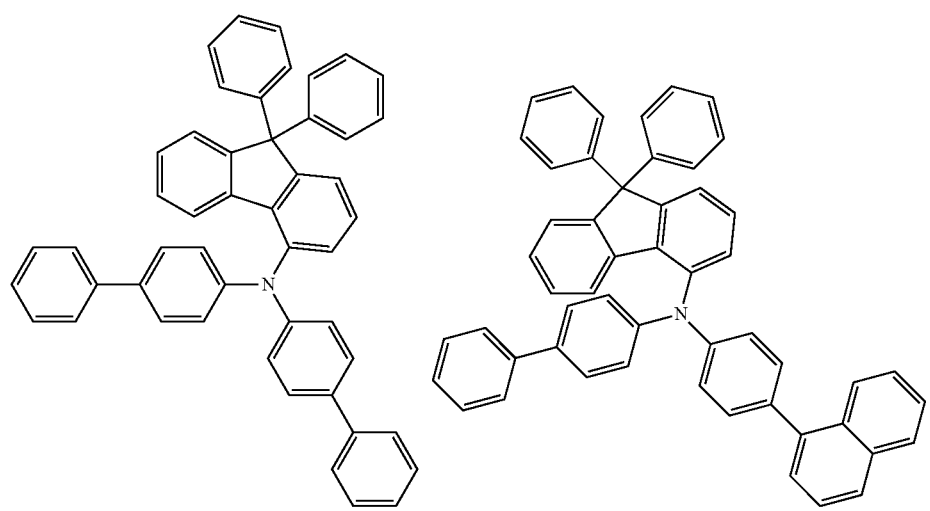

-continued
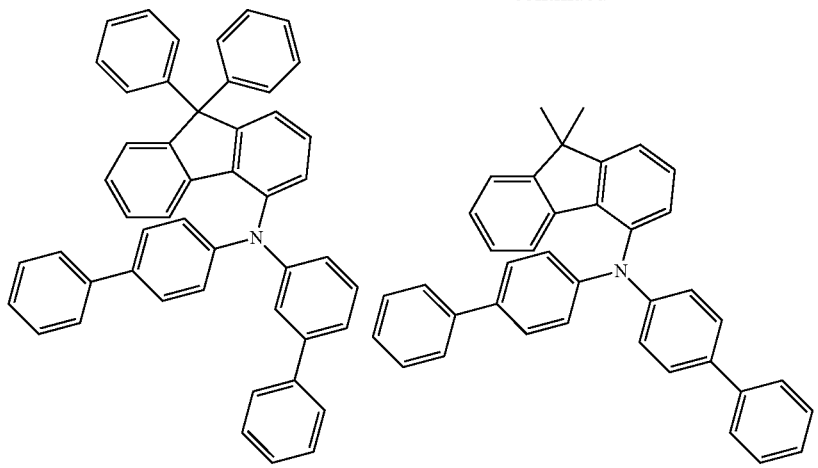
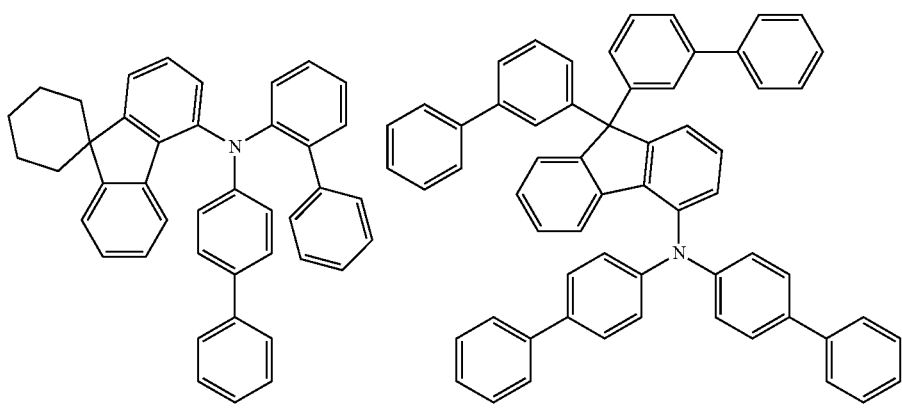
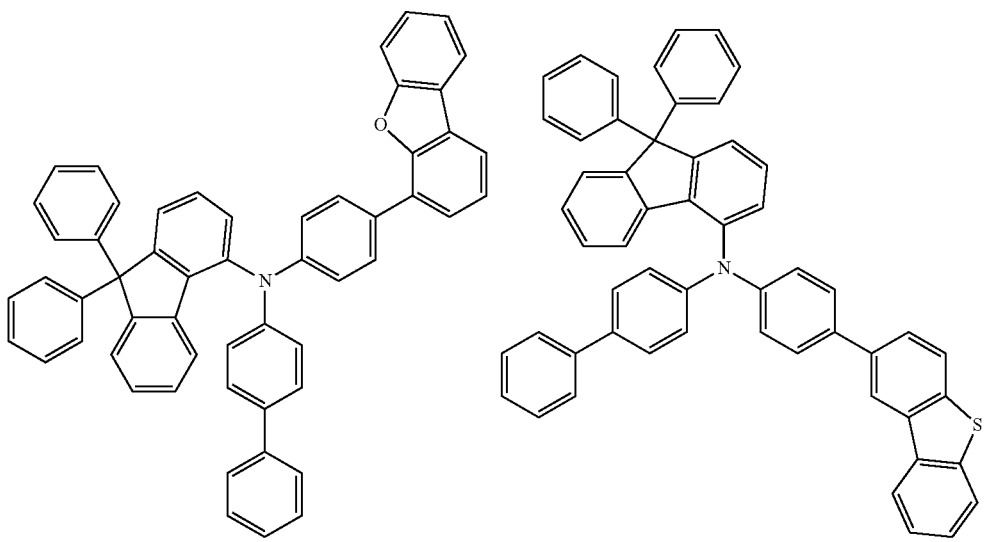

-continued
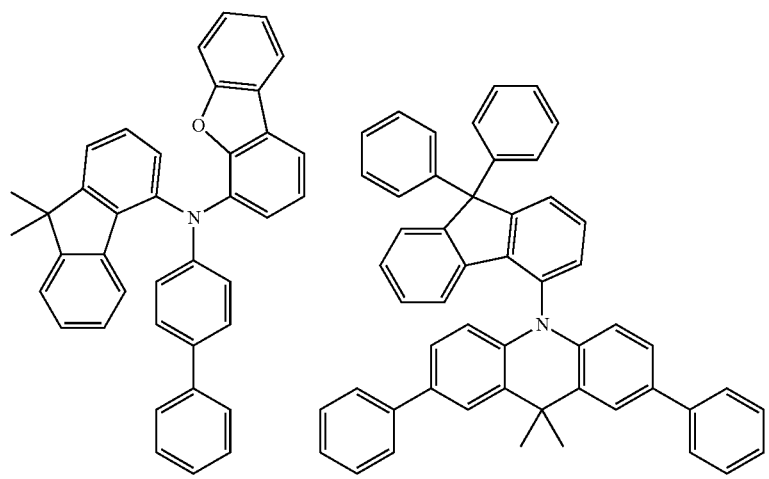
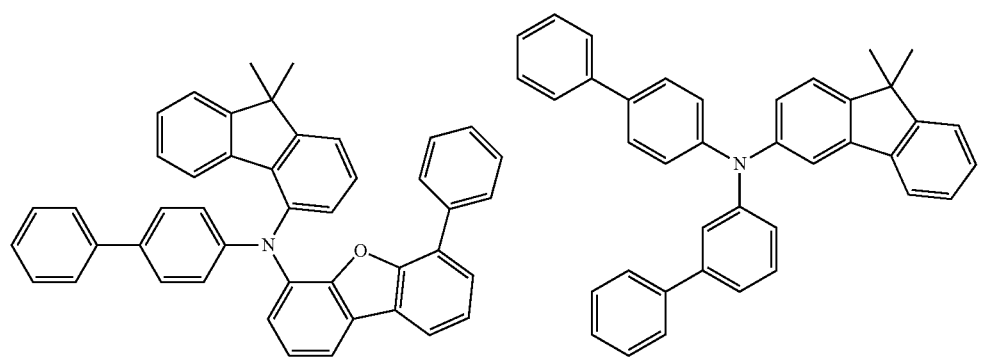
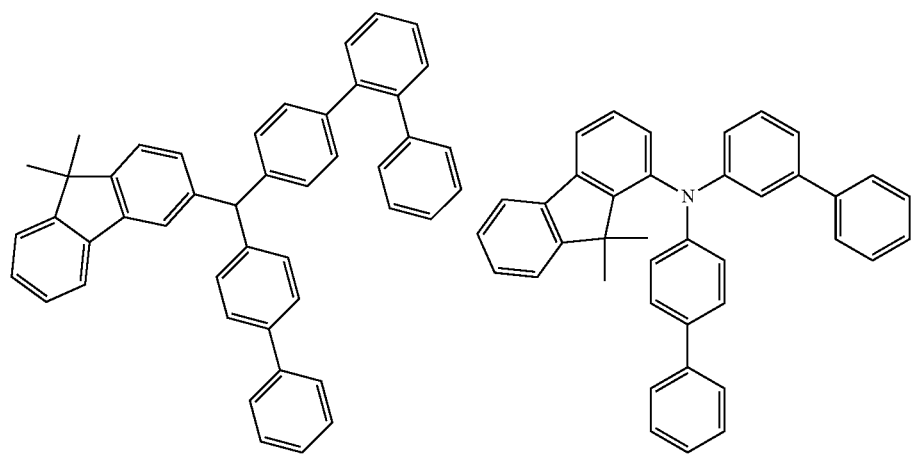

-continued
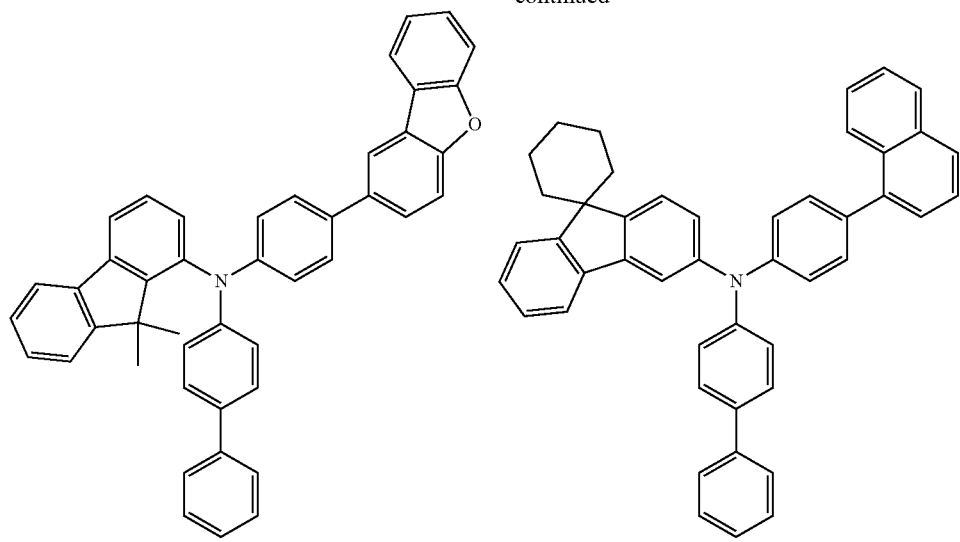
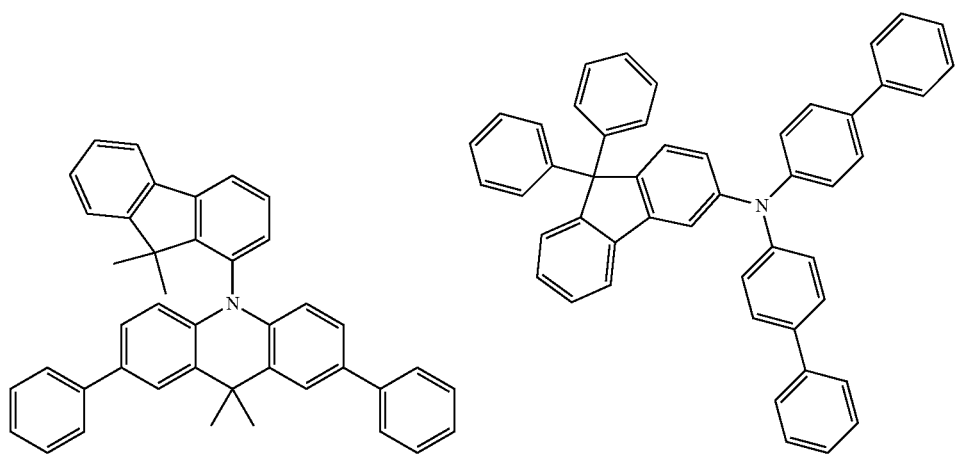
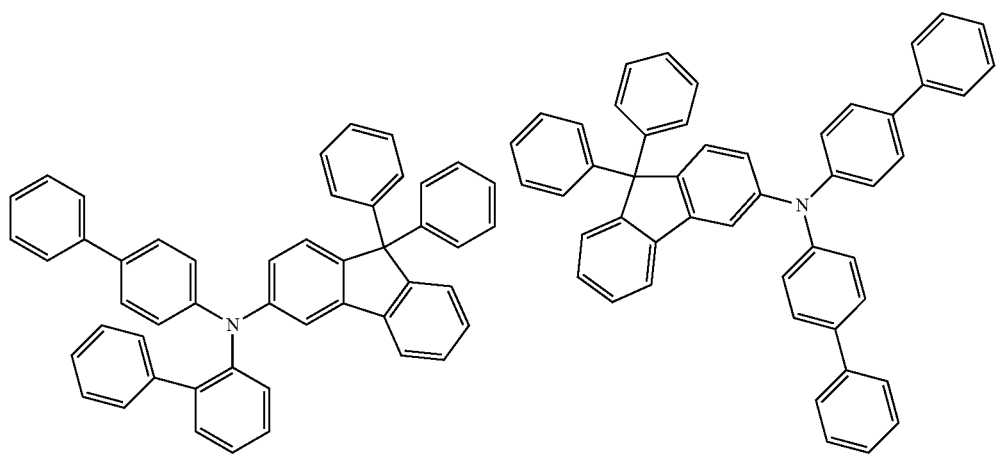

-continued
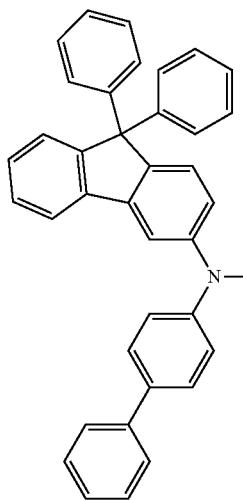
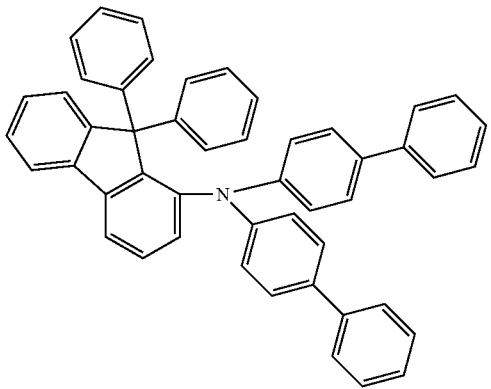
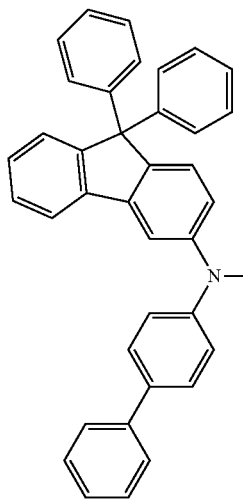
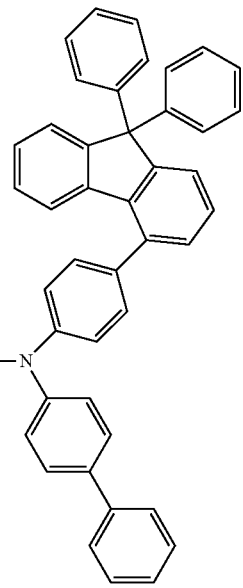
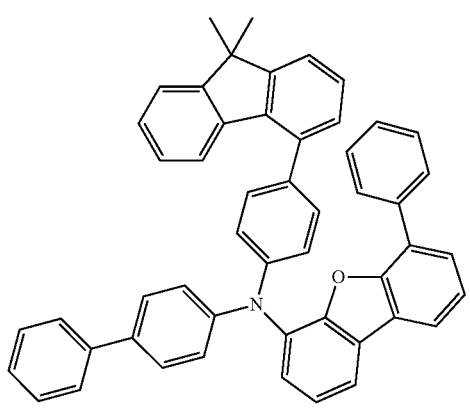
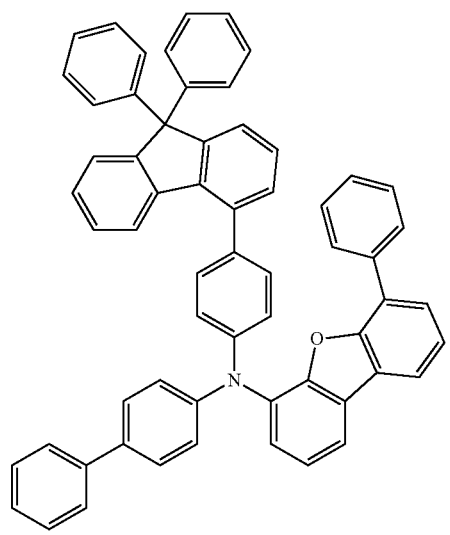

-continued
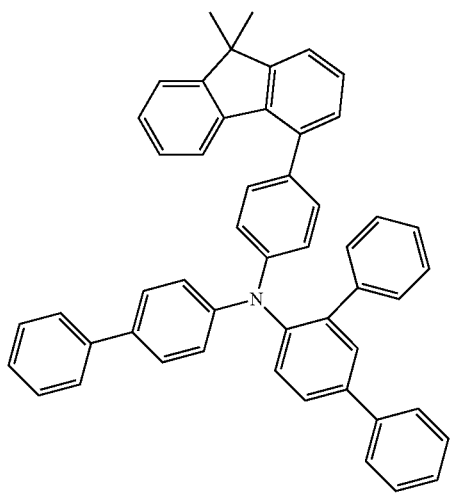
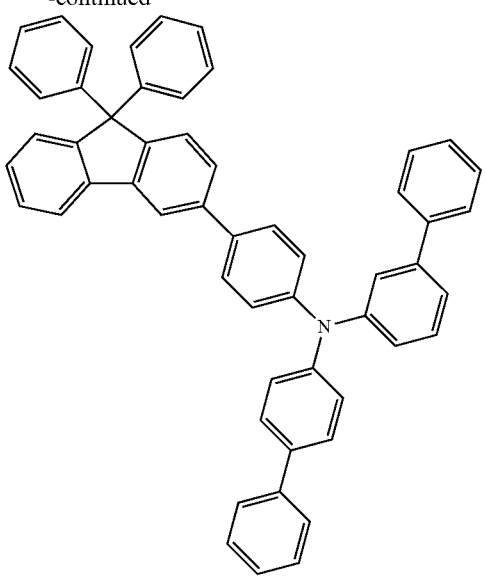
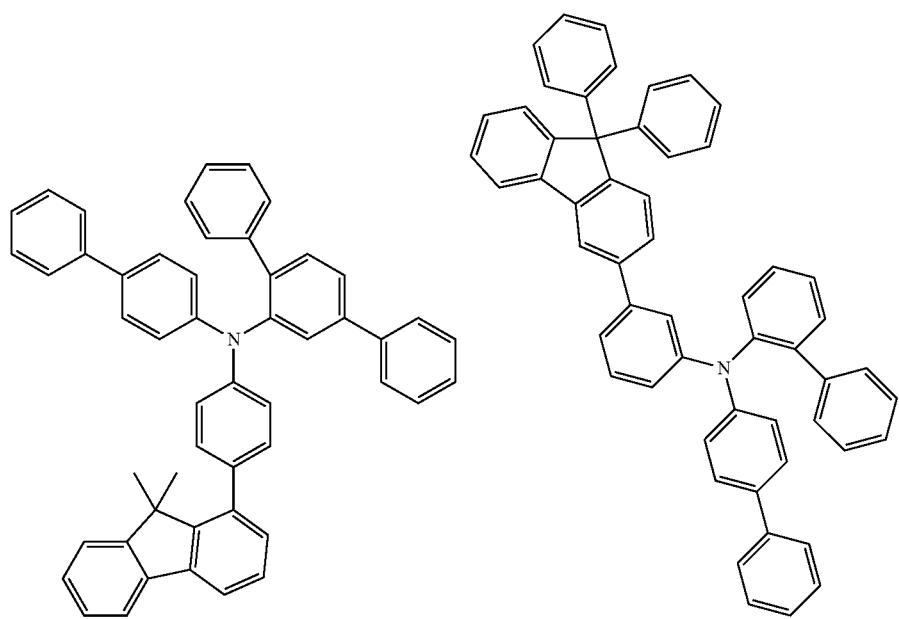

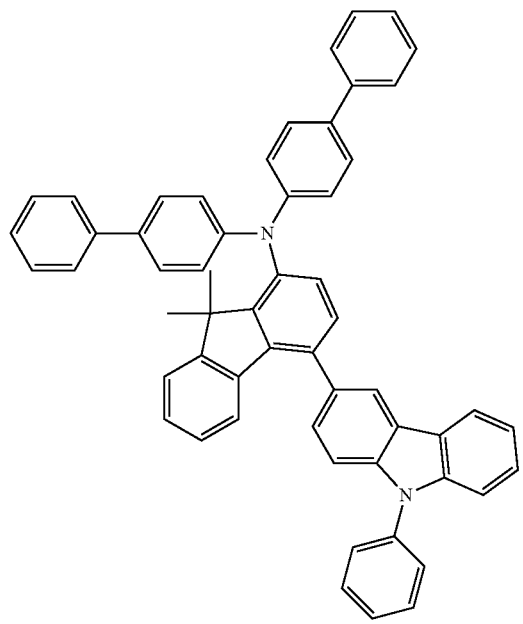
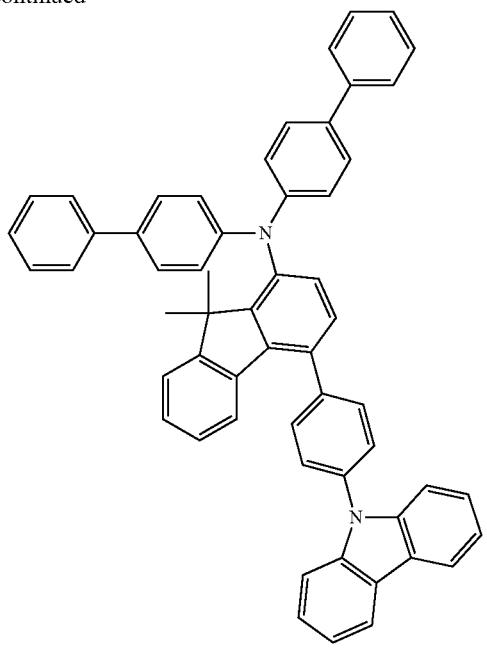
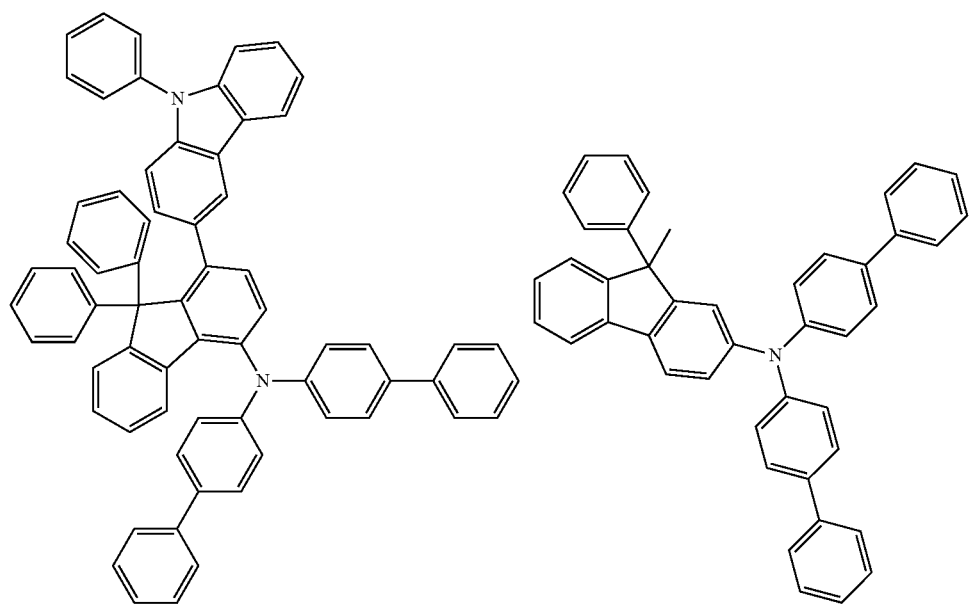

-continued
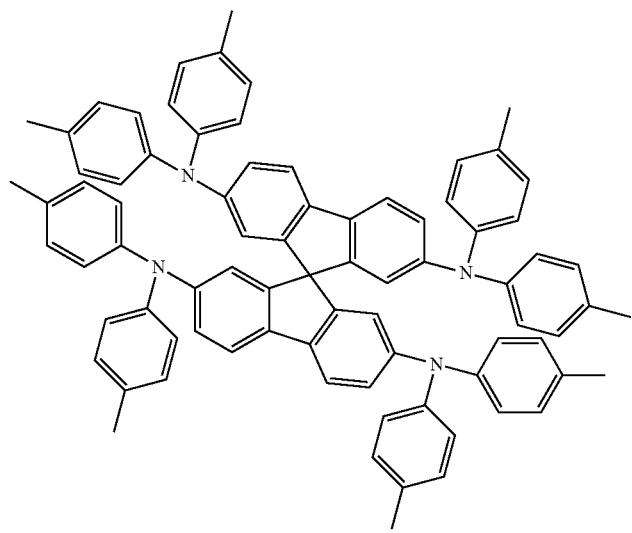
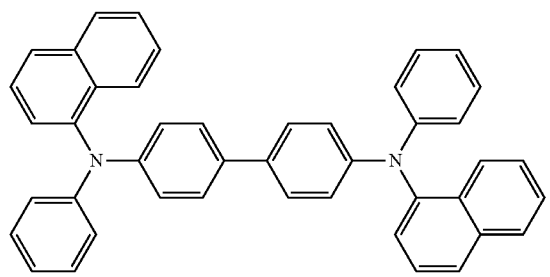
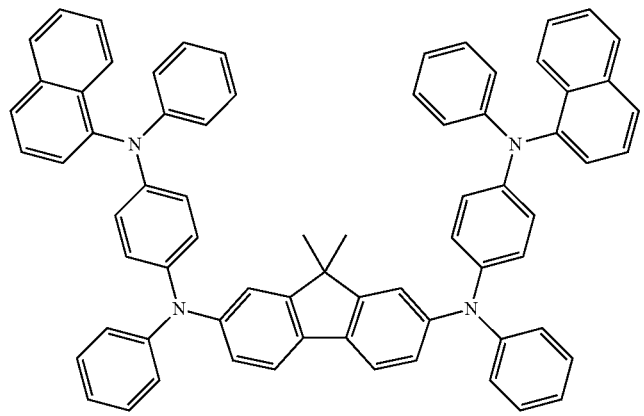
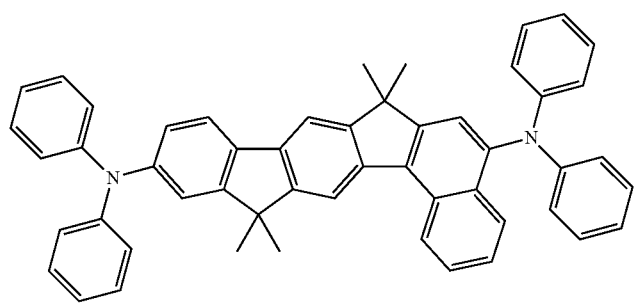

-continued
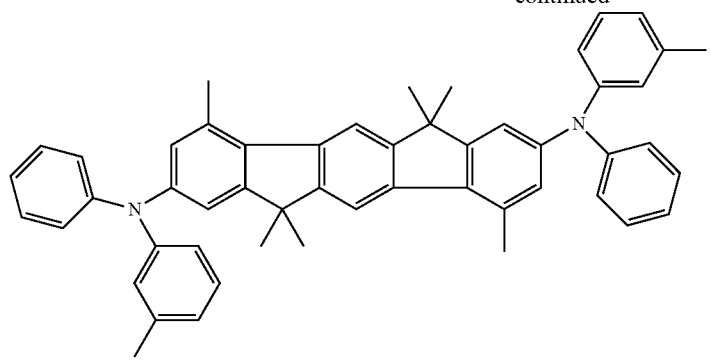
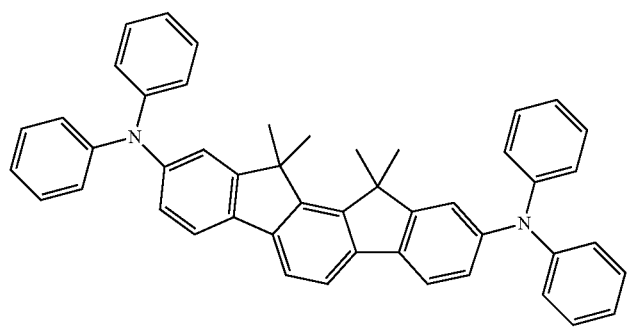
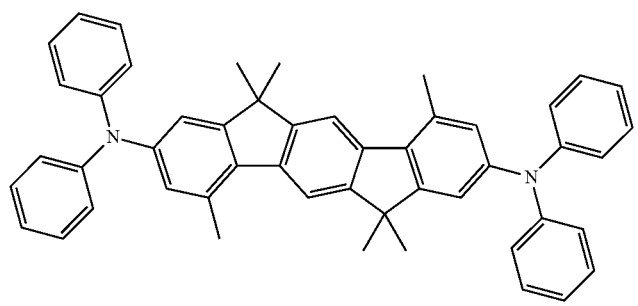
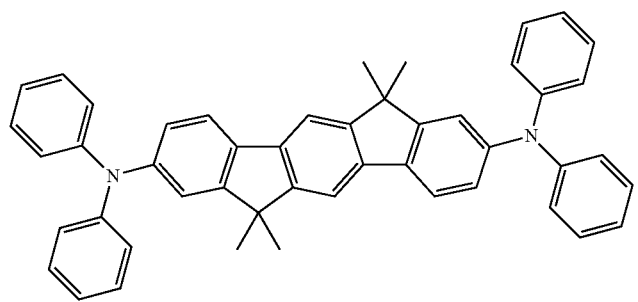

-continued
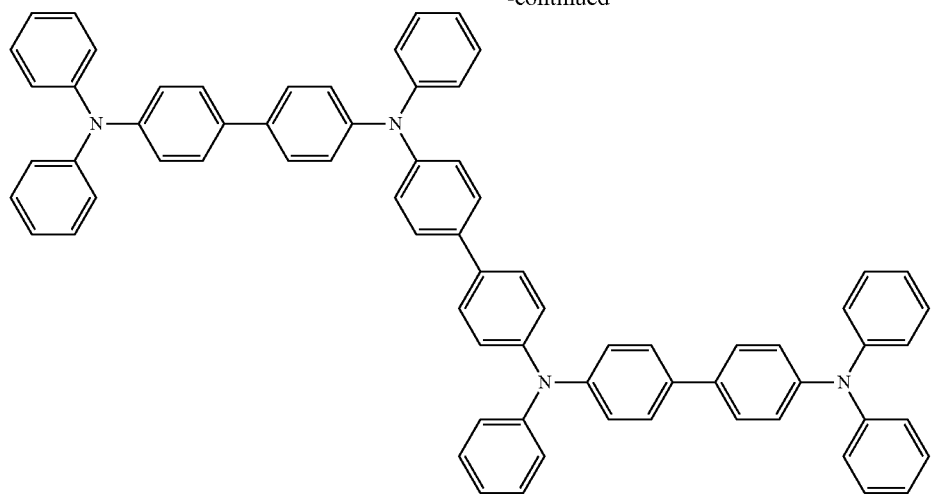
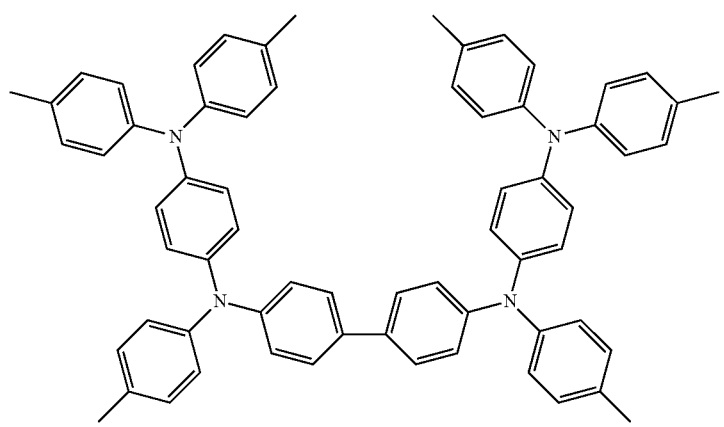
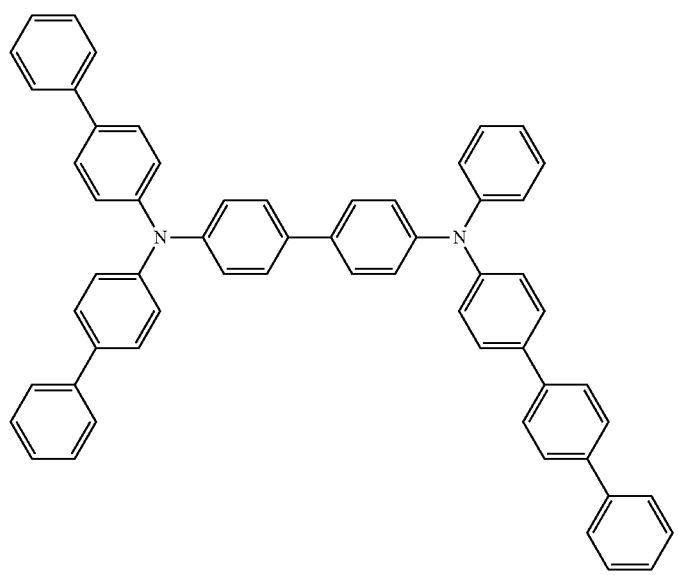

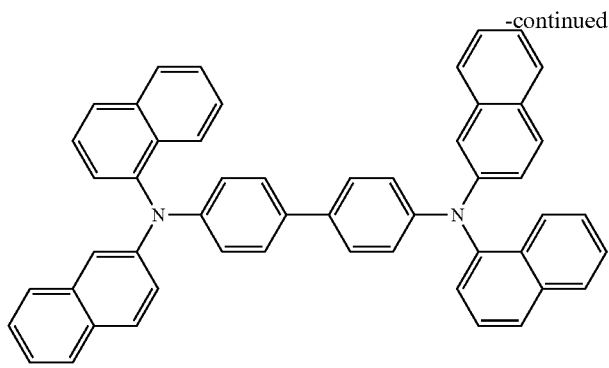
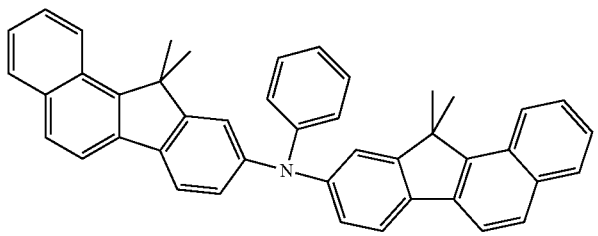
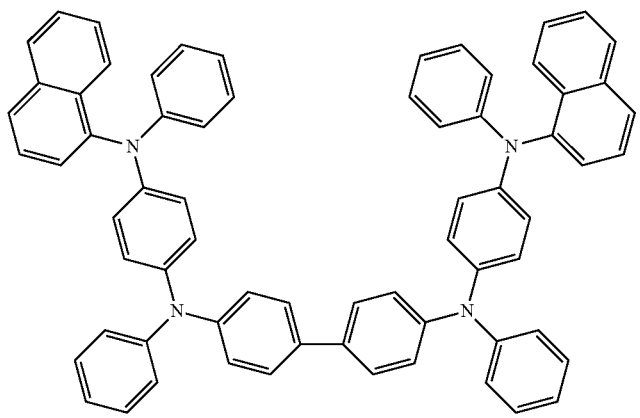
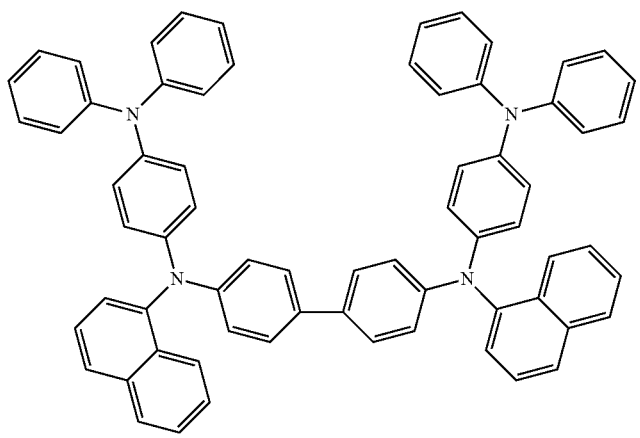

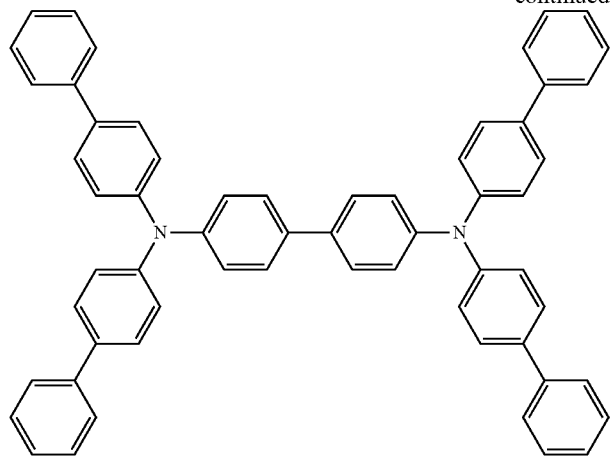
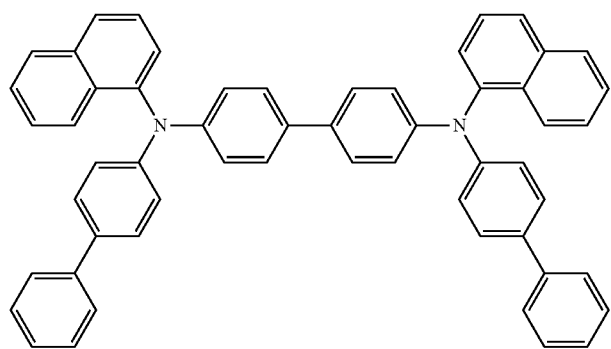
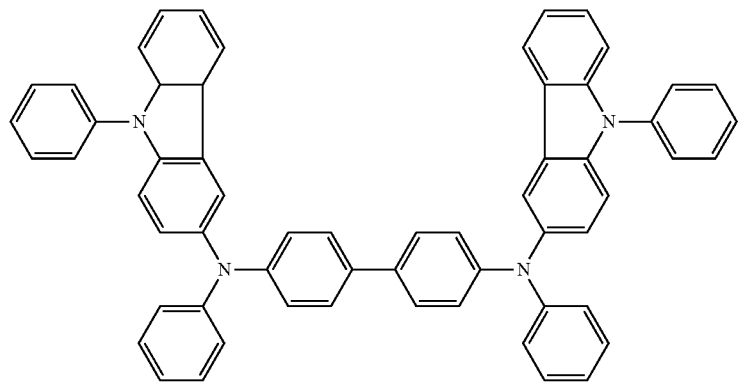
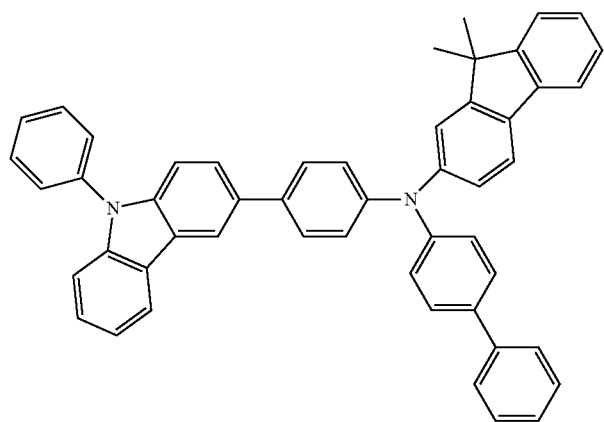

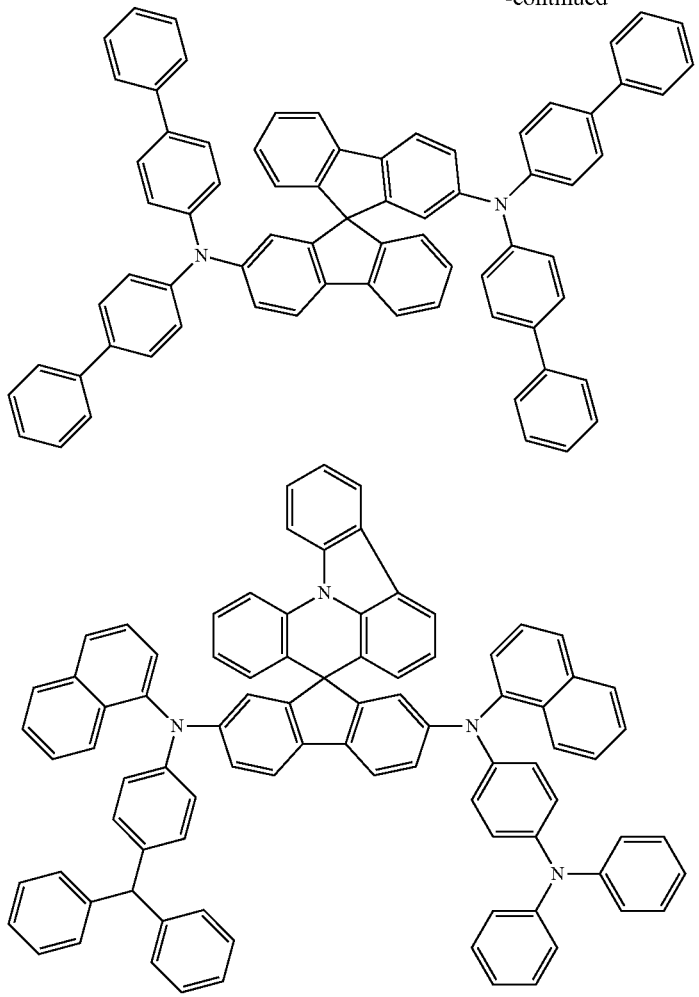

According to a preferred embodiment, one or more of the layers arranged between the emitting layer EML closest to the anode and the anode comprise a dopant which is an electron-acceptor compound. This dopant preferably has an LUMO energy level which is less than −4.6 eV, particularly preferably less than −4.8 eV and very particularly preferably less than −5.0 eV. The dopant most preferably has an LUMO energy level which is less than −5.1 eV.

Suitable for use as a dopant of this type are in principle all compounds which are electron-acceptor compounds and are able to increase the conductivity of the layer by oxidation of the matrix material. The person skilled in the art will be able to identify suitable compounds without major effort from his general expert knowledge.

Particularly suitable dopants are selected from quinodimethane compounds, azaindenofluorenediones, azaphenalenes, azatriphenylenes, $I_2$, metal halides, preferably transition-metal halides, metal oxides, preferably metal oxides containing at least one transition metal or a metal from the 3rd main group, and transition-metal complexes, preferably complexes of Cu, Co, Ni, Pd and Pt with ligands containing at least one oxygen atom as bonding site. Preference is furthermore given to transition-metal oxides as dopants, preferably oxides of rhenium, molybdenum and tungsten, particularly preferably $Re_2O_7$, $MoO_3$, $WO_3$ and $ReO_3$.

A dopant of this type is preferably present in the layer in a concentration of 0.1 to 20% by vol., preferably 0.5 to 12% by vol., particularly preferably 1 to 8% by vol. and very particularly preferably 2 to 6% by vol.

According to a further possible embodiment, the electron-acceptor compound described above as dopant is in the form of a pure material in a layer which is arranged between the anode and the emitting layer closest to the anode.

In electron-transport layers of the device according to the invention, use is preferably made of organic compounds having electron-transporting properties. Particular preference is given to electron-transporting organic compounds which have an LUMO energy level of at most −2.50 eV, particularly preferably at most −2.60 eV, very particularly preferably at most −2.65 eV, and most preferably at most −2.70 eV.

Materials which can be used for the electron-transport layer are all materials as are known in accordance with the prior art as electron-transport materials in the electron-transport layer. Particularly suitable are aluminium complexes, for example $Alq_3$, zirconium complexes, for example $Zrq_4$, lithium complexes, for example Liq, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Furthermore suitable materials are derivatives of the above-mentioned compounds, as disclosed in JP 2000/053957, WO 2003/060956, WO 2004/028217, WO 2004/080975 and WO 2010/072300.

The electron-transport layer material used is preferably an organic compound, i.e. a carbon-containing compound, which contains no metals. This is particularly preferred for use in the layer directly adjacent to the emitting layer on the anode side.

The electron-transport layer of the device according to the invention may comprise a mixture of two or more materials, preferably a mixture of two materials. Preference is given here to the materials indicated above. Particular preference is given to a mixture of an electron-transporting organic compound, for example a triazine compound, and a metal complex, for example lithium quinolinate (Liq).

It is preferred for the energy of the $T_1$ state of the electron-transport layer which is directly adjacent to the emitting layer comprising compound E, denoted by $T_1$(ETL), to be at most 0.1 eV lower than the energy of the $T_1$ state of compound E, denoted by $T_1$(E). Particularly preferably, $T_1$(ETL)≥$T_1$(E). The following particularly preferably applies: $T_1$(ETL)−$T_1$(E)≥0.1 eV, very particularly preferably $T_1$(ETL)−$T_1$(E)≥0.2 eV. If the electron-transport layer comprises more than one compound, the condition for the triplet energy preferably applies to each of the compounds.

The cathode of the device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.). Likewise suitable are alkali-metal or alkaline-earth metal complexes, such as, for example, lithium quinolinate (LiQ)). The layer thickness of this layer is preferably between 0.5 and 5 nm.

The anode of the device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. At least one of the electrodes here must be transparent or partially transparent in order to facilitate the coupling-out of light. Preferred transparent or partially transparent anode materials are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally sealed in order to exclude damaging effects of water and/or air.

Processes for the production of the device according to the invention, in particular for the application of the layers, are known to the person skilled in the art.

The device according to the invention is preferably characterised in that one or more layers are coated by means of a sublimation process, in which the materials are applied by vapour deposition in vacuum sublimation units at an initial pressure of less than $10^{-5}$ mbar, preferably less than $10^{-6}$ mbar. However, it is also possible for the initial pressure to be even lower, for example less than $10^{-7}$ mbar.

According to an alternative production process, the device according to the invention is characterised in that one or more layers are coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and are thus structured (for example M. S. Arnold et al., Appl. Phys. Lett. 2008, 92, 053301).

According to an alternative production process, the device according to the invention is characterised in that one or more layers are produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing.

The invention therefore furthermore relates to a process for the production of the device according to the invention, characterised in that at least one layer is applied by means of a sublimation process, or in that at least one layer is applied by means of an OVPD (organic vapour phase deposition) process, or in that at least one layer is applied with the aid of carrier-gas sublimation, or in that at least one layer is applied from solution.

WORKING EXAMPLES

1) Determination of the HOMO, LUMO, $S_1$ and $T_1$ Energies of Compounds

The HOMO and LUMO energy levels and the energy of the lowest triplet state $T_1$ or lowest excited singlet state $S_1$ of compounds are determined via quantum-chemical calculations. To this end, the "Gaussian09W" software package (Gaussian Inc.) is used. In order to calculate organic substances without metals, firstly a geometry optimisation is carried out using the "Ground State/Semi-empirical/Default Spin/AM1/Charge 0/Spin Singlet" method. This is followed by an energy calculation on the basis of the optimised geometry. The "TD-SFC/DFT/Default Spin/B3PW91" method with the "6-31G(d)" base set is used here (Charge 0, Spin Singlet). For metal-containing compounds (denoted by "organom." method in Table 4), the geometry is optimised via the "Ground State/Hartree-Fock/Default Spin/LanL2 MB/Charge 0/Spin Singlet" method. The energy calculation is carried out analogously to the organic substances as described above, with the difference that the "LanL2DZ" base set is used for the metal atom and the "6-31G(d)" base set is used for the ligands. The energy calculation gives the HOMO energy level HEh or LUMO energy level LEh in hartree units. The HOMO and LUMO energy levels calibrated with reference to cyclic voltammetry measurements are determined therefrom in electron volts as follows:

HOMO(eV)=((HEh*27.212)−0.9899)/1.1206

LUMO(eV)=((LEh*27.212)−2.0041)/1.385

These values are to be regarded in the sense of this application as HOMO and LUMO energy levels of the compounds.

The energy of the $T_1$ state is defined as the energy of the triplet state having the lowest energy which arises from the quantum-chemical calculation described above.

The energy of the $S_1$ state is defined as the energy of the lowest excited singlet state which arises from the quantum-chemical calculation described above.

Table 1 below shows the HOMO and LUMO energy levels and the calculated energies of the $S_1$ and $T_1$ states for various compounds (structures cf. Table 4).

TABLE 1

HOMO, LUMO, $T_1$ and $S_1$ energies of the compounds

| Material | HOMO (eV) | LUMO (eV) | $S_1$ (eV) | $T_1$ (eV) |
|---|---|---|---|---|
| D1 | −6.11 | −3.40 | 2.50 | 2.41 |
| CBP | −5.67 | −2.38 | 3.59 | 3.11 |
| BCP | −6.15 | −2.44 | 3.61 | 2.70 |
| IC1 | −5.79 | −2.83 | 3.09 | 2.69 |
| IC5 | −5.56 | −2.87 | 2.87 | 2.72 |
| IC3 | −5.62 | −2.75 | 3.02 | 2.75 |
| SpA1 | −4.87 | −2.14 | 2.94 | 2.34 |
| SpMA1 | −5.25 | −2.18 | 3.34 | 2.58 |
| SpMA2 | −5.35 | −2.34 | 3.14 | 2.62 |
| IC2 | −5.40 | −2.11 | 3.24 | 2.80 |
| NPB | −5.22 | −2.28 | 3.19 | 2.45 |
| IC4 | −5.74 | −2.23 | 3.59 | 2.72 |
| HAT | −8.86 | −4.93 | not reported | not reported |
| F4T | −7.91 | −5.21 | not reported | not reported |
| ST2 | −6.03 | −2.82 | 3.32 | 2.68 |

2) Determination of the Luminescence Quantum Efficiency (PLQE)

A 50 nm thick film of the emission layers used in the various OLEDs is applied to a suitable transparent substrate, preferably quartz, i.e. the layer comprises the same materials in the same concentration as the OLED. The same production conditions are used here as in the production of the emission layer for the OLEDs. An absorption spectrum of this film is measured in the wavelength range from 350-500 nm. To this end, the reflection spectrum $R(\lambda)$ and the transmission spectrum $T(\lambda)$ of the sample are determined at an angle of incidence of 6° (i.e. virtually perpendicular incidence). The absorption spectrum in the sense of this application is defined as $A(\lambda)=1-R(\lambda)-T(\lambda)$.

If $A(\lambda) \leq 0.3$ in the range 350-500 nm, the wavelength belonging to the maximum of the absorption spectrum in the range 350-500 nm is defined as $\lambda_{exc}$. If $A(\lambda)>0.3$ for any wavelength, the greatest wavelength at which $A(\lambda)$ changes from a value less than 0.3 to a value greater than 0.3 or from a value greater than 0.3 to a value less than 0.3 is defined as $\lambda_{exc}$.

The PLQE is determined using a Hamamatsu C9920-02 measurement system. The principle is based on excitation of the sample by light of defined wavelength and measurement of the absorbed and emitted radiation. The sample is located in an Ulbricht sphere ("integrating sphere") during measurement. The spectrum of the excitation light is approximately Gaussian with a full width at half maximum of <10 nm and a peak wavelength $\lambda_{exc}$ as defined above. The PLQE is determined by the evaluation method which is usual for the said measurement system. It is vital to ensure that the sample does not come into contact with oxygen at any time, since the PLQE of materials having a small energetic separation between $S_1$ and $T_1$ is reduced very considerably by oxygen (H. Uoyama et al., Nature 2012, Vol. 492, 234).

Table 3 shows the PLQE determined as indicated above for the emission layers of various OLEDs together with the excitation wavelength $\lambda_{exc}$ used.

3) Determination of the Decay Time

The decay time is determined using a sample produced as described above under "Determination of the luminescence quantum efficiency (PLQE)". The sample is excited at a temperature of 295 K by a laser pulse (wavelength 266 nm, pulse duration 1.5 ns, pulse energy 200 µJ, ray diameter 4 mm). The sample is located in a vacuum (<$10^{-5}$ mbar) here. After the excitation (defined as t=0), the change in the intensity of the emitted photoluminescence over time is measured. The photoluminescence exhibits a steep drop at the beginning, which is attributable to the prompt fluorescence of the TADF compound. As time continues, a slower drop is observed, the delayed fluorescence (see, for example, H. Uoyama et al., Nature, vol. 492, no. 7428, pp. 234-238, 2012 and K. Masui et al., Organic Electronics, vol. 14, no. 11, pp. 2721-2726, 2013). The decay time to in the sense of this application is the decay time of the delayed fluorescence and is determined as follows: a time $t_d$ is selected at which the prompt fluorescence has decayed significantly below the intensity of the delayed fluorescence (<1%), so that the following determination of the decay time is not influenced thereby. This choice can be made by a person skilled in the art. For the measurement data from time $t_d$, the decay time $t_a = t_e - t_d$ is determined. $t_e$ here is the time after $t=t_d$ at which the intensity has for the first time dropped to 1/e of its value at $t=t_d$.

Table 3 shows the values of $t_a$ and $t_d$ which are determined for the emission layers of the OLEDs measured.

4) Production of the OLEDs

The data of various OLEDs are presented in Examples V1 to V6 and E1 to E7 below (see Table 2 for structure of the OLEDs and Table 3 for measurement data obtained).

Glass plates coated with structured ITO (indium tin oxide) in a thickness of 50 nm form the substrates for the OLEDs. The substrates are wet-cleaned (dishwasher, Merck Extran detergent), subsequently dried by heating at 250° C. for 15 min and treated with an oxygen plasma for 130 s before the coating. These plasma-treated glass plates form the substrates to which the OLEDs are applied. The substrates remain in vacuo before the coating. The coating begins at the latest 10 min after the plasma treatment.

The OLEDs have the following layer structure: substrate/ optional hole-transport layers 1-4 (HTL1-4)/emission layer (EML)/optional hole-blocking layer (HBL)/electron-transport layer (ETL)/optional electron-injection layer (EIL) and finally a cathode. The cathode is formed by an aluminium layer with a thickness of 100 nm. The precise structure of the OLEDs is shown in Table 2. The materials required for the production of the OLEDs are shown in Table 4.

All materials are applied by thermal vapour deposition in a vacuum chamber. The emission layer here always consists of a matrix material and the emitting material which has a small difference between the energies of the $S_1$ and $T_1$ states. This is admixed with the matrix material in a certain proportion by volume by co-evaporation. An expression such as IC1:D1 (95%:5%) here means that material IC1 is present in the layer in a proportion by volume of 95% and D1 is present in the layer in a proportion of 5%. Analogously, other layers, for example the hole-transport layer, may also consist of a mixture of a plurality of materials.

The OLEDs are characterised by standard methods. For this purpose, the electroluminescence spectra, the current efficiency (measured in cd/A), the power efficiency (measured in lm/W) and the external quantum efficiency (EQE, measured in percent) as a function of the luminous density, calculated from current/voltage/luminous density characteristic lines (IUL characteristic lines) assuming Lambert emission characteristics, and the lifetime are determined. The electroluminescence spectra are determined at a luminous density of 1000 cd/m$^2$, and the CIE 1931 x and y colour coordinates are calculated therefrom. The term U1000 in Table 3 denotes the voltage required for a luminous density of 1000 cd/m$^2$. CE1000 and PE1000 denote the current and power efficiency respectively which are achieved at 1000 cd/m$^2$. Finally, EQE1000 denotes the external quantum efficiency at an operating luminous density of 1000 cd/m$^2$. The lifetime LT is defined as the time after which the luminous density drops from the initial luminous density to a certain proportion L1 on operation at constant current. An expression of j0=10 mA/cm$^2$, L1=80% in Table 3 means that the luminous density drops to 80% of its initial value after time LT on operation at 10 mA/cm$^2$.

The data of the various OLEDs are summarised in Table 3. Examples V1-V6 are comparative examples in accordance with the prior art, Examples E1-E7 show data of OLEDs according to the invention.

Table 5 shows the HOMO and LUMO energy differences between adjacent hole-transport layers or the hole-transport layer adjacent to the emission layer and the emission layer. An expression such as HTL1–HTL2 here means that this is the energy difference D between layers HTL1 and HTL2 where D=E(HTL1)−E(HTL2). If HOMO(HTL1) is less than or equal to −6.7 eV, E(HTL1)=LUMO(HTL1), otherwise E(HTL1)=HOMO(HTL1). If HOMO(HTL2) is less than or equal to −6.7 eV, E(HTL2)=LUMO(HTL2), otherwise E(HTL2)=HOMO(HTL2). The HOMO and LUMO energy levels here are always defined as negative numbers. An analogous definition applies to the energy difference between the other layers. The Max value denotes the maximum energy difference occurring between the various layers.

It can be seen from the table that OLEDs V1 to V6 all have a high Max value, i.e. a large energy difference (0.45 eV or more) between adjacent hole-transport layers or the hole-transport layer adjacent to the emission layer and the emission layer. OLEDs E1 to E7, by contrast, have a small energy difference (0.39 eV or less) between adjacent hole-transport layers or the hole-transport layer adjacent to the emission layer and the emission layer.

The emitting dopant employed in the emission layer is compound D1, which has a difference between the $S_1$ and $T_1$ energy of 0.09 eV.

Some of the examples are explained in greater detail below in order to illustrate the advantages of the OLEDs according to the invention. However, it should be pointed out that this only represents a selection of the data shown in Table 3.

Example E3 shows that an approximately 30% better external quantum efficiency and approximately 60% better power efficiency are achieved with a maximum energy difference of 0.37 eV between the hole-transport layers and the emitting layer (Max value) than if the maximum energy difference is 0.75 eV (Max value), as in Comparative Example V4.

The comparison between OLEDs E5 and V1, which only differ in relation to their hole-transport layers, shows a surprising improvement in the lifetime by about 30% through reduction of the maximum energy difference (Max value) from 0.45 eV (prior art, V1) to 0.32 eV (according to the invention, E5).

The effect of the improvement in the performance data can be achieved with a very wide variety of materials for the hole-transport layers and a very wide variety of materials in the emitting layer, as shown by Examples E1 to E7.

TABLE 2

Structure of the OLEDs

| Ex. | HTL1 Thickness | HTL2 Thickness | HTL3 Thickness | HTL4 Thickness | EML Thickness | HBL Thickness | ETL Thickness | EIL Thickness |
|---|---|---|---|---|---|---|---|---|
| V1 | — | — | — | NPB 90 nm | CBP:D1 (95%:5%) 15 nm | — | ST2 50 nm | LiQ 3 nm |
| V2 | — | — | SpMA1:F4T (95%:5%) 10 nm | SpMA1 80 nm | IC1:D1 (95%:5%) 15 nm | IC1 10 nm | ST2 40 nm | LiQ 3 nm |
| V3 | — | — | SpMA1:F4T (95%:5%) 10 nm | SpMA1 80 nm | BCP:D1 (95%:5%) 15 nm | IC1 10 nm | ST2 40 nm | LiQ 3 nm |
| V4 | — | — | HAT 5 nm | SpA1 85 nm | IC3:D1 (95%:5%) 15 nm | IC1 10 nm | ST2:LiQ (50%:50%) 40 nm | — |
| V5 | — | — | — | SpA1 90 nm | IC4:D1 (95%:5%) 15 nm | IC1 10 nm | ST2:LiQ (50%:50%) 40 nm | — |
| V6 | — | SpMA1:F4T (95%:5%) 10 nm | SpMA1 75 nm | IC1 5 nm | BCP:D1 (95%:5%) 15 nm | IC1 10 nm | ST2 40 nm | LiQ 3 nm |
| E1 | SpMA1:F4T (95%:5%) 10 nm | SpMA1 65 nm | SpMA2 10 nm | IC2 5 nm | IC1:D1 (95%:5%) 15 nm | IC1 10 nm | ST2 40 nm | LiQ 3 nm |

TABLE 2-continued

Structure of the OLEDs

| Ex. | HTL1 Thickness | HTL2 Thickness | HTL3 Thickness | HTL4 Thickness | EML Thickness | HBL Thickness | ETL Thickness | EIL Thickness |
|---|---|---|---|---|---|---|---|---|
| E2 | SpMA1:F4T (95%:5%) 10 nm | SpMA1 65 nm | IC2 10 nm | CBP 5 nm | IC1:D1 (95%:5%) 15 nm | IC1 10 nm | ST2 40 nm | LiQ 3 nm |
| E3 | HAT 5 nm | SpA1 70 nm | HAT 5 nm | SpMA1 10 nm | IC3:D1 (95%:5%) 15 nm | IC1 10 nm | ST2:LiQ (50%:50%) 40 nm | — |
| E4 | — | SpMA1:F4T (95%:5%) 10 nm | SpMA1 70 nm | IC2 10 nm | CBP:D1 (95%:5%) 15 nm | IC1 10 nm | ST2:LiQ (50%:50%) 40 nm | — |
| E5 | — | — | NPB 80 nm | SpMA2 10 nm | CBP:D1 (95%:5%) 15 nm | — | ST2 50 nm | LiQ 3 nm |
| E6 | — | HAT 5 nm | SpMA1 75 nm | IC2 10 nm | IC4:D1 (95%:5%) 15 nm | IC1 10 nm | ST2:LiQ (50%:50%) 40 nm | — |
| E7 | SpMA2:F4T (95%:5%) 10 nm | SpMA2 70 nm | CBP 5 nm | IC1 5 nm | BCP:D1 (95%:5%) 15 nm | IC1 10 nm | ST2 40 nm | LiQ 3 nm |

TABLE 3

Data of the OLEDs

| Ex. | U1000 (V) | CE1000 (cd/A) | PE1000 (lm/W) | EQE1000 | CIE x/y at 1000 cd/m$^2$ |
|---|---|---|---|---|---|
| V1 | 4.3 | 36 | 27 | 11.3% | 0.28/0.59 |
| V2 | 3.2 | 64 | 62 | 20.1% | 0.26/0.58 |
| V3 | 6.7 | 4.3 | 2.0 | 1.4% | 0.26/0.54 |
| V4 | 4.0 | 42 | 33 | 12.5% | 0.32/0.60 |
| V5 | 5.7 | 21 | 12 | 6.5% | 0.29/0.59 |
| V6 | 6.6 | 5.3 | 2.5 | 1.7% | 0.26/0.56 |
| E1 | 3.3 | 67 | 63 | 21.1% | 0.26/0.58 |
| E2 | 3.2 | 68 | 66 | 21.3% | 0.26/0.58 |
| E3 | 3.2 | 52 | 52 | 15.7% | 0.31/0.60 |
| E4 | 4.1 | 49 | 38 | 15.4% | 0.27/0.58 |
| E5 | 4.0 | 44 | 35 | 13.7% | 0.27/0.59 |
| E6 | 4.1 | 49 | 38 | 14.5% | 0.28/0.60 |
| E7 | 5.5 | 8.3 | 4.8 | 2.6% | 0.26/0.57 |

| Ex. | j0 | LT L1 % | LT (h) | PLQE % | $\lambda_{exc}$ nm | $t_d$ μs | $t_a$ μs |
|---|---|---|---|---|---|---|---|
| V1 | 10 mA/cm$^2$ | 80 | 59 | 100 | 350 | 7 | 4.5 |
| V2 | 10 mA/cm$^2$ | 80 | 30 | 92 | 350 | 7 | 5.4 |
| V3 | 10 mA/cm$^2$ | 80 | 1 | 59 | 350 | 6 | 5.9 |
| V4 | 10 mA/cm$^2$ | 80 | 82 | 77 | 350 | 7 | 7.0 |
| V5 | 10 mA/cm$^2$ | 80 | 33 | 84 | 359 | 7 | 4.2 |
| V6 | 10 mA/cm$^2$ | 80 | 1 | 59 | 350 | 6 | 5.9 |
| E1 | 10 mA/cm$^2$ | 80 | 34 | 92 | 350 | 7 | 5.4 |
| E2 | 10 mA/cm$^2$ | 80 | 38 | 92 | 350 | 7 | 5.4 |
| E3 | 10 mA/cm$^2$ | 80 | 92 | 77 | 350 | 7 | 7.0 |
| E4 | 10 mA/cm$^2$ | 80 | 37 | 100 | 350 | 7 | 4.5 |
| E5 | 10 mA/cm$^2$ | 80 | 82 | 100 | 350 | 7 | 4.5 |
| E6 | 10 mA/cm$^2$ | 80 | 48 | 84 | 359 | 7 | 4.2 |
| E7 | 10 mA/cm$^2$ | 80 | 1 | 59 | 350 | 6 | 5.9 |

TABLE 4

Structural formulae of the materials

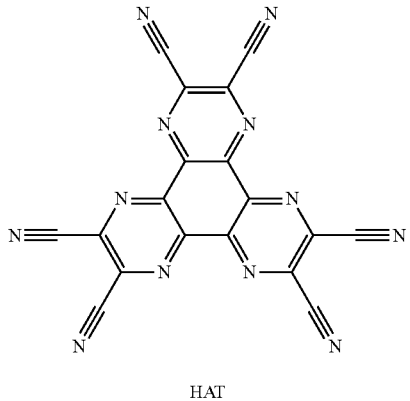

HAT

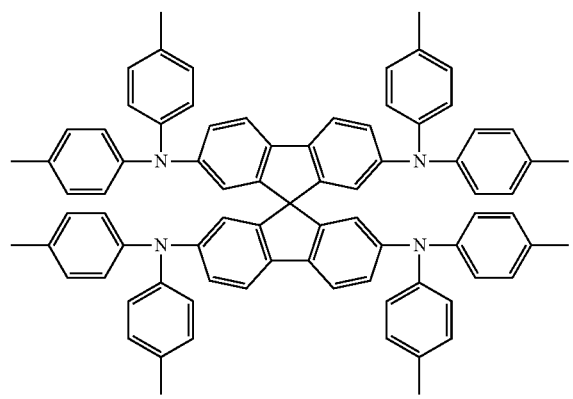

SpA1

TABLE 4-continued
Structural formulae of the materials
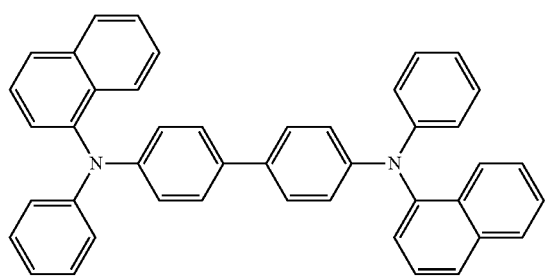 [SMILES: c1ccc(N(c2ccc(-c3ccc(N(c4ccccc4)c4cccc5ccccc45)cc3)cc2)c2cccc3ccccc23)cc1]
NPB
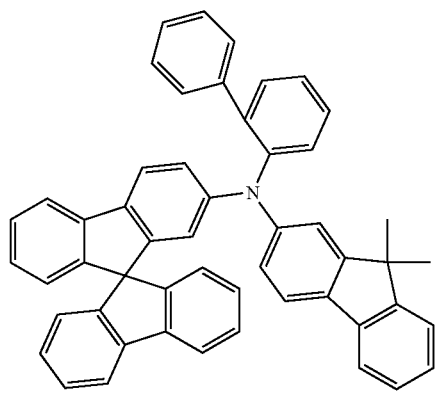 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
SpMA1
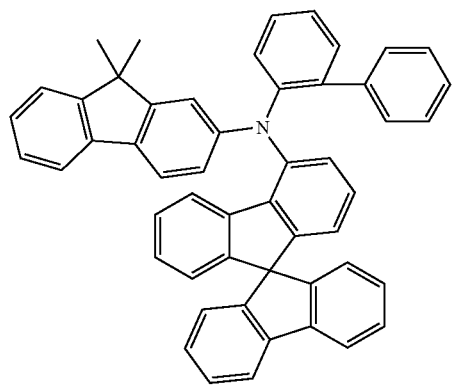 [SMILES: CC1(C)c2ccccc2-c2ccc(N(c3ccccc3-c3ccccc3)c3cccc4c3-c3ccccc3C43c4ccccc4-c4ccccc43)cc21]
SpMA2
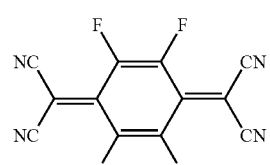
F4T
TABLE 4-continued
Structural formulae of the materials
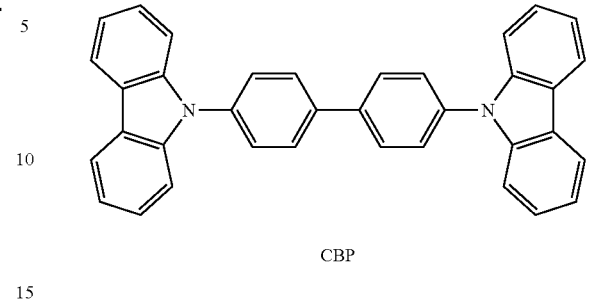
CBP
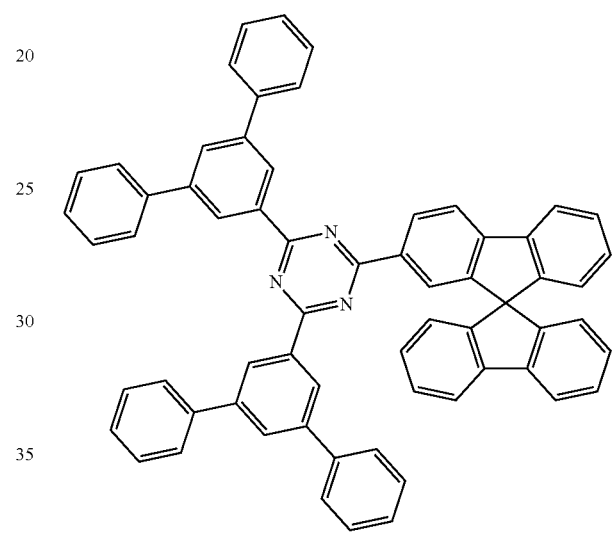
ST2
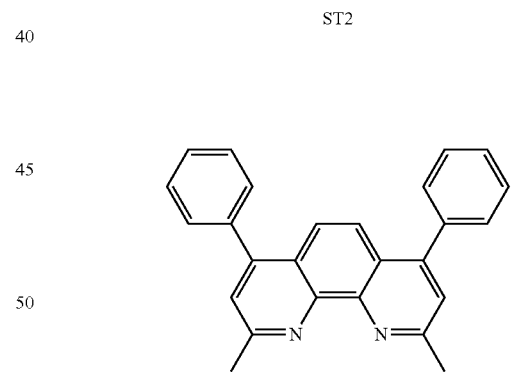
BCP
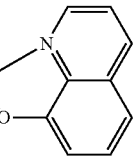
LiQ TABLE 4-continued
Structural formulae of the materials
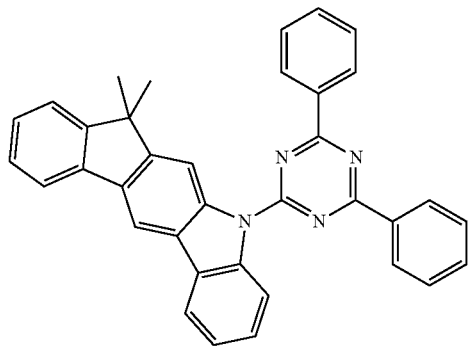 [SMILES: CC1(C)c2ccccc2-c2cc3c4ccccc4n(-c4nc(-c5ccccc5)nc(-c5ccccc5)n4)c3cc21]
IC1
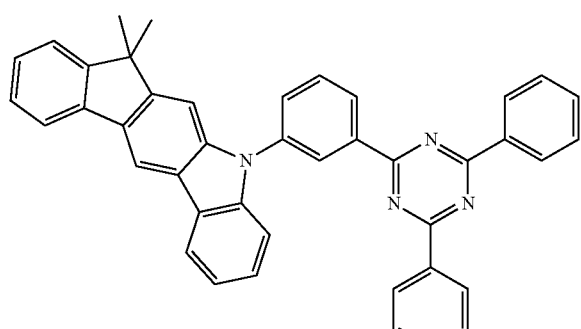
IC5
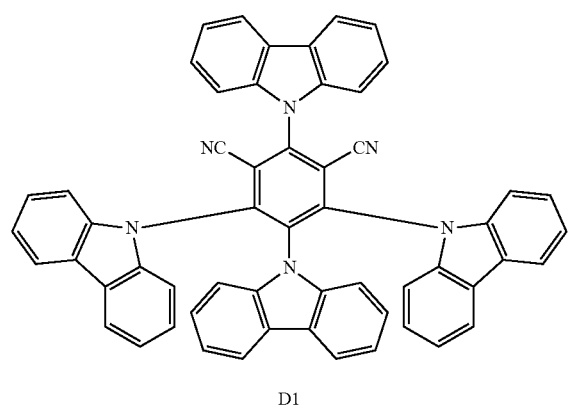
D1
TABLE 4-continued
Structural formulae of the materials
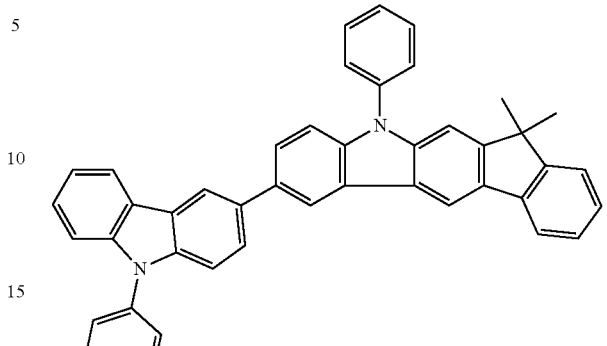
IC2
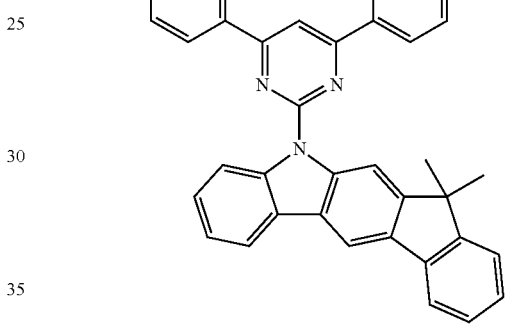
IC3
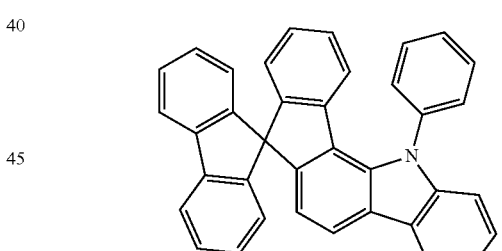
IC4
TABLE 5
Energy differences between the layers
| Ex. | HTL1-HTL2 (eV) | HTL2-HTL3 (eV) | HTL3-HTL4 (eV) | HTL4-EML (eV) | Max (eV) |
|---|---|---|---|---|---|
| V1 | — | — | — | 0.45 | 0.45 |
| V2 | — | — | 0 | 0.54 | 0.54 |
| V3 | — | — | 0 | 0.86 | 0.86 |
| V4 | — | — | −0.06 | 0.75 | 0.75 |
| V5 | — | — | — | 0.87 | 0.87 |
| V6 | — | 0 | 0.54 | 0.32 | 0.54 |
| E1 | 0 | 0.1 | 0.05 | 0.39 | 0.39 |
| E2 | 0 | 0.15 | 0.27 | 0.12 | 0.27 |
| E3 | −0.06 | 0.06 | 0.32 | 0.37 | 0.37 |

TABLE 5-continued

Energy differences between the layers

| Ex. | HTL1-HTL2 (eV) | HTL2-HTL3 (eV) | HTL3-HTL4 (eV) | HTL4-EML (eV) | Max (eV) |
|---|---|---|---|---|---|
| E4 | — | 0 | 0.15 | 0.27 | 0.27 |
| E5 | — | — | 0.13 | 0.32 | 0.32 |
| E6 | — | 0.32 | 0.15 | 0.34 | 0.34 |
| E7 | 0.1 | 0.32 | 0.12 | 0.32 | 0.32 |

The invention claimed is:

1. An organic electroluminescent device comprising
anode,
cathode,
at least one emitting layer which comprises a luminescent organic compound E which has a difference between the energies of its $S_1$ and $T_1$ states of not greater than 0.15 eV, and
2, 3, 4 or 5 layers H each having a thickness of greater than 2 nm which are arranged between one emitting layer of said at least one emitting layer, which is closest to said anode, and said anode,
where the following conditions apply to each layer H:
a difference D between the HOMO energy level of a layer H and the HOMO energy level of the closest layer having a thickness of greater than 2 nm on a cathode side of this layer H must be less than or equal to 0.4 eV, and
each of the layers H comprises at least one triarylamino compound which is a small organic molecule,
with the proviso that, for layers whose HOMO energy level has a value of less than −6.7 eV, the LUMO energy level for the said condition occurs instead of the HOMO energy level and wherein the emitting layer which comprises compound E additionally comprises one or more matrix materials, and in that compound E is an emitting compound and the energy of the $T_1$ state of the matrix material of the emitting layer is at most 0.1 eV lower than the energy of the $T_1$ state of compound E.

2. The organic electroluminescent device according to claim 1, wherein the following condition applies to each layer H:
the difference D between the HOMO energy level of a layer H and the HOMO energy level of the closest layer having a thickness of greater than 2 nm on the cathode side of this layer H must be less than or equal to 0.38 eV.

3. The organic electroluminescent device according to claim 1, wherein the following condition applies to each layer H:
the difference D between the HOMO energy level of a layer H and the HOMO energy level of the closest layer having a thickness of greater than 2 nm on the cathode side of this layer H must be less than or equal to 0.3 eV.

4. The organic electroluminescent device according to claim 1, wherein the device comprises precisely one emitting layer.

5. The organic electroluminescent device according to claim 1, wherein the layers of the device have a thickness of 4 to 120 nm.

6. The organic electroluminescent device according to claim 1, wherein the emitting layer which comprises the luminescent organic compound E is the emitting layer which is closest to the anode.

7. The organic electroluminescent device according to claim 1, wherein the luminescent compound E has a luminescence quantum efficiency of at least 40%.

8. The organic electroluminescent device according to claim 1, wherein the luminescent compound E has a luminescence quantum efficiency of at least 70%.

9. The organic electroluminescent device according to claim 1, wherein compound E has a difference between the energies of its $S_1$ and $T_1$ states of not greater than 0.10 eV.

10. The organic electroluminescent device according to claim 1, wherein compound E has a difference between the energies of its $S_1$ and $T_1$ states of not greater than 0.05 eV.

11. An organic electroluminescent device comprising
anode,
cathode,
at least one emitting layer which comprises a luminescent organic compound E which has a difference between the energies of its $S_1$ and $T_1$ states of not greater than 0.15 eV, and
2, 3, 4 or 5 layers H each having a thickness of greater than 2 nm which are arranged between one emitting layer of said at least one emitting layer, which is closest to said anode, and said anode,
where the following conditions apply to each layer H:
a difference D between the HOMO energy level of a layer H and the HOMO energy level of the closest layer having a thickness of greater than 2 nm on a cathode side of this layer H must be less than or equal to 0.4 eV, and
each of the layers H comprises at least one triarylamino compound which is a small organic molecule,
with the proviso that, for layers whose HOMO energy level has a value of less than −6.7 eV, the LUMO energy level for the said condition occurs instead of the HOMO energy level and wherein the energy of the $T_1$ state of a layer directly adjacent to the emitting layer comprising compound E on an anode side is at most 0.1 eV lower than the energy of the $T_1$ state of compound E.

12. An organic electroluminescent device comprising
anode,
cathode, at least one emitting layer which comprises a luminescent organic compound E which has a difference between the energies of its $S_1$ and $T_1$ states of not greater than 0.15 eV, and
2, 3, 4 or 5 layers H each having a thickness of greater than 2 nm which are arranged between one emitting layer of said at least one emitting layer, which is closest to said anode, and said anode,
where the following conditions apply to each layer H:
a difference D between the HOMO energy level of a layer H and the HOMO energy level of the closest layer having a thickness of greater than 2 nm on a cathode side of this layer H must be less than or equal to 0.4 eV, with the proviso that, for layers whose HOMO energy level has a value of less than −6.7 eV, the LUMO energy level for the said condition occurs instead of the HOMO energy level, and
at least one of the layers H comprises at least one triarylamino compound which has not more than one amino group and each of the layers H comprises at least one triarylamino compound which is a small organic molecule and wherein the emitting layer which comprises compound E additionally comprises one or more matrix materials, and in that compound E is an emitting compound and the energy of the $T_1$ state of the matrix material of the emitting layer is at most 0.1 eV lower than the energy of the $T_1$ state of compound E.

13. The organic electroluminescent device according to claim 11, wherein the triarylamino compound has a molecular weight of less than 2000 Da.

14. The organic electroluminescent device according to claim 11, wherein the triarylamino compound has a molecular weight of less than 1000 Da.

15. An organic electroluminescent device comprising
anode,
cathode,
at least one emitting layer which comprises a luminescent organic compound E which has a difference between the energies of its $S_1$ and $T_1$ states of not greater than 0.15 eV, and
2, 3, 4 or 5 layers H each having a thickness of greater than 2 nm which are arranged between one emitting layer of said at least one emitting layer, which is closest to said anode, and said anode,
where the following conditions apply to each layer H:
a difference D between the HOMO energy level of a layer H and the HOMO energy level of the closest layer having a thickness of greater than 2 nm on a cathode side of this layer H must be less than or equal to 0.4 eV, with the proviso that, for layers whose HOMO energy level has a value of less than −6.7 eV, the LUMO energy level for the said condition occurs instead of the HOMO energy level,
each of the layers H comprises at least one triarylamino compound which is a small organic molecule,
wherein one or more of the layers H comprises a dopant which is an electron-acceptor compound and wherein the emitting layer which comprises compound E additionally comprises one or more matrix materials, and in that compound E is an emitting compound and the energy of the $T_1$ state of the matrix material of the emitting layer is at most 0.1 eV lower than the energy of the $T_1$ state of compound E.

16. A process for the production of an the organic electroluminescent device wherein the device comprises
an anode,
a cathode,
at least one emitting layer which comprises a luminescent organic compound E which has a difference between the energies of its $S_1$ and $T_1$ states of not greater than 0.15 eV, and
2, 3, 4 or 5 H layers each having a thickness of greater than 2 nm which are arranged between one emitting layer of said at least one emitting layer, which is closest to said anode, and said anode,
where the following conditions apply to each layer H:
a difference D between the HOMO energy level of a layer H and the HOMO energy level of the closest layer having a thickness of greater than 2 nm on a cathode side of this layer H must be less than or equal to 0.4 eV, with the proviso that, for layers whose HOMO energy level has a value of less than −6.7 eV, the LUMO energy level for the said condition occurs instead of the HOMO energy level,
each of the layers H comprises at least one triarylamino compound which is a small organic molecule,
which comprises applying at least one layer by means of a sublimation process, or in that at least one layer is applied by means of an OVPD (organic vapour phase deposition) process, or in that at least one layer is applied with the aid of carrier-gas sublimation, or in that at least one layer is applied from solution and wherein the emitting layer which comprises compound E additionally comprises one or more matrix materials, and in that compound E is an emitting compound and the energy of the $T_1$ state of the matrix material of the emitting layer is at most 0.1 eV lower than the energy of the $T_1$ state of compound E.

* * * * *